(12) United States Patent
Khorrami et al.

(10) Patent No.: US 9,999,121 B2
(45) Date of Patent: Jun. 12, 2018

(54) BOARD LEVEL SHIELDS WITH VIRTUAL GROUNDING CAPABILITY

(71) Applicant: Laird Technologies, Inc., Earth City, MO (US)

(72) Inventors: Mohammadali Khorrami, Foxboro, MA (US); Paul Francis Dixon, Sharon, MA (US); George William Rhyne, Greensboro, NC (US)

(73) Assignee: Laird Technologies, Inc., Earth City, MO (US)

( * ) Notice: Subject to any disclaimer, the term of this patent is extended or adjusted under 35 U.S.C. 154(b) by 0 days. days.

(21) Appl. No.: 15/490,012

(22) Filed: Apr. 18, 2017

(65) Prior Publication Data

US 2017/0311438 A1 Oct. 26, 2017

Related U.S. Application Data

(60) Provisional application No. 62/326,933, filed on Apr. 25, 2016, provisional application No. 62/454,335, (Continued)

(51) Int. Cl.
*H01L 23/552* (2006.01)
*H05K 1/02* (2006.01)
(Continued)

(52) U.S. Cl.
CPC ........ *H05K 1/0216* (2013.01); *H01L 23/3114* (2013.01); *H01L 23/552* (2013.01);
(Continued)

(58) Field of Classification Search
CPC . H01L 23/3114; H01L 23/552; H01L 23/642; H01L 23/645; H01L 23/64;
(Continued)

(56) References Cited

U.S. PATENT DOCUMENTS 4,401,355 A * 8/1983 Young ................ H01R 13/7197
439/607.11
8,237,259 B2 8/2012 Pressel et al.
(Continued)

FOREIGN PATENT DOCUMENTS

SU 1148006 * 3/1985 ............. H01L 21/86

OTHER PUBLICATIONS

System in Package (SiP), www.amkor.com, Nov. 2015, 4 pages.
System in Package—Wikipedia, https://3n.wikipedia.org/wiki/System_in_package, Feb. 2, 2017, 2 pages.
SiP Module, ASE Group, http://www.aseglobal.com/en/Products/4-1-6-3.asp, Copyright 2012-2017, 3 pages.
(Continued)

*Primary Examiner* — Galina Yushina
(74) *Attorney, Agent, or Firm* — Harness, Dickey & Pierce, P.L.C.

(57) ABSTRACT

According to various aspects, exemplary embodiments are disclosed of board level shields with virtual grounding capability. In an exemplary embodiment, a board level shield includes one or more resonators configured to be operable for virtually connecting the board level shield to a ground plane or a shielding surface. Also disclosed are exemplary embodiments of methods relating to making board level shields having virtual grounding capability. Additionally, exemplary embodiments are disclosed of methods relating to providing shielding for one or more components on a substrate by using a board level shield having virtual grounding capability. Further exemplary embodiments are disclosed of methods relating to making system in package (SiP) or system on chip (SoC) shielded modules and methods relating to providing shielding for one or more components of SiP or SoC module.

24 Claims, 30 Drawing Sheets

Related U.S. Application Data filed on Feb. 3, 2017, provisional application No. 62/467,469, filed on Mar. 6, 2017.

(51) Int. Cl.
| | |
|---|---|
| *H05K 9/00* | (2006.01) |
| *H01L 23/31* | (2006.01) |
| *H01L 23/64* | (2006.01) |
| *H01L 23/00* | (2006.01) |
| *H05K 1/18* | (2006.01) |
| *H05K 3/30* | (2006.01) |

(52) U.S. Cl.
CPC ............ *H01L 23/64* (2013.01); *H01L 23/642* (2013.01); *H01L 23/645* (2013.01); *H01L 24/48* (2013.01); *H01L 24/85* (2013.01); *H05K 1/18* (2013.01); *H05K 3/30* (2013.01); *H05K 9/0003* (2013.01); *H01L 2924/141* (2013.01); *H01L 2924/1615* (2013.01); *H01L 2924/16251* (2013.01); *H01L 2924/19041* (2013.01); *H01L 2924/19042* (2013.01); *H01L 2924/19105* (2013.01); *H01L 2924/19107* (2013.01); *H05K 2201/0707* (2013.01); *H05K 2201/1003* (2013.01); *H05K 2201/10015* (2013.01)

(58) Field of Classification Search
CPC . H01L 24/48; H01L 24/85; H01L 2924/1615; H01L 2924/19041; H01L 2824/19042; H01L 2924/19105; H01L 2924/19107; H01L 27/3272; H01L 2225/06537; H01L 2924/3025; H01K 1/0216; H05K 1/18; H05K 3/30; H05K 2201/0707; H05K 2201/10015; H05K 2201/1003
See application file for complete search history.

(56) References Cited

U.S. PATENT DOCUMENTS

| | | | | |
|---|---|---|---|---|
| 8,716,606 | B2* | 5/2014 | Kelley | H01L 23/573 174/382 |
| 9,490,222 | B1 | 11/2016 | Awujoola et al. | |
| 2008/0204170 | A1* | 8/2008 | Chang | H01L 23/5223 333/209 |
| 2009/0294930 | A1 | 12/2009 | Yoon et al. | |
| 2011/0002496 | A1* | 1/2011 | Meesters | H01Q 1/273 381/370 |
| 2011/0038401 | A1* | 2/2011 | Demuynck | H04B 1/38 375/222 |
| 2012/0076164 | A1* | 3/2012 | Walther | B82Y 20/00 372/45.01 |
| 2012/0161901 | A1* | 6/2012 | Stevenson | A61B 5/04 333/175 |
| 2012/0306284 | A1* | 12/2012 | Lee | H02J 17/00 307/104 |
| 2013/0322495 | A1* | 12/2013 | Behdad | H01Q 15/0026 375/219 |
| 2015/0180437 | A1* | 6/2015 | Zuo | H03H 7/0115 333/185 |
| 2015/0382448 | A1 | 12/2015 | Pennathur et al. | |
| 2017/0179039 | A1* | 6/2017 | Lee | H01L 23/552 |

OTHER PUBLICATIONS

Virtual Ground—Wikipedia, https://en.wikipedia.org/wiki/Virtual_ground, Apr. 20, 2016, 3 pages.
U.S. Appl. No. 62/326,933, filed Apr. 25, 2016, Mohammadali Khorrami et al.
U.S. Appl. No. 62/245,335, filed Feb. 3, 2017, Mohammadali Khorrami et al.
U.S. Appl. No. 62/467,469, filed Mar. 6, 2017, Mohammadali Khorrami et al.

\* cited by examiner

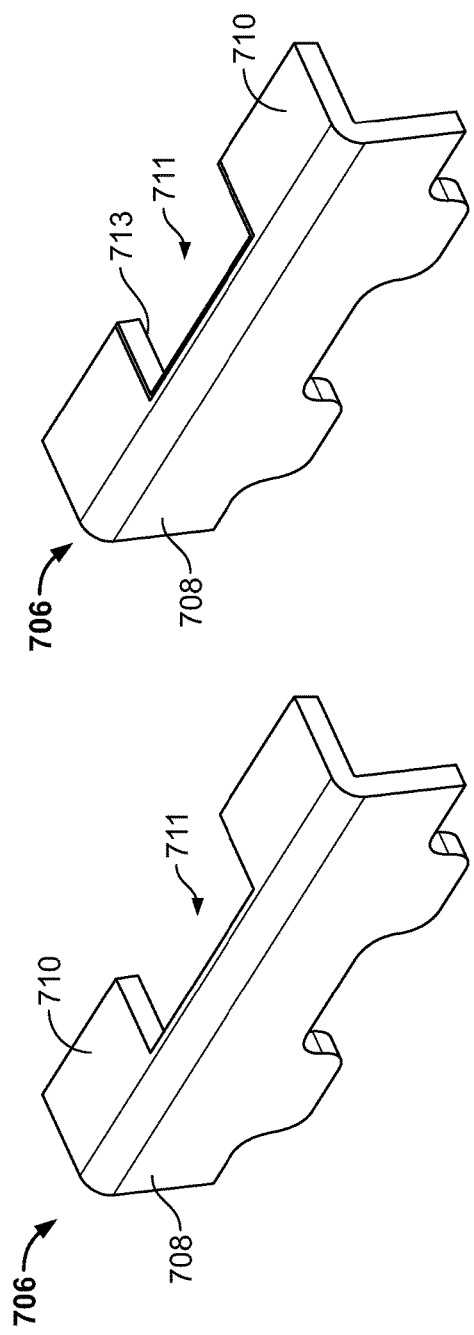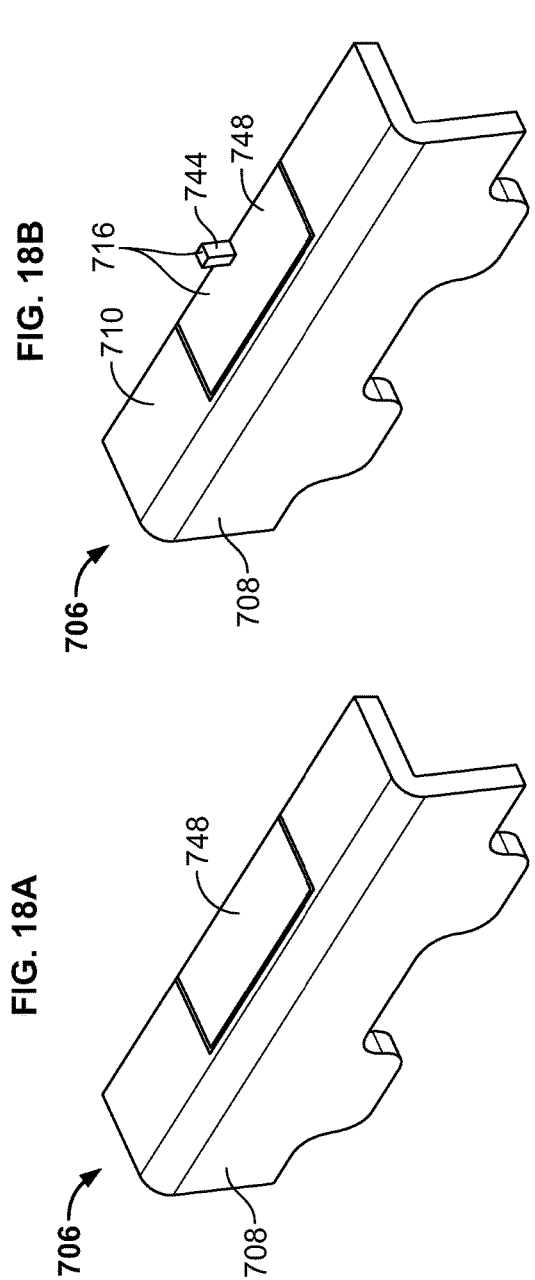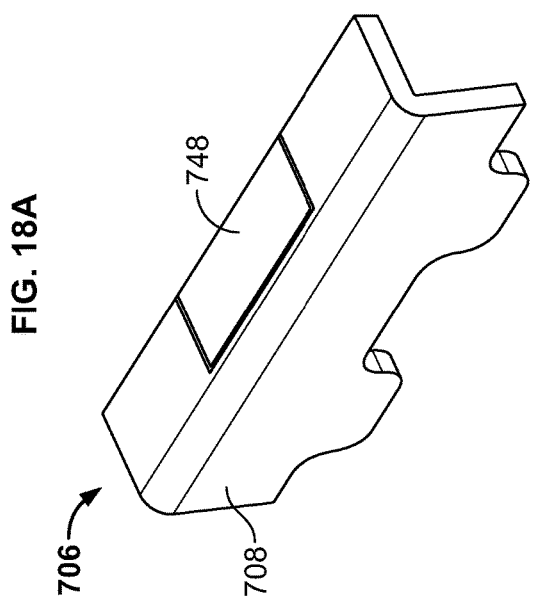

BOARD LEVEL SHIELDS WITH VIRTUAL GROUNDING CAPABILITY

CROSS-REFERENCE TO RELATED APPLICATIONS

This application claims priority to and the benefit of U.S. Provisional Patent Application No. 62/326,933 filed Apr. 25, 2016.

This application claims priority to and the benefit of U.S. Provisional Patent Application No. 62/454,335 filed Feb. 3, 2017.

This application claims priority to and the benefit of U.S. Provisional Patent Application No. 62/467,469 filed Mar. 6, 2017.

This application claims priority to and the benefit of International PCT Application No. PCT/US16/40638 filed Jul. 1, 2016, which, in turn, claims priority to U.S. Provisional Patent Application No. 62/326,933 filed Apr. 25, 2016.

This application claims priority to and the benefit of International PCT Application No. PCT/US16/44203 filed Jul. 27, 2016, which, in turn, claims priority to U.S. Provisional Patent Application No. 62/326,933 filed Apr. 25, 2016.

The entire disclosures of the above applications are incorporated herein by reference.

FIELD

The present disclosure generally relates to board level shields with virtual grounding capability.

BACKGROUND

This section provides background information related to the present disclosure which is not necessarily prior art.

A common problem in the operation of electronic devices is the generation of electromagnetic radiation within the electronic circuitry of the equipment. Such radiation may result in electromagnetic interference (EMI) or radio frequency interference (RFI), which can interfere with the operation of other electronic devices within a certain proximity. Without adequate shielding, EMI/RFI interference may cause degradation or complete loss of important signals, thereby rendering the electronic equipment inefficient or inoperable.

A common solution to ameliorate the effects of EMI/RFI is through the use of shields capable of absorbing and/or reflecting and/or redirecting EMI energy. These shields are typically employed to localize EMI/RFI within its source, and to insulate other devices proximal to the EMI/RFI source. For example, board level shields are widely used to protect sensitive electronic devices against inter and intra system electromagnetic interferences and reduce unwanted electromagnetic radiations from a noisy integrated circuit (IC).

The term "EMI" as used herein should be considered to generally include and refer to EMI emissions and RFI emissions, and the term "electromagnetic" should be considered to generally include and refer to electromagnetic and radio frequency from external sources and internal sources. Accordingly, the term shielding (as used herein) broadly includes and refers to mitigating (or limiting) EMI and/or RFI, such as by absorbing, reflecting, blocking, and/or redirecting the energy or some combination thereof so that it no longer interferes, for example, for government compliance and/or for internal functionality of the electronic component system.

DRAWINGS

The drawings described herein are for illustrative purposes only of selected embodiments and not all possible implementations, and are not intended to limit the scope of the present disclosure.

FIG. 1 is a perspective view of a board level shield (BLS) that includes a virtual ground fence or frame comprising L-C resonators along each side of the BLS according to an exemplary embodiment. The BLS is shown positioned along a first side of a printed circuit board (PCB) and virtually connected via the L-C resonators to a ground plane along the second side of the PCB without a physical electrical connection directly between the BLS and the ground plane.

FIG. 2 is a perspective view of the portion of the BLS circled in FIG. 1, and showing the inductor and capacitor of one of the L-C resonators of the BLS according to an exemplary embodiment.

FIG. 3 provides example dimensions in millimeters that may be used for the BLS shown in FIG. 1. The dimensions are provided for purpose of example only.

FIGS. 18A through 18D illustrate an exemplary process for adding an L-C resonator along an upper surface of a sidewall of a BLS frame according to an exemplary embodiment.

Figure 36:
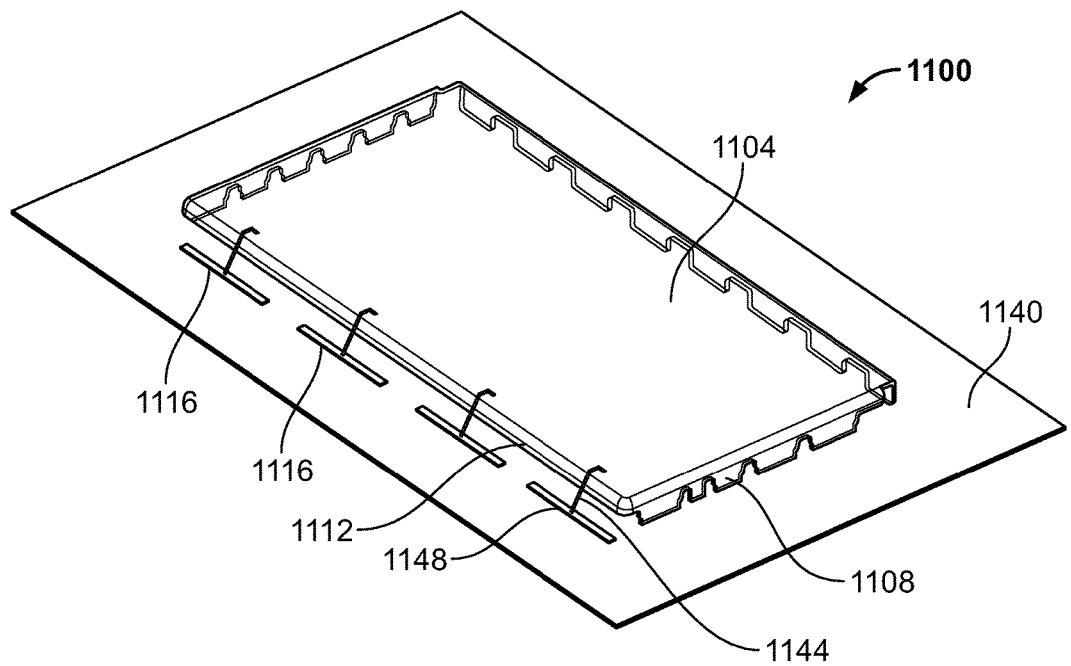

FIG. 36 is a perspective view of a board level shield (BLS) according to another exemplary embodiment in which the BLS includes a virtual ground fence or frame (VGF) defined by or including four L-C resonators along a side of the BLS. The BLS is grounded along the other three sides. Each L-C resonator includes an inductor implemented by wire bonding.

Figure 37:
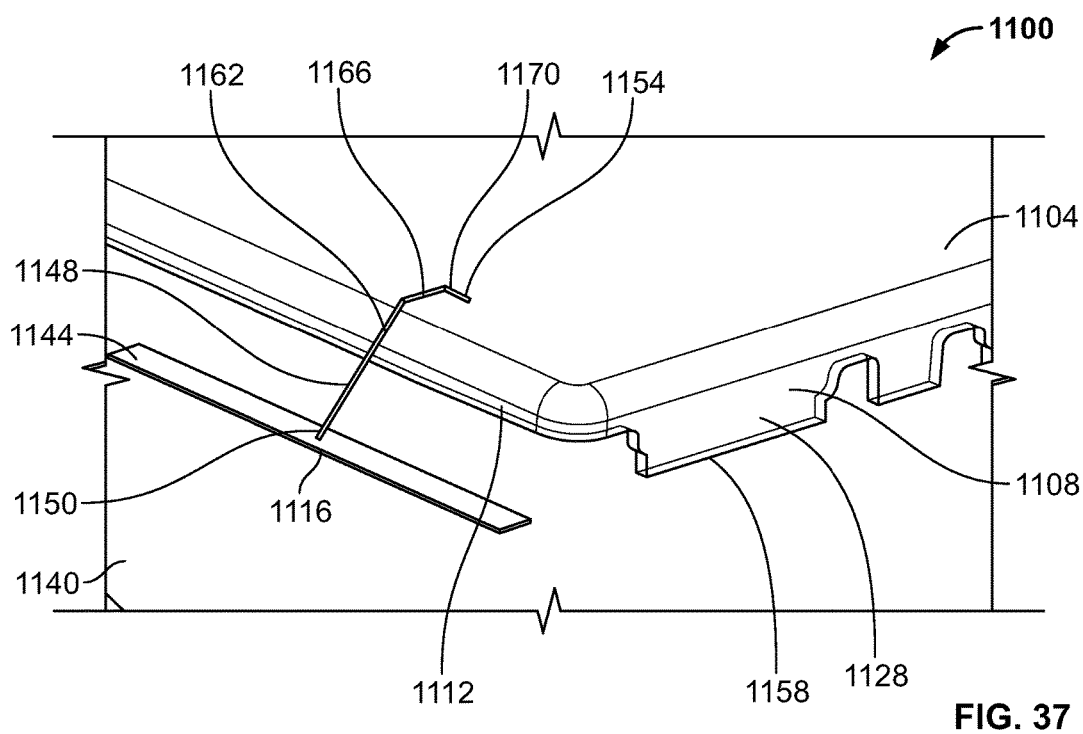

FIG. 37 is a perspective view of a portion of the BLS shown in FIG. 36, and showing the first and second ends of the wire inductor of one of the L-C resonators wire bonded to the capacitor and the BLS cover, respectively.

Figure 38:
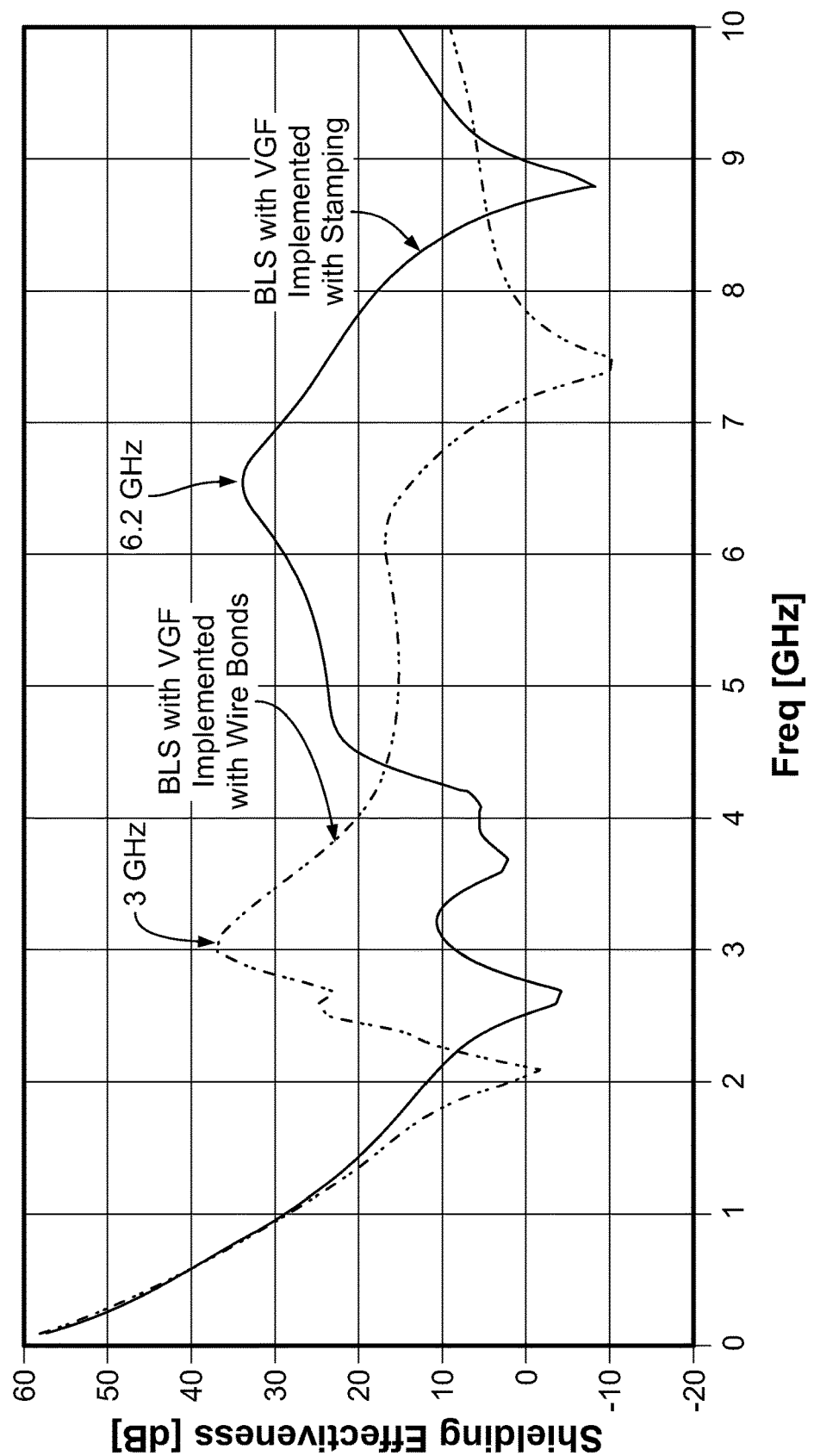

FIG. 38 is a line graph of shielding effectiveness (dB) versus frequency from 0 to 10 GHz for the BLS including the VGF implemented with wire bonds as shown in FIGS. 36 and 37 and for a BLS including a VGF implemented with stamping.

DETAILED DESCRIPTION

Example embodiments will now be described more fully with reference to the accompanying drawings.

Electromagnetic field radiations from and interferences onto integrated circuits are mostly hindered by using board level shields. Although board level shields are commonly used to effectively prevent radiated electromagnetic emissions, their performance is directly dependent on their grounding structure design. For example, a conventional board level shield may be used to establish five sides of a Faraday cage. To be effective, grounding vias or grounding pins are required to connect the five sides of the board level shield to a sixth side or ground (or 0 Volt) plane. But these grounding vias occupy PCB area and must be considered during the board design process.

Disclosed herein are exemplary embodiments of board level shields configured with virtual grounding capability. As disclosed herein, an exemplary embodiment of a board level shield (BLS) may be positioned relative to (e.g., disposed along, adhesively attached, soldered, or otherwise installed to, etc.) a first side of a printed circuit board (PCB) (broadly, a substrate) such that one or more components along the first side are within an interior defined by the BLS and such that the BLS is virtually connected to a ground plane underneath or along a second side (e.g., an opposite or oppositely facing side, etc.) of the PCB. In exemplary embodiments, the BLS may be virtually connected to the ground plane underneath or along an opposite side of the PCB (or within the PCB) without a physical electrical connection directly between the BLS and the ground plane. For example, the BLS may be virtually connected to the ground plane without using grounding vias, plated thru holes, or other intervening physical components to create a physically existing electrical pathway from the BLS to the ground plane.

In an exemplary embodiment, a BLS includes one or more L-C resonators along each side of the BLS. The L-C resonators may be spaced apart along or disposed generally around an outer perimeter of the BLS. The outer perimeter may be defined by the sidewalls of the BLS and/or the upper surface, cover, lid, or top of the BLS.

The one or more L-C resonators may be configured to resonate at a resonant frequency (e.g., about 2.75 GHz, about 4 GHz, etc.). The one or more L-C resonators may be operable for virtually connecting a cover to a ground plane, e.g., without using grounding vias, etc. For example, the BLS may be positioned along a first side of a printed circuit board (PCB) and virtually connected via the one or more L-C resonators to a ground plane along the second side of the PCB without a physical electrical connection directly between the cover and the ground plane. With the L-C resonators, the BLS is thus virtually connectible to a ground plane underneath or along an opposite side of the PCB without using grounding vias.

Each L-C resonator may include an inductor and a capacitor. By way of example, the inductor may comprise an inductive pin or other relatively narrow inductive element, such as an electrically-conductive (e.g., metal, etc.) pin having a rectangular or circular cross section, etc. By way of further example, the capacitor may comprise a capacitive patch element or other relatively wide capacitive element, such as a generally rectangular electrically-conductive (e.g., metal, etc.) patch element or pad. Alternatively, the L-C resonators may comprise differently configured inductors and capacitors, e.g., made of different materials, having different shapes (e.g., non-circular, non-rectangular, non-linear, etc.).

Exemplary embodiments disclosed herein may provide one or more (but not necessarily any or all) of the following features or advantages over some existing board level shields. For example, exemplary embodiments disclosed herein provide an after the fact solution for an EMC/RFI engineer when there are radiation or interference problems within or at a specific frequency range. Exemplary embodiments disclosed herein may provide substantially high shielding effectiveness in a relatively narrow frequency range. For example, an exemplary embodiment of a BLS may be configured to provide shielding effectiveness up to 40 decibels (dB) in a relatively narrow frequency band even without any particular physical grounding mechanism, such as plated through hole vias, etc. The bandwidth generally depends on the loss mechanism in the resonators. By way of example, the bandwidth may be 5% to 10% of the resonance frequency of the resonators. In this example, the bandwidth would be about 200 MHz to 400 MHz if the resonance frequency is 4 GHz. The bandwidth may be increased by adding one or more EMI absorbers to the BLS at specific or predetermined locations. By using a virtual grounding fence as disclosed herein, exemplary embodiments may also allow for the elimination of the need electrically-conductive vias and reduce area occupied by guard traces, which typically follow the perimeter of the BLS (e.g., shielding can, etc.). For example, exemplary embodiments may allow for freeing up board space (e.g., approximately 50% related to guard traces, etc.), provide larger routing area on the top layer of the PCB, reduce costs by eliminating ground vias, and/or eliminating or reducing soldering or reflowing procedures. As recognized by the inventors hereon, PCB space is critical with increased functionality and higher component density. Bond pads are significant contributor to the occupied PCB area. By using a virtual grounding fence as disclosed herein, exemplary embodiments may also allow for a significant reduction of the occupied PCB area for bond pads (e.g., approximately 50% reduction of bond pad, etc.). Accordingly, exemplary embodiments disclosed herein may be used to free up valuable PCB real estate with minimal impact on the shielding effectiveness.

Figure 1:
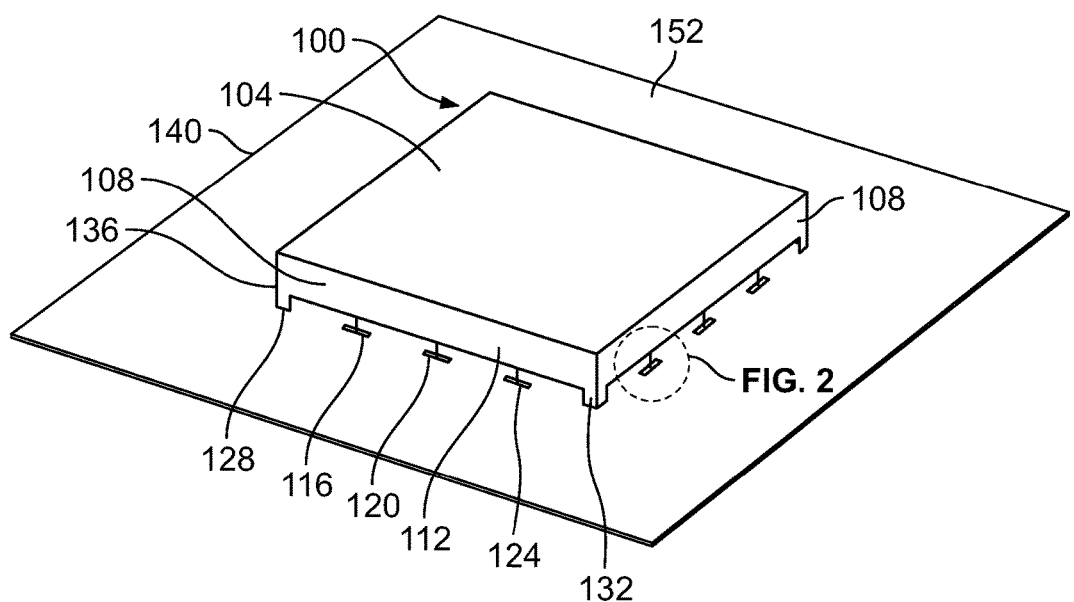

With reference to the figures, FIG. 1 illustrates an exemplary embodiment of a board level shield (BLS) 100 according to aspects of the present disclosure. As shown, the BLS 100 includes an upper surface, cover, lid, or top 104 and sidewalls 108. The sidewalls 108 depend or extend downwardly from the upper surface 104.

Each sidewall 108 includes an upper sidewall portion 112 and a lower sidewall portion, which includes or is defined by L-C resonators 116, 120, 124. In this exemplary embodiment, each sidewall 108 includes three L-C resonators 116, 120, 124 that depend or extend downwardly from the upper sidewall portion 112. In an alternative embodiment, the BLS may not include any upper sidewall portions, and the L-C resonators may depend from and be coupled directly to the upper surface of the BLS. In yet other exemplary embodiments, L-C resonators may be spaced apart along an upper portion (e.g., an upper perimeter rim or flange, FIGS. 13, 18D, 22, 27, and 29, etc.) of a BLS frame or fence.

In exemplary embodiments, there are a sufficient number of L-C resonators 116, 120, 124 to provide or define a virtual ground fence or frame (VGF) that allows the BLS 100 to be virtually connectible to a ground plane underneath or along an opposite side of a PCB 140 (broadly, a substrate) without a physical electrical connection directly between the BLS 100 and the ground plane. For example, the BLS 100 may be virtually connected to the ground plane without using grounding vias, plated thru holes, or other intervening physical components to create a physically existing electrical pathway from the BLS 100 to the ground plane.

The L-C resonators 116, 120, 124 may be placed at predetermined locations and spaced apart from each other along each side of the BLS 100 to provide or accommodate acceptable virtual grounding at their resonance frequency (e.g., about 2.75 GHz, etc.). In this exemplary embodiment, the three L-C resonators 116, 120, 124 are equally spaced apart from each other along the corresponding sidewall 108. Accordingly, the second L-C resonator 120 is equally spaced apart by a predetermined distance (e.g., about 15 millimeters (mm), etc.) from each first and third L-C resonators 116, 124 along the corresponding sidewall 108. The first and third L-C resonators 116, 124 are equally spaced apart by that same predetermined distance (e.g., about 15 mm, etc.) from the respective first and second mounting feet 128, 132 of the BLS 100. In an alternative embodiment, there may be four L-C resonators (e.g., FIG. 9, etc.) equally spaced apart by a predetermine distance (e.g., about 9.2 mm, etc.) from each other along each side of the BLS 100.

The number, shape, and size of L-C resonators and their locations along a side of a BLS may depend on the configuration (e.g., shape, size, etc.) of the BLS and/or the particular end use intended for the BLS. For example, FIG. 1 shows the BLS 100 having a square shape, and each sidewall 108 has the same length (e.g., 50 mm, etc.) and same number of, i.e., three, L-C resonators 116, 120, 124. Alternatively, a BLS may include more or less than three L-C resonators (e.g., four L-C resonators (FIG. 9), etc.) along any one or more of the sides of a BLS and/or a different number of L-C resonators along one side than another side. For example, the BLS may have a rectangular shape, and the longer sidewalls may have more L-C resonators than the shorter sidewalls. The number of L-C resonators may be increased depending on the value of the required shielding effectiveness at the resonance frequency. Different resonator dimensions can also be used to spread the resonance frequencies in a wide range to achieve a wide band solution.

Continuing with reference to FIG. 1, the BLS 100 includes corner sections 136 between each pair of adjacent sidewalls 108. At or adjacent the corner sections 136, each sidewall 108 includes the first and second mounting feet 128, 132 at the opposite ends of the sidewall 108. The mounting feet 128, 132 may be configured to provide structure for connecting the BLS 100 to a substrate 140, such as a PCB having components on and/or along a first side and a ground plane on and/or along a second side. For example, the mounting feet 128, 132 may provide areas for adhesively attaching or soldering the BLS 100 to the substrate 140. In such embodiments, the empty space or gap between the mounting feet 128, 132 and the corresponding first or third L-C resonator 116, 124 may allow solder to flow around the mounting feet 128, 132 for securing the BLS 100 to the substrate 140. Alternative means besides solder and adhesive may also be used for attaching the BLS 100 to a substrate.

In an exemplary embodiment, the mounting feet 128, 132 may be used for directly connecting the BLS 100 to a PCB ground only at the corner sections 136 of the BLS 100. For example, the mounting feet 128, 132 may be soldered to solder pads and/or vias (broadly, electrically-conductive portions) on the PCB such that the solder provides a direct electrical connection from the mounting 128, 132 to the solder pads and/or vias, which are directly connected to the PCB ground. In this example, the BLS 100 would thus have a direct electrical connection to ground at each of the four corner sections 136 of the BLS 100 and virtual grounding via the L-C resonators 116, 120, 124. The shielding effectiveness may thus be increased due to the direct electrical connection at each of the corner sections 136 while still opening up PCB space due between the mounting fees 128, 132.

Figure 2:
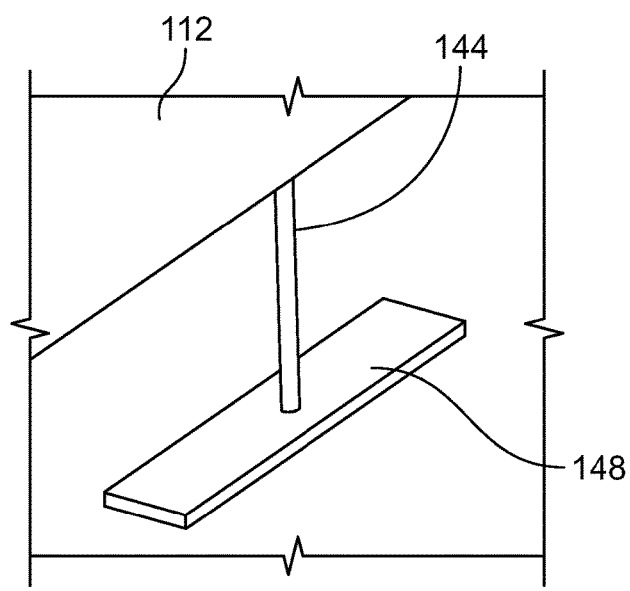

As shown in FIG. 2, each L-C resonator 116, 120, 124 includes an inductor 144 and a capacitor 148. The inductor 144 may comprise an elongate linear inductive element, such as an inductive pin having a rectangular or circular cross section, etc. The capacitor 148 may comprise a capacitive patch element, such as a generally rectangular electrically-conductive patch element, etc. The inductor 144 and capacitor 148 may be made of stainless steel, although other electrically-conductive materials may also be used (e.g., other metals, non-metals, etc.). The capacitors 148 may be fabricated directly on the PCB substrate 140, and the inductors 144 may be soldered to the capacitors 148. For example, capacitive pads may be incorporated on the top layer of a multi-layer PCB (e.g., 4-layer PCB, etc.). Alternatively, the capacitors 148 may be formed by other manufacturing processes, such as stamping, etc.

Likewise, the inductors 144 may be coupled to the capacitors 148 using other means besides solder, such as electrically-conductive adhesives, etc. Or, for example, an inductor 144 and capacitor 148 may be integrally formed (e.g., stamped from stainless steel, etc.) as a single piece with a monolithic construction.

The one or more L-C resonators 116, 120, 124 may be coupled to the BLS 100 by an adhesive, e.g., a high-temperature adhesive, epoxy, electrically-conductive pressure sensitive adhesive (CPSA), electrically-conductive hot melt adhesive, etc. Other or additional adhesives and/or methods could also be used to attach an L-C resonator to the BLS. In some other exemplary embodiments, an L-C resonator may be bonded to a BLS by fused metal where the metal is fused by thermal energy (e.g., in a reflow process, etc.), by laser energy, etc.

Figure 6:
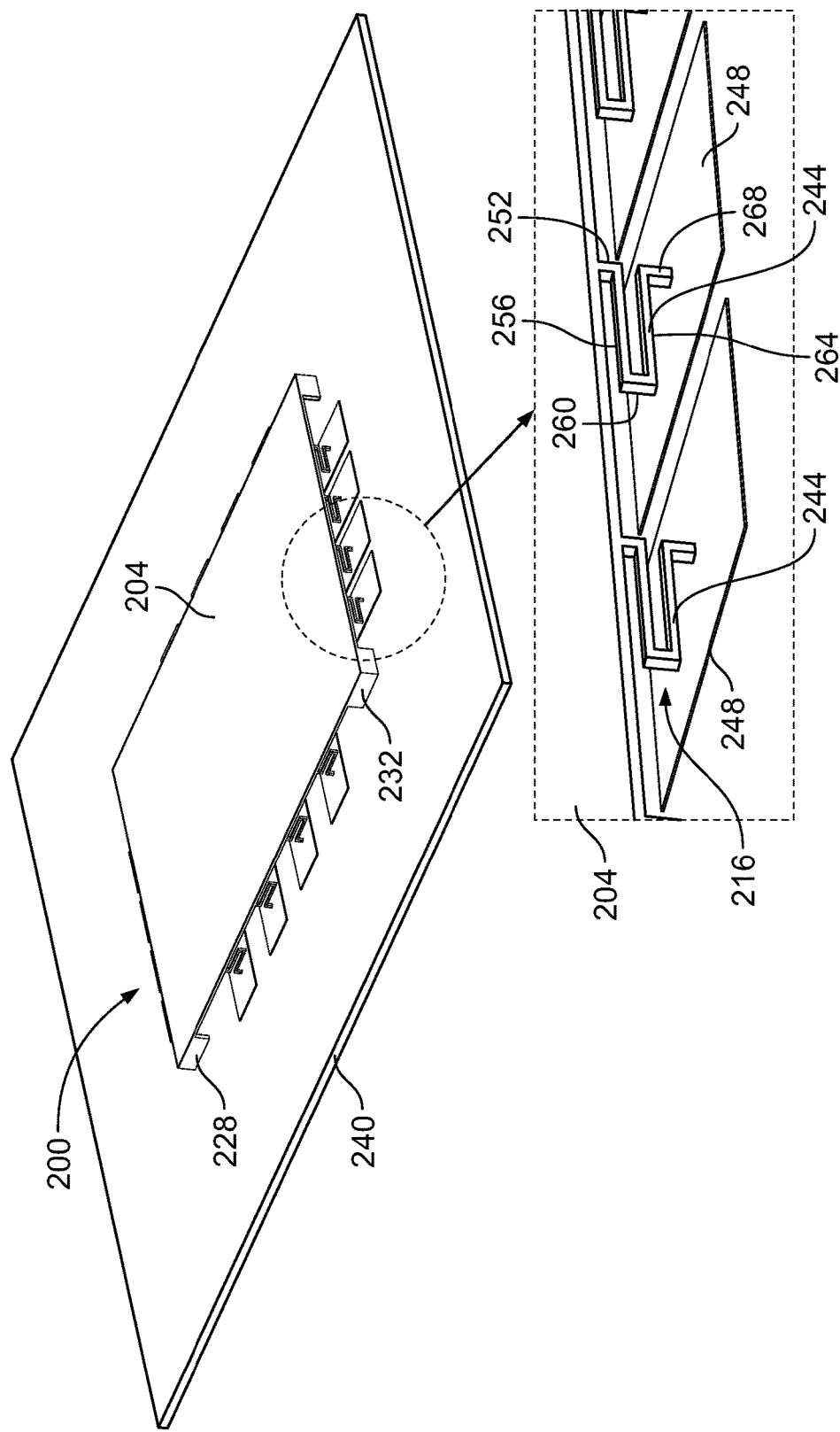
FIG. 6 is a perspective view of a board level shield including L-C resonators according to another exemplary embodiment in which the L-C resonators include non-linear inductors.

As shown in FIG. 2, the inductor 144 is coupled to the capacitor 148 such that the capacitor 148 is generally perpendicular to the inductor 144 and the upper sidewall portion 112. In addition, the capacitor 148 may be configured to contact (e.g., abut against, be flush against, rest upon, etc.) the substrate 140 when the BLS 100 is installed to the substrate 140. Alternatively, the L-C resonators 116, 120, 124 may comprise inductors and/or capacitors that have a different configuration, such as having different shapes (e.g., non-circular cross-section, non-rectangular shape, a non-linear shape as shown in FIG. 6, etc.) and/or being made of different materials, etc. For example, the inductive pins (broadly, inductors) may have any cross-section shape so long as the inductive pins are inductive enough to establish the resonance frequency at the correct or predetermined location with the aid of the capacitive patches (broadly, capacitors). Also, for example, the orientation of the L-C resonators 116, 120, 124 may be reversed or rotated 180 degrees such that the capacitor 148 is coupled to the BLS 100 and the inductor 144 is disposed or extends between the substrate 140 and the capacitor 148.

Although the L-C resonators 116, 120, 124 are shown to be identical in FIG. 1, other exemplary embodiments may include one or more L-C resonators that are not identical to every other L-C resonator.

The L-C resonators 116, 120, 124 are placed at predetermined locations along each side of the BLS 100 to provide or accommodate acceptable virtual grounding at their resonance frequency (e.g., about 2.75 GHz, etc.) to thereby virtually connect the BLS 100 to a ground plane without requiring a physical electrical connection directly between the BLS 100 and the ground plane. For example, the BLS 100 may be positioned relative to a first or upper side 152 (FIG. 1) of the PCB 140 (broadly, a substrate) such that one or more components along the PCB's first side are within an interior defined by the BLS 100. The L-C resonators 116, 120, 124 may virtually connect the BLS 100 to a ground plane underneath or along a second or bottom side of the PCB 140. In this exemplary embodiment, the L-C resonators 116, 120, 124 virtually connect the BLS 100 to the ground plane without using grounding vias, plated thru holes, or other intervening physical components to create a physically existing electrical pathway from the BLS 100 to the ground plane.

FIG. 1 shows the BLS 100 having a square shape. Other exemplary embodiments may include a BLS having a different configuration (e.g., circular, curved, triangular, irregular, rectangular, non-rectangular shapes, etc.).

Figure 3:
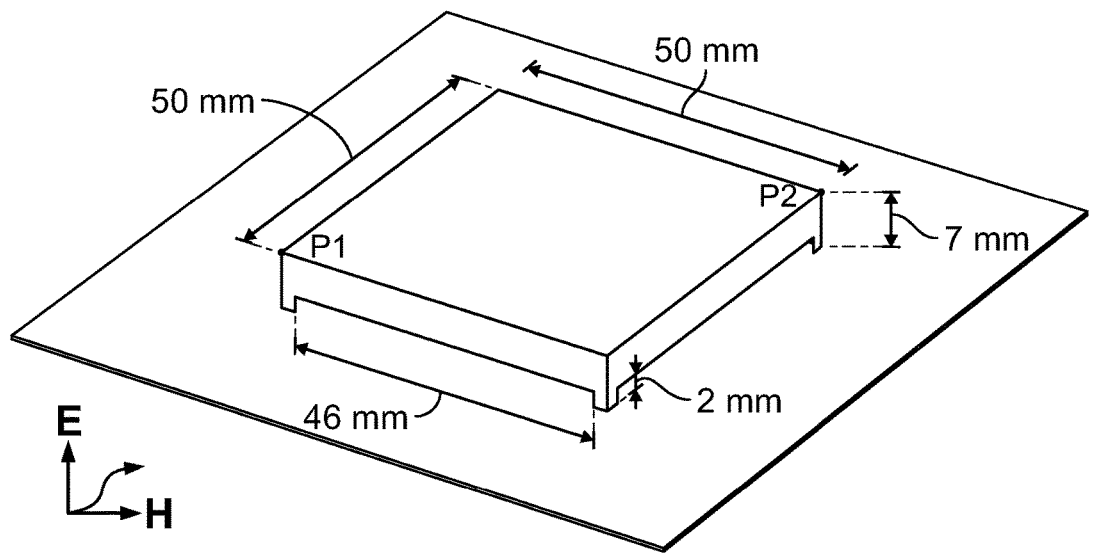

FIG. 3 provides exemplary dimensions that may be used for a board level shield (e.g., BLS 100 in FIG. 1, etc.) disclosed herein. As shown in FIG. 3, the BLS has a height of 7 millimeters (mm), a length of 50 mm, and a width of 50 mm. The space or gap between the substrate and the bottom edge of the upper sidewall portion where the L-C resonators will be located is 2 mm. Thus, the upper sidewall portions have a height of 5 mm. In addition, the space or gap between the pair of mounting feet along a side of the BLS is 46 mm. If three L-C resonators are equally spaced apart within this 46 mm gap, then the distance between adjacent L-C resonators would be about 15⅓ mm, and the distance between the first and second mounting feet and the closest L-C resonator would also be about 15⅓ mm. In this example, the substrate is made out of FR4 (flame retardant fiberglass reinforced epoxy laminates) and has a thickness of 0.1 mm. The dimensions, shapes, and materials provided in this paragraph and FIG. 3 are for purposes of illustration only as a BLS in other exemplary embodiments may have a different configuration, such as a different size (e.g., larger or smaller), a different shape (e.g., non-rectangular, etc.), different materials, etc., depending, for example, on the particular application, such as the electrical components to be shielded, space considerations within the overall electronic device, EMI shielding and heat dissipation needs, and other factors.

Figure 4:
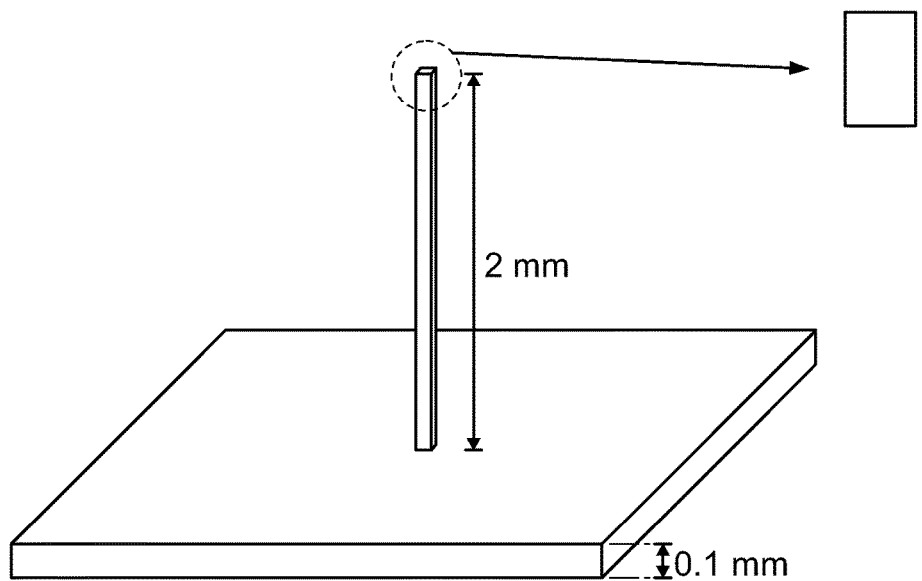
FIG. 4 is a perspective view of an example L-C resonator that may be used with the BLS shown in FIG. 1. Dimensions in millimeters are provided for the inductor and capacitor for purpose of example only.
Figure 8:
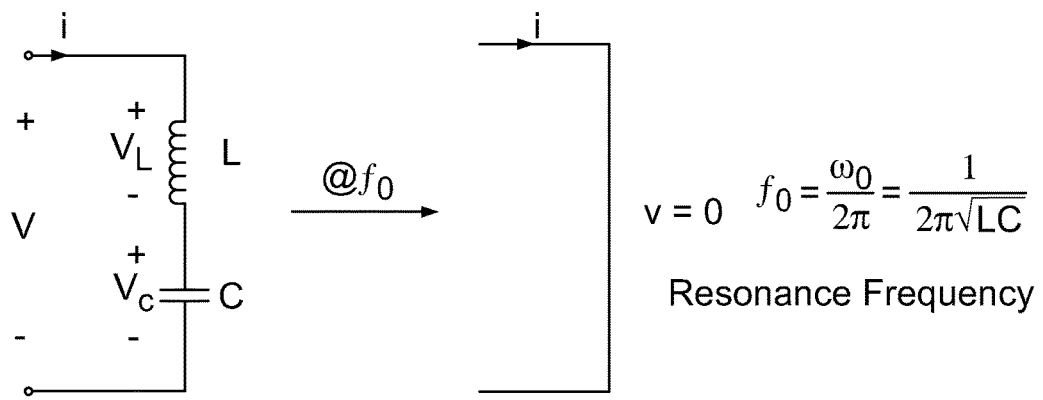
FIG. 8 illustrates an equation by which resonance frequency ($f_0$) may be determined using the inductance (L) and capacitance (C).

FIG. 4 provides exemplary dimensions for an L-C resonator (e.g., 116, 120, 124 in FIGS. 1 and 2, etc.) that may be used in exemplary embodiments of a board level shield disclosed herein. As shown in FIG. 4, the inductor of the L-C-resonator has a height of 2 mm and a rectangular cross-section. The rectangular cross-section of the inductor may have a width of 0.3 mm and a length of 0.1 mm. The capacitor of the L-C-resonator has a thickness of 0.1 mm and a rectangular shape. The rectangular shape of the capacitor may have a width of 4 mm and a length of 0.8 mm. The dimensions and shapes provided in this paragraph and FIG. 4 are for purposes of illustration only as an L-C resonator(s) in other exemplary embodiments may have a different configuration, such as a different size (e.g., larger or smaller) and/or a different shape (e.g., non-rectangular, etc.), etc. For example, the capacitor of the L-C resonator may have a rectangular shape with a width of 4 mm and a length of 2 mm. Also, for example, the number of resonators may be increased depending on the value of the required shielding effectiveness at the resonance frequency. Different resonator dimensions can also be used to spread the resonance frequencies in a wide range to achieve a wide band solution. Resonance frequency ($f_r$) can be determined by the equation shown below and in FIG. 8 in which L is inductance a C is capacitance. This equation can be used to help determine the configuration of the inductors and capacitors when the frequency range is known as the best ground connection can be provided at the resonance frequency.

$$f_r = \frac{1}{2\pi\sqrt{LC}}$$

A longer pin (broadly, inductor) will have a higher inductance than a shorter pin. A larger pad area (broadly, capacitor) will have a higher capacitance than a smaller large pad area. It is common for board level shields to have a height of less than 1 mm. With such shields, the inductive pins are also relatively short with a small inductance. The small inductance associated with the short inductive pins can be compensated by using larger capacitive pads. According to the above equation, capacitance (C) is increased if resonance frequency ($f_r$) is held constant and inductance (L) is decreased. Additionally, or alternatively, the inductors may be non-linear (e.g., inductors 244 shown in FIG. 6, etc.) to thereby increase their length without having to increase the height of the board level shield.

Figure 5:
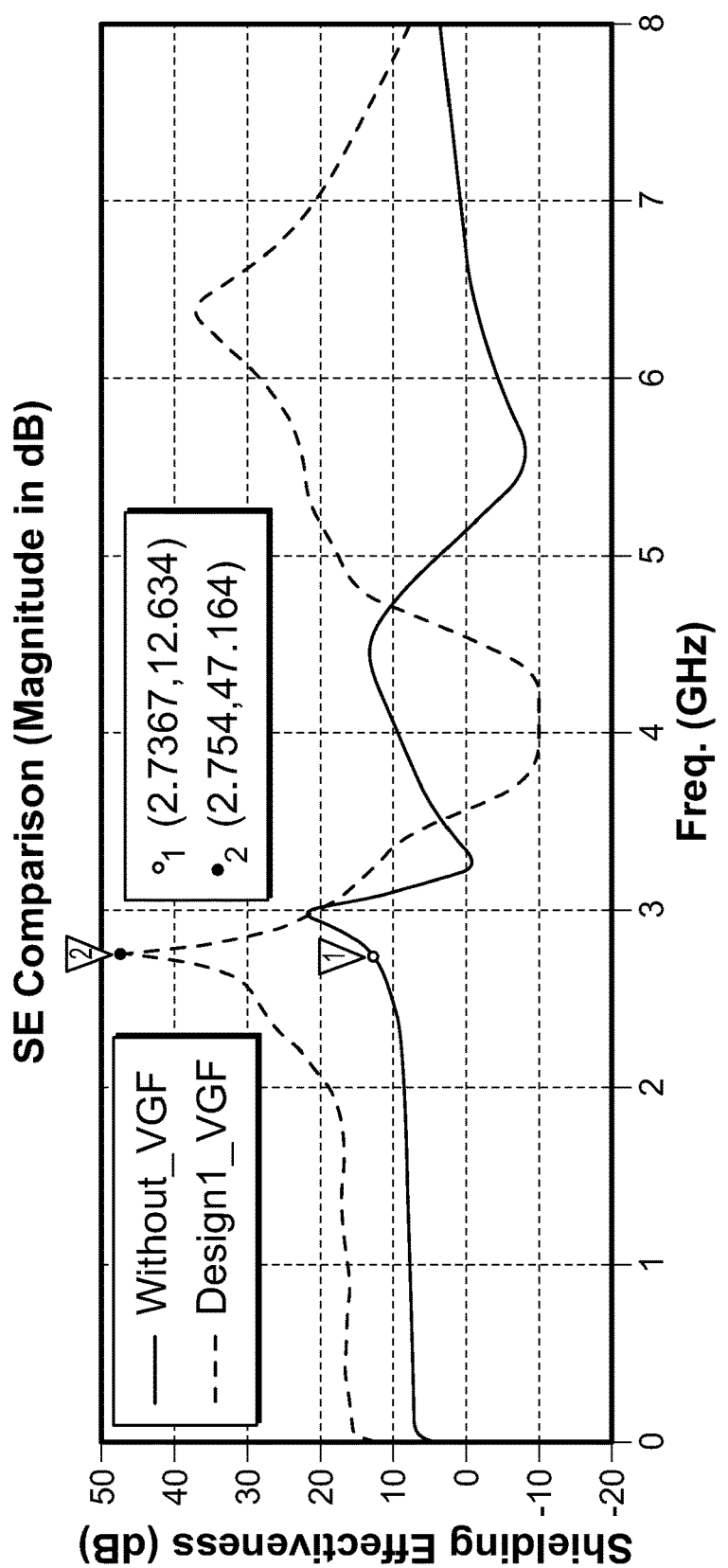
FIG. 5 is a line graph of shielding effectiveness in decibels (dB) versus frequency from 0 to 8 Gigahertz (GHz) for an exemplary embodiment of a BLS with a virtual ground fence (VGF) and for a BLS without a virtual ground fence for comparison purposes.

FIG. 5 is a line graph of shielding effectiveness (SE) in decibels (dB) versus frequency from 0 to 8 Gigahertz (8 GHz) for an exemplary embodiment of a BLS with a virtual ground fence (VGF) and for a BLS without a virtual ground fence for comparison purposes. FIGS. 3 and 4 provide the exemplary configuration (e.g., dimensions, shapes, etc.) of the BLS test samples that were used to obtain the test data shown in FIG. 5. These test results are provided for illustration purposes only as other exemplary embodiments of a BLS may be configured differently, such that the BLS is larger, smaller, shaped differently, has a different shielding effectiveness, and/or has a different resonance frequency.

Generally, FIG. 5 shows the improved shielding effectiveness of the BLS with the virtual ground fence as compared to the BLS without a virtual ground fence. In this example, the resonance frequency was about 2.75 GHz. The introduction of the virtual ground fence (VGF) to the BLS increased the shielding effectiveness from about 12.6 dB to about 47.1 dB at 2.75 GHz. With the virtual ground fence, the grounding vias are not necessary for connecting the BLS to the underneath ground (GND) or power (PWR) plane. The testing is also used to determine whether or not to connect the BLS to the ground in only a few locations and/or to determine if the addition of the VGF provides better wideband performance. For example, an exemplary embodiment may include direct electrical connection to ground only at each corner of a BLS (e.g., at each of the four corners of a rectangular BLS, etc.) and virtual grounding via L-C resonators. The direct electrical connection at each of the BLS corners may help to increase shielding effectiveness while still opening up PCB space.

FIG. 6 illustrates an exemplary embodiment of a board level shield (BLS) 200 according to aspects of the present disclosure. As shown, the BLS 200 is installed on a substrate 240 (e.g., a PCB, etc.). The BLS 200 includes L-C resonators 216 and a cover 204 attached (e.g., mechanically and electrically connected, etc.) to the L-C resonators 216. The shield 200 is operable for shielding one or more components that may be provided on the substrate 240 in an interior or shielding space cooperatively defined by the L-C resonators 216 and cover 204.

The L-C resonators 216 are operable for virtually connecting the BLS 200 to a ground plane, e.g., without using grounding pins or vias, etc. For example, the BLS 200 may be positioned along the first side of the printed circuit board (PCB) 240 (broadly, a substrate) and virtually connected via the L-C resonators 216 to a ground plane along the second side of the PCB 240 without a physical electrical connection directly between the cover 204 and the ground plane.

Each L-C resonator 216 includes an inductor 244 and a capacitor 248. The inductor 244 is non-linear in this example.

As shown in FIG. 6, the inductor 244 includes a first vertical end portion 252, a first horizontal portion 256, a vertical middle portion 260, a second horizontal portion 264, and a second vertical end portion 268. The first vertical end portion 252 is coupled to and/or extends downwardly relative to the cover 204 of the BLS 100. The first horizontal portion 256 extends outwardly (e.g., horizontally at a right angle, generally perpendicular, etc.) from the first vertical end portion 252. The vertical middle portion 260 extends downwardly (e.g., vertically at a right angle, generally perpendicular, etc.) from the first horizontal portion 256. The second horizontal portion 264 extends outwardly (e.g., horizontally at a right angle, generally perpendicular, etc.) from the middle vertical portion 260. The second horizontal portion 264 is generally parallel with the first horizontal portion 256. The second vertical end portion 268 is coupled to the capacitor 248. The second vertical end portion 268 extends downwardly (e.g., vertically at a right angle, generally perpendicular, etc.) from the second horizontal portion 264.

The inductor 244 may comprise a linear or non-linear inductive pin, such as an electrically-conductive (e.g., metal, etc.) pin having a rectangular or circular cross section, etc. By way of further example, the capacitor 248 may comprise a capacitive patch element, such as a generally rectangular electrically-conductive (e.g., metal, etc.) patch element. The inductor 244 and capacitor 248 may be made of stainless steel, although other electrically-conductive materials may also be used (e.g., other metals, non-metals, etc.). The capacitors 248 may be fabricated directly on the PCB 240. For example, the capacitors 248 may comprise capacitive pads incorporated on a top layer of a multilayer PCB (e.g., 4-layer FR4 PCB, etc.). The inductors 244 may be soldered to the capacitors 248. Alternatively, the capacitors 248 may be formed by other manufacturing processes, such as stamping, etc. Likewise, the inductors 244 may be coupled to the capacitors 248 using other means besides solder, such as electrically-conductive adhesives, etc. Or, for example, an inductor 244 and capacitor 248 may be integrally formed (e.g., stamped from stainless steel, etc.) as a single piece with a monolithic construction. The L-C resonators 216 may comprise differently configured inductors and capacitors, e.g., made of different materials, having different shapes (e.g., non-circular, non-rectangular, etc.). Also, for example, the orientation of the L-C resonators 216 may be reversed or rotated 180 degrees such that the capacitors 248 are coupled to the cover 204 and the inductors 244 are disposed or extend between the PCB and the capacitors 248.

The L-C resonators 216 may be coupled to the cover 204 by an adhesive, e.g., a high-temperature adhesive, epoxy, electrically-conductive pressure sensitive adhesive (CPSA), electrically-conductive hot melt adhesive, etc. Other or additional adhesives and/or methods could also be used to attach an L-C resonator to a cover. In some other exemplary embodiments, an L-C resonator may be bonded to a cover by fused metal where the metal is fused by thermal energy (e.g., in a reflow process, etc.), by laser energy, etc.

The L-C resonators 216 may be placed at predetermined locations and spaced apart from each other along the cover 204 to provide or accommodate acceptable virtual grounding at their resonance frequency (e.g., about 2.75 GHz, etc.). In the exemplary embodiment shown in FIG. 6, four L-C resonators 216 are equally spaced apart from each other along each corresponding side or edge of the cover 204. The number, shape, and size of L-C resonators 216 and their locations along the cover 204 may depend on the configuration (e.g., shape, size, etc.) of the cover 204 and/or the particular end use intended for the BLS 200. The number of L-C resonators may be increased depending on the value of the required shielding effectiveness at the resonance frequency. Different L-C resonator dimensions can also be used to spread the resonance frequencies in a wide range to achieve a wide band solution.

Continuing with reference to FIG. 6, the BLS 200 includes mounting feet 228, 232 at the corners. The mounting feet 228, 232 may be configured to provide structure for connecting the BLS 200 to the substrate 240, such as a PCB having components on and/or along a first side and a ground plane on and/or along a second side. For example, the mounting feet 228, 232 may provide areas for adhesively attaching or soldering the BLS 200 to the substrate 240. Alternative means besides solder and adhesive may also be used for attaching the BLS 200 to a substrate.

In an exemplary embodiment, the mounting feet 228, 232 may be used for directly connecting the BLS 200 to a PCB ground only at the corner sections of the BLS 200. For example, the mounting feet 228, 232 may be soldered to solder pads and/or vias (broadly, electrically-conductive portions) on the PCB 240 such that the solder provides a direct electrical connection from the mounting 228, 232 to the solder pads and/or vias, which are directly connected to the PCB ground. In this example, the BLS 200 would thus have a direct electrical connection to ground at each of the four corner sections of the BLS 200 and virtual grounding via the L-C resonators 216. The shielding effectiveness may thus be increased due to the direct electrical connection at each of the corner sections while still opening up PCB space due between the mounting fees 228, 232.

In some exemplary embodiments, the cover 204 may be soft, flexible, and/or configured with sufficient flexibility such that the cover 204 is capable of being flexed, bent, or curved to a radius of curvature of 100 mm. Additionally, or alternatively, the cover 204 may comprise a straight/stretchable or curved segment. The cover 204 may include an electrically-conductive material or inner layer and a non-conductive outer material or layer. The non-conductive outer layer may provide support for the electrically-conductive layer.

The electrically-conductive layer and non-conductive layer of the cover 204 may comprise or be formed from a wide range of materials. For example, the non-conductive layer may comprise dielectric plastic (e.g., polyimide, polyphenylene sulfide, polyethylene terephthalate, etc.), and the electrically-conductive layer may comprise a metal coating on the dielectric plastic. The metal coating may be provided by plating, sputtering, evaporation, adhesive, etc. Additional example materials for the cover 204 include electrically-conductive stretchable fabric or film, metal coated fabric-over-foam material, metal coated polyimide, metal coated polyphenylene sulfide, metal coated polyethylene terephthalate, metallized stretchable fabric (e.g., spandex, etc.), etc. By way of further example, the cover 204 may comprise a non-conductive woven fabric plated with metal, where the fabric is a non-conductive woven stretchable fabric, a non-conductive non-stretchable woven fabric, a non-conductive nonwoven stretchable fabric, or a non-conductive non-stretchable nonwoven fabric.

The cover 204 may also include dielectric or non-conductive material along the inner surface of the electrically-conductive layer. The dielectric material may inhibit the electrically-conductive layer from directly contacting and electrically shorting one or more components when the one or more components are under the shield 200.

In some exemplary embodiments, the cover 204 and/or the L-C resonators 216 may be formed from metals or metal alloys, such as cold rolled steel (e.g., tin-plated cold rolled steel, etc.), sheet metal, stainless steel, copper alloys (e.g., tin-plated copper alloys, etc.), nickel-silver alloys (e.g., nickel-silver alloy 770, etc.), copper-nickel alloys, carbon steel, brass, copper, aluminum, copper-beryllium alloys, phosphor bronze, steel, alloys thereof, among other suitable electrically-conductive materials. Or, the cover 204 and/or the L-C resonators 216 may also be formed from a plastic material coated with electrically-conductive material. The materials provided herein are for purposes of illustration only, as the cover 204 and L-C resonators 216 may be made from different materials depending, for example, on the particular application, such as the electrical components to be shielded, space considerations within the overall electronic device, EMI shielding and heat dissipation needs, and other factors.

Exemplary embodiments are also disclosed of system in package or system-in-a-package (SiP) or system on chip (SoC) shielding using a virtual ground fence (VGF). By way of background, a system in package (SiP) module may generally include a number of integrated circuits, chips, or other components in a single module (or package). Shielding may be integrated into the SiP module or package. In exemplary embodiment, an EMI absorber may be used for the over-mold in the SiP application, whereby the resonance frequency can be easily shifted to lower frequencies.

Figure 7:
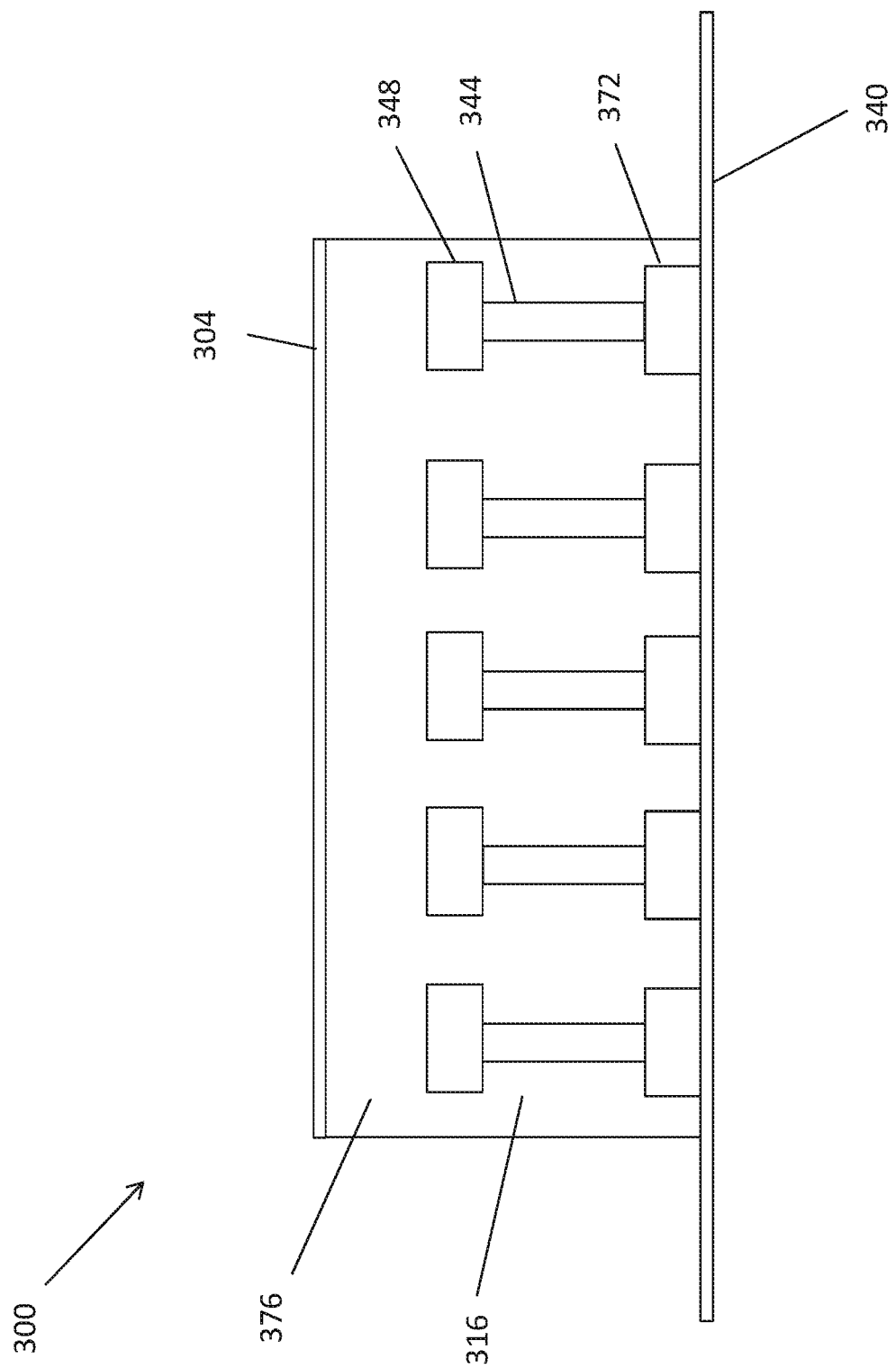
FIG. 7 illustrates a system in package (SiP) shielded module according to another exemplary embodiment that includes L-C resonators virtually connected with an electrically-conductive cover or top layer through a dielectric overmold without a direct physical connection between the L-C resonators and the electrically-conductive cover or top layer.

FIG. 7 illustrates an exemplary embodiment of a system in package (SiP) shielded module 300 according to aspects of the present disclosure. As shown, the SiP shielded module 300 includes a board level shielding (BLS) frame or fence comprising or defined by a plurality of L-C resonators 316. The L-C resonators 316 are configured to be installed (e.g., mechanically and electrically connected, etc.) on a substrate 340 (e.g., a PCB, etc.) generally around one or more components on the substrate 340. In this exemplary embodiment, the L-C resonators 316 are soldered to grounded pads 372 along the substrate 340. Alternative embodiments (e.g., FIGS. 13, 15, 18D, 22, 27, and 29, etc.) may include SiP shielding using virtual ground fences that include L-C resonators coupled to and spaced apart along an upper portion (e.g., an upper perimeter rim or flange, etc.) of a BLS frame or fence.

An upper shielding surface 304 is provided (e.g., coated onto, adhesively attached to, etc.) on top of an overmolded dielectric material 376 (e.g., an overmolded plastic material, etc.). The upper shielding surface 304 may comprise a metallized film, a planar sheet or layer of electrically-conductive material, a metal plated film, a thin metal layer, an electrically-conductive coating (e.g., metal coating provided by plating, sputtering, evaporation, etc.), a sheet of stainless steel, or other suitable electrically-conductive cover or top layer, etc.

Each L-C resonator 316 includes an inductor 344 and a capacitor 348. The inductor 344 is linear in this example, although the inductor 344 may be non-linear in other embodiments.

The L-C resonators 316 are configured to virtually connect to the upper shielding surface 304 through the dielectric material 376 without having a physical electrical connection directly between the L-C resonators 316 and the upper shielding surface 304. The L-C resonators 316 and the upper shielding surface 304 are operable for providing shielding for one or more components on the substrate 340 that are under the cover 304 and within a space or perimeter defined by the spaced apart L-C resonators 316.

With continued reference to FIG. 7, the dielectric molding 376 may have a top-to-bottom thickness of about 0.8 mm. The gap separating the top of the L-C resonators 316 and the upper shielding surface 304 may be about 0.15 mm. The dimensions provided in this paragraph are for purposes of illustration only as other exemplary embodiments may have a different configuration, such as a different size (e.g., larger or smaller), a different shape (e.g., non-rectangular, etc.), different materials, etc., depending, for example, on the particular application, such as the electrical components to be shielded, space considerations within the overall electronic device, EMI shielding and heat dissipation needs, and other factors.

Figure 9:
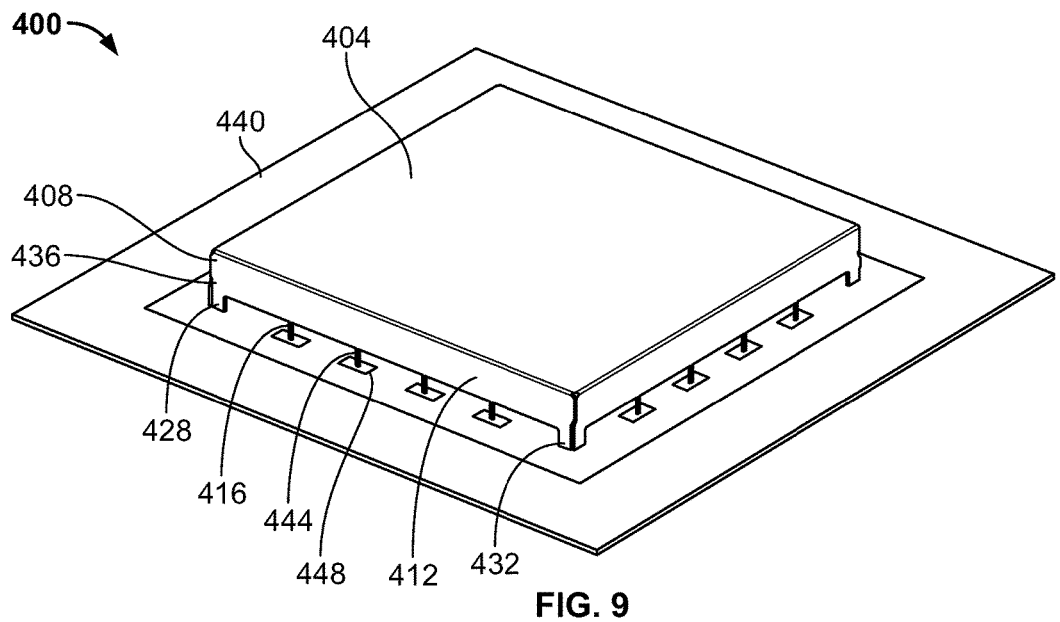
FIG. 9 is a perspective view of a board level shield (BLS) according to another exemplary embodiment in which four L-C resonators are along each side of the BLS.

FIG. 9 illustrates another exemplary embodiment of a board level shield (BLS) 400 according to aspects of the present disclosure. The BLS 400 may include features (e.g., cover or upper surface 404, sidewalls 408, upper sidewall portions 412, L-C resonators 416, mounting feet 428 and 432, corner sections 436, inductors 444, capacitors 448, etc.) similar to the corresponding features of the BLS 100 shown in FIG. 1.

In the exemplary embodiment shown in FIG. 9, however, each sidewall 408 of the BLS 400 includes four L-C resonators 416 that depend or extend downwardly from the upper sidewall portion 412. By comparison, each sidewall 108 of the BLS 100 shown in FIG. 1 includes three L-C resonators 116, 120, 124. In alternative embodiments, the BLS may not include any upper sidewall portions, and the L-C resonators may depend from and be coupled directly to the upper surface of the BLS. In yet other exemplary embodiments, L-C resonators may be spaced apart along an upper portion (e.g., an upper perimeter rim or flange, FIGS. 13, 18D, 22, 27, and 29, etc.) of a BLS frame or fence.

The L-C resonators 416 are configured to be operable to provide or define a virtual ground fence or frame (VGF) that allows the BLS 400 to be virtually connectible to a ground plane underneath or along an opposite side of a PCB 440 (broadly, a substrate) without a physical electrical connection directly between the BLS 400 and the ground plane. For example, the BLS 400 may be virtually connected to the ground plane without using grounding vias, plated thru holes, or other intervening physical components to create a physically existing electrical pathway from the BLS 400 to the ground plane.

As shown in FIG. 9, each L-C resonator 416 includes an inductor 444 and a capacitor 448. The inductor 444 may comprise an elongate linear inductive element, such as an inductive pin having a rectangular or circular cross section, etc. The capacitor 448 may comprise a capacitive patch element, such as a generally rectangular electrically-conductive patch element, etc. The inductor 444 and capacitor 448 may be made of stainless steel, although other electrically-conductive materials may also be used (e.g., other metals, non-metals, etc.). The capacitors 448 may be fabricated directly on the PCB substrate 440, and the inductors 444 may be soldered to the capacitors 448. For example, capacitive pads may be incorporated on the top layer of a multi-layer PCB (e.g., 4-layer PCB, etc.). Alternatively, the capacitors 448 may be formed by other manufacturing processes, such as stamping, etc.

Likewise, the inductors 444 may be coupled to the capacitors 448 using other means besides solder, such as electrically-conductive adhesives, etc. Or, for example, an inductor 444 and capacitor 448 may be integrally formed (e.g., stamped from stainless steel, etc.) as a single piece with a monolithic construction.

The one or more L-C resonators 416 may be coupled to the BLS 400 by an adhesive, e.g., a high-temperature adhesive, epoxy, electrically-conductive pressure sensitive adhesive (CPSA), electrically-conductive hot melt adhesive, etc. Other or additional adhesives and/or methods could also be used to attach an L-C resonator to the BLS. In some other exemplary embodiments, an L-C resonator may be bonded to a BLS by fused metal where the metal is fused by thermal energy (e.g., in a reflow process, etc.), by laser energy, etc.

As shown in FIG. 9, the inductor 444 is coupled to the capacitor 448 such that the capacitor 448 is generally perpendicular to the inductor 444 and the upper sidewall portion 412. In addition, the capacitor 448 may be configured to contact (e.g., abut against, be flush against, rest upon, etc.) the substrate 440 when the BLS 400 is installed to the substrate 440. Alternatively, the L-C resonators 416 may comprise inductors and/or capacitors that have a different configuration, such as having different shapes (e.g., non-circular cross-section, non-rectangular shape, a non-linear shape as shown in FIG. 6, etc.) and/or being made of different materials, etc. For example, the inductive pins (broadly, inductors) may have any cross-section shape so long as the inductive pins are inductive enough to establish the resonance frequency at the correct or predetermined location with the aid of the capacitive patches (broadly, capacitors). Also, for example, the orientation of the L-C resonators 416 may be reversed or rotated 180 degrees such that the capacitor 448 is coupled to the BLS 400 and the inductor 444 is disposed or extends between the substrate 440 and the capacitor 448.

Although the L-C resonators 416 are shown to be identical in FIG. 9, other exemplary embodiments may include one or more L-C resonators that are not identical to every other L-C resonator. The L-C resonators 416 are placed at predetermined locations along each side of the BLS 400 to provide or accommodate acceptable virtual grounding at their resonance frequency (e.g., about 2.75 GHz, etc.) to thereby virtually connect the BLS 400 to a ground plane without requiring a physical electrical connection directly between the BLS 400 and the ground plane. For example, the BLS 400 may be positioned relative to a first or upper side of the PCB 440 (broadly, a substrate) such that one or more components along the PCB's first side are within an interior defined by the BLS 400. The L-C resonators 416 may virtually connect the BLS 400 to a ground plane underneath or along a second or bottom side of the PCB 440. In this exemplary embodiment, the L-C resonators 416 virtually connect the BLS 400 to the ground plane without using grounding vias, plated thru holes, or other intervening physical components to create a physically existing electrical pathway from the BLS 400 to the ground plane.

FIG. 9 shows the BLS 400 having a square shape. Other exemplary embodiments may include a BLS having a different configuration (e.g., circular, curved, triangular, irregular, rectangular, non-rectangular shapes, etc.).

Figure 10:
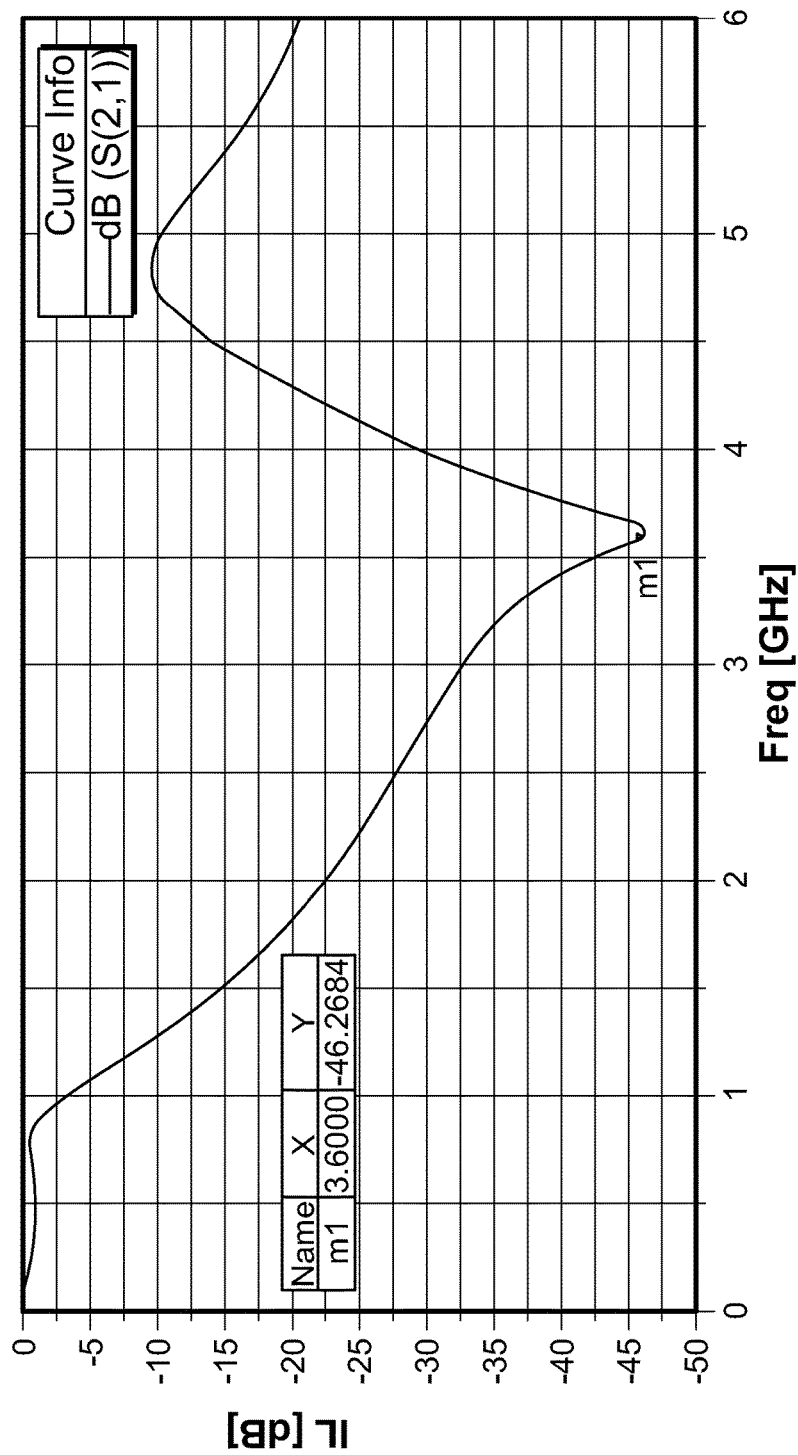
FIG. 10 is a line graph of insertion loss (IL) or shielding effectiveness (dB) versus frequency from 0 to 6 GHz for the exemplary embodiment of the BLS shown in FIG. 9 having the exemplary dimensions shown in FIG. 10.

FIG. 10 is a line graph of insertion loss (IL) or shielding effectiveness (dB) versus frequency from 0 to 6 GHz for the exemplary embodiment of the BLS 400 shown in FIG. 9. FIG. 10 also provides the exemplary dimensions that were used for testing purposes. For example, the board level shield's length, width, and height dimensions were 50 mm×50 mm×7 mm. The pad dimensions were 2 mm×4 mm. The BLS thickness was 0.2 mm. The inductor pin height was 2 mm. As shown in FIG. 10, the BLS 400 had an insertion loss or shielding effectiveness of −46.2684 dB at a frequency of 3.6 GHz. The dimensions and test results shown in FIG. 10 are provided for purpose of example only as other exemplary embodiments may be configured differently, e.g., larger or smaller in size, have different performance, etc.

Figure 11:
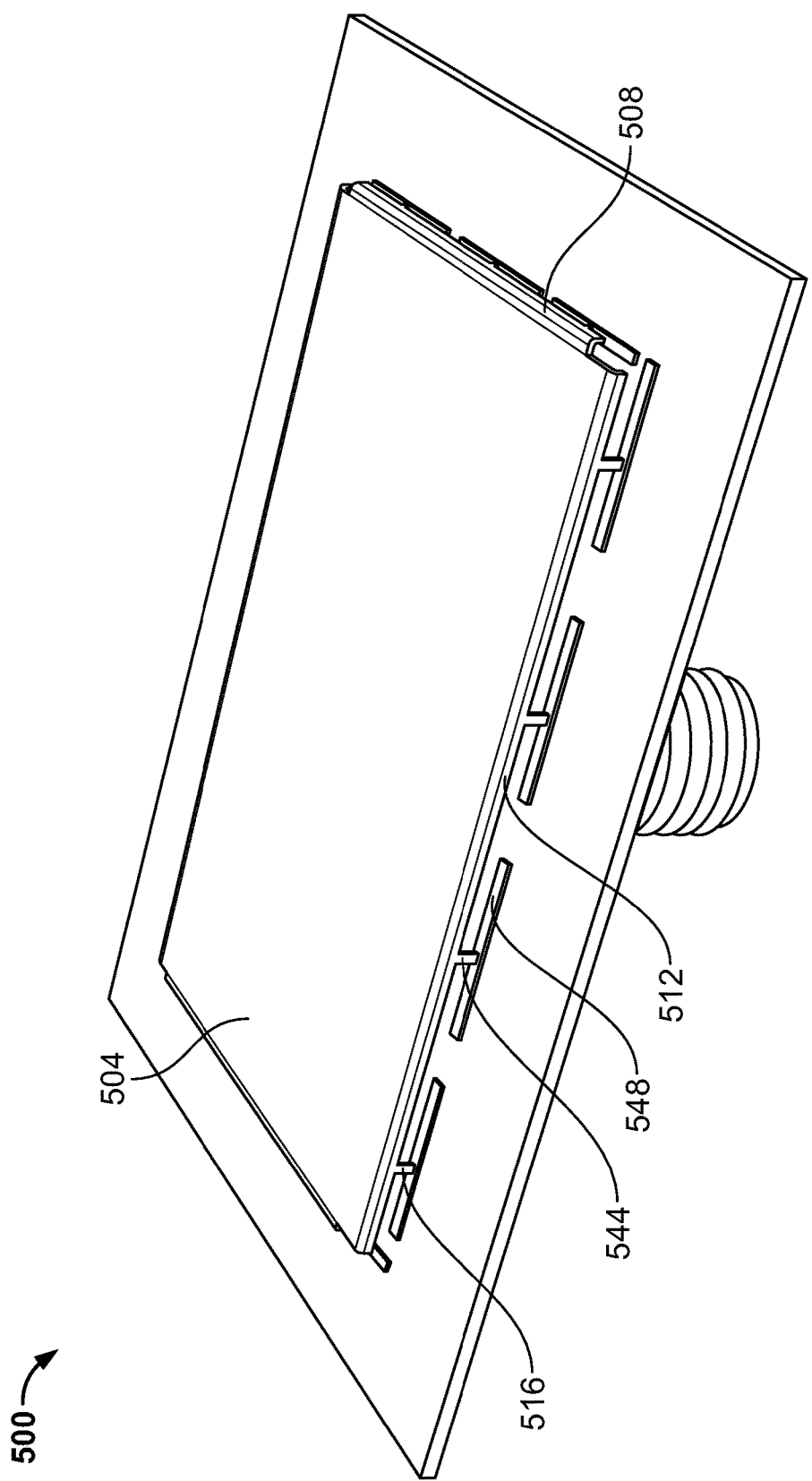
FIG. 11 is a perspective view of a board level shield (BLS) according to another exemplary embodiment in which the BLS is grounded along three sides and there are four L-C resonators along the fourth side of the BLS.

FIG. 11 illustrates another exemplary embodiment of a board level shield (BLS) 500 according to aspects of the present disclosure. The BLS 500 may include features (e.g., cover or upper surface 504, sidewalls 508, upper sidewall portions 512, L-C resonators 516, inductors 544, capacitors 548, etc.) similar to the corresponding features of the BLS 100 shown in FIG. 1.

In the exemplary embodiment shown in FIG. 11, however, only one sidewall 508 of the BLS 500 includes four L-C resonators 516 that depend or extend downwardly from the upper sidewall portion 512. The other three sidewalls of the BLS 500 are grounded and do not include any L-C resonators.

Figure 12:
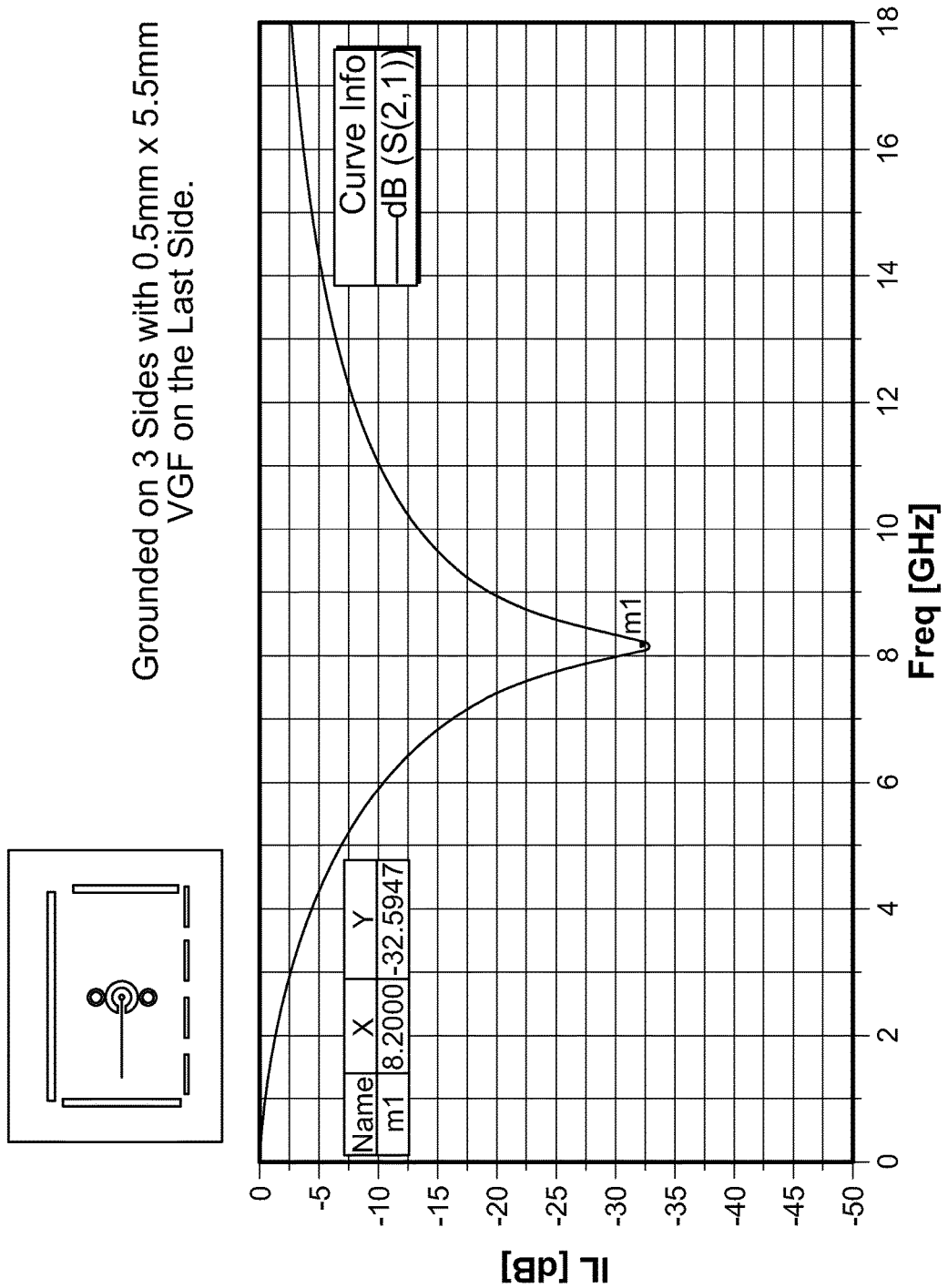
FIG. 12 is a line graph of insertion loss (IL) or shielding effectiveness (dB) versus frequency from 0 to 18 GHz for the exemplary embodiment of the BLS shown in FIG. 11 having the exemplary dimensions shown in FIG. 12.

FIG. 12 is a line graph of insertion loss (IL) or shielding effectiveness (dB) versus frequency from 0 to 18 GHz for the exemplary embodiment of the BLS 500 shown in FIG. 11. FIG. 12 also provides the exemplary dimensions that were used for testing purposes, e.g., grounded on three sides with 0.5 mm×5.5. mm virtual ground fence (VGF) on the last side. As shown in FIG. 12, the BLS 500 had an insertion loss or shielding effectiveness of −32.5947 dB at a frequency of 8.2 GHz. The dimensions and test results shown in FIG. 12 are provided for purpose of example only as other exemplary embodiments may be configured differently, e.g., larger or smaller in size, have different performance, etc.

Figure 13:
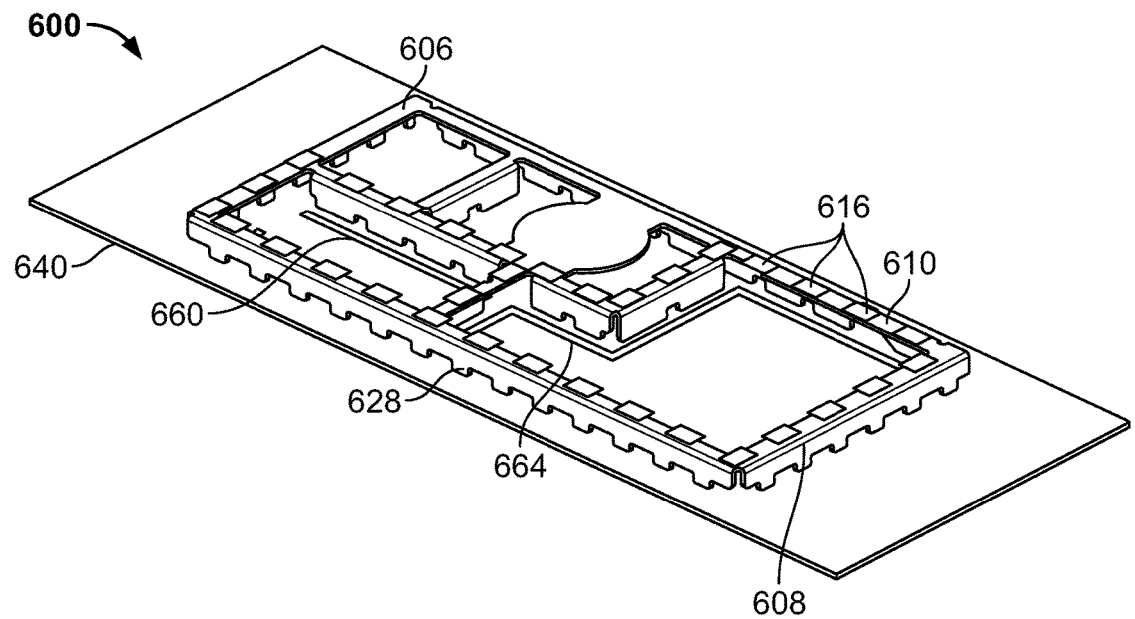
FIG. 13 is a perspective view of a board level shield (BLS) according to another exemplary embodiment in which L-C resonators are shown along an upper surface of the BLS before being overmolded with dielectric material.
Figure 14:
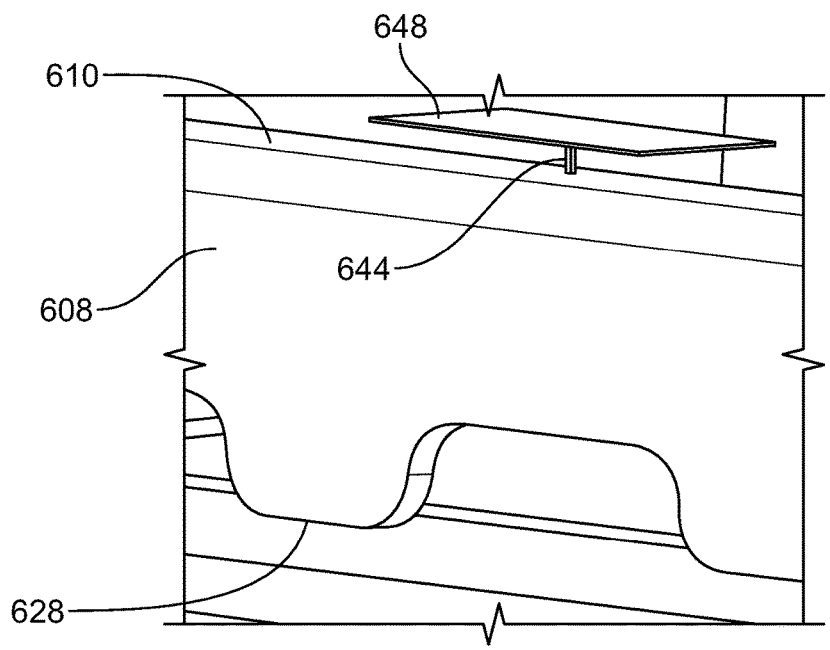
FIG. 14 is a perspective view of a portion of the BLS shown in FIG. 13, and showing the inductor and capacitor of one of the L-C resonators of the BLS according to an exemplary embodiment.
Figure 15:
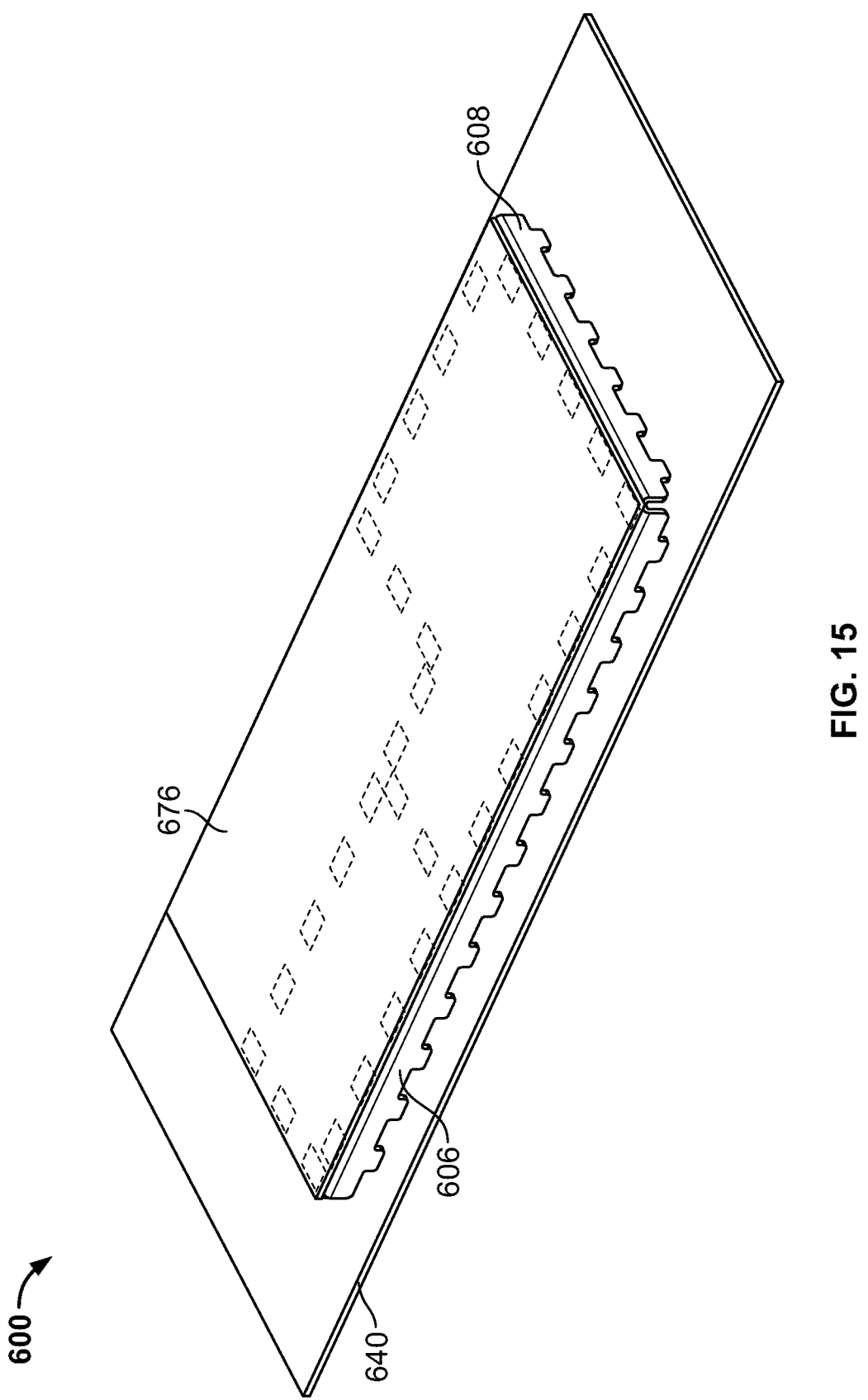
FIG. 15 is a perspective view of the BLS shown in FIG. 13 after overmolding of dielectric material, which may thereby provide a system in package (SiP) shielded module according to an exemplary embodiment.

FIGS. 13 through 15 illustrate another exemplary embodiment of a board level shield (BLS) 600 according to aspects of the present disclosure. As shown in FIG. 13, L-C resonators 616 are spaced apart from each other along an upper surface 610 (e.g., a perimeter flange or rim, etc.) of the outer and inner (or exterior and interior) sidewalls 608 of the BLS frame 606.

Each L-C resonator 616 includes an inductor 644 and a capacitor 648 as shown in FIG. 14. The inductor 644 is linear in this example, although the inductor 644 may be non-linear in other embodiments. Although the L-C resonators 616 are shown to be identical in FIG. 13, other exemplary embodiments (e.g., FIG. 27, etc.) may include one or more L-C resonators that are not identical to every other L-C resonator.

FIG. 15 shows the BLS 600 after overmolding of dielectric material 676. An upper shielding surface (e.g., 304 in FIG. 7, etc.) may be provided (e.g., coated onto, adhesively attached to, etc.) on top of the overmolded dielectric material 676 (e.g., an overmolded plastic material, etc.), to thereby provide a system in package (SiP) shielded module according to an exemplary embodiment. The upper shielding surface may comprise a metallized film, a planar sheet or layer of electrically-conductive material, a metal plated film, a thin metal layer, an electrically-conductive coating (e.g., metal coating provided by plating, sputtering, evaporation, etc.), a sheet of stainless steel, or other suitable electrically-conductive cover or top layer, etc.

The L-C resonators 616 may be configured to virtually connect to the upper shielding surface through the dielectric material 676 without having a physical electrical connection directly between the L-C resonators 616 and the upper shielding surface. The L-C resonators 616 and the upper shielding surface may be operable for providing shielding for one or more components on the substrate 640 within the space or perimeter defined by the BLS interior and exterior sidewalls 608. For example, FIG. 13 shows first and second microstrip lines 660, 664 along the PCB substrate 640 within the perimeter defined by the BLS sidewalls 608.

With continued reference to FIG. 14, the inductor 644 may comprise an elongate linear inductive element, such as an inductive pin having a rectangular or circular cross section, etc. The capacitor 648 may comprise a capacitive patch element, such as a generally rectangular electrically-conductive patch element, etc. The inductor 644 and capacitor 648 may be made of stainless steel, although other electrically-conductive materials may also be used (e.g., other metals, non-metals, etc.).

The inductors 644 may be coupled to the upper surface 610 of the BLS sidewalls 608, such as by solder, electrically-conductive adhesives (e.g., a high-temperature adhesive, epoxy, electrically-conductive pressure sensitive adhesive (CPSA), electrically-conductive hot melt adhesive, etc.), etc. The capacitors 648 may be coupled to the inductors 644, such as by solder, electrically-conductive adhesives, etc. The capacitors 648 are spaced apart and/or supported above the upper surface 610 of the BLS sidewalls 608 by the inductors 644. Each inductor 644 extends between the upper surface 610 of a BLS sidewall 608 and a corresponding one of the capacitors 648. Alternatively, the orientation of the L-C resonators 616 may be reversed or rotated 180 degrees such that the capacitor 648 is coupled to the BLS and the inductor 644 extends upwardly above the capacitor 648 (e.g., FIG. 18, etc.).

In other exemplary embodiments, the inductors 644 and capacitors 648 may be integrally formed (e.g., stamped from stainless steel, etc.) as a single piece with a monolithic construction. Other or additional adhesives and/or methods could also be used to attach an L-C resonator to the BLS. In some other exemplary embodiments, an L-C resonator may be bonded to a BLS by fused metal where the metal is fused by thermal energy (e.g., in a reflow process, etc.), by laser energy, etc.

As shown in FIG. 14, the inductor 644 is coupled to the capacitor 648 such that the capacitor 648 is generally perpendicular to the inductor 644 and generally parallel with the upper surface 610 of the BLS sidewall 608. Alternatively, the L-C resonators 616 may comprise inductors and/or capacitors that have a different configuration, such as having different shapes (e.g., non-circular cross-section, non-rectangular shape, a non-linear shape as shown in FIG. 6, etc.) and/or being made of different materials, etc. For example, the inductive pins (broadly, inductors) may have any cross-section shape so long as the inductive pins are inductive enough to establish the resonance frequency at the correct or predetermined location with the aid of the capacitive patches (broadly, capacitors).

The BLS frame 606 includes mounting feet 628 that may be configured to provide structure for connecting the BLS 600 to a substrate 640. For example, the mounting feet 628 may provide areas for adhesively attaching or soldering the BLS 600 to the substrate 640. Alternative means besides solder and adhesive may also be used for attaching the BLS 600 to a substrate.

In an exemplary embodiment, the mounting feet 628 may be used for directly connecting the BLS 600 to a PCB ground. For example, the mounting feet 628 may be soldered to solder pads and/or vias (broadly, electrically-conductive portions) on the PCB such that the solder provides a direct electrical connection from the mounting 628 to the solder pads and/or vias, which are directly connected to the PCB ground. In this example, the BLS 600 would thus have a direct electrical connection to the PCB ground at the mounting feet 628 and virtual connection to an upper shielding surface through the dielectric material 676 without having a physical electrical connection directly between the L-C resonators 616 and the upper shielding surface.

Figure 16:
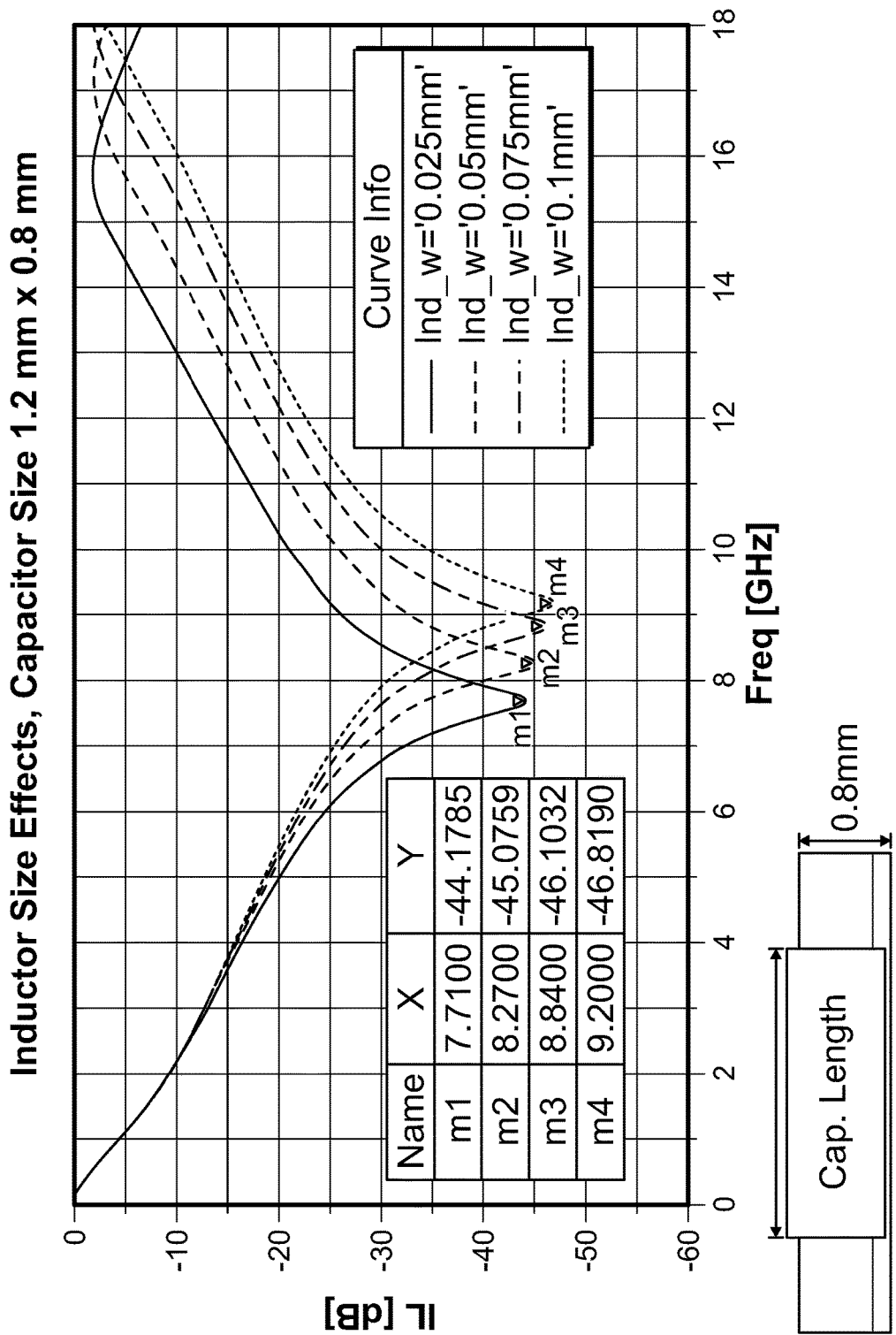
FIG. 16 is a line graph of insertion loss (IL) or shielding effectiveness (dB) versus frequency from 0 to 18 GHz for the exemplary embodiment of the BLS shown in FIGS. 13 through 15 with different inductor sizes.

FIG. 16 is a line graph of insertion loss (IL) or shielding effectiveness (dB) versus frequency from 0 to 18 GHz for the exemplary embodiment of the BLS 600 shown in FIGS. 13 through 15. FIG. 16 generally shows the effects of different inductor sizes when the capacitor length is 1.2 millimeters (mm) and the capacitor width is 0.8 mm. FIG. 16 also generally shows that larger inductance reduces the resonant frequency. In this example, the inductor had a square profile with side widths and lengths of 0.025 mm, 0.05 mm, 0.075 mm, and 0.1 mm. As shown in FIG. 16, the insertion loss or shielding effectiveness was −44.1785 dB at a frequency of 7.71 GHz when the inductor width was 0.025 mm, −45.0759 dB at a frequency of 8.27 GHz when the inductor width was 0.05 mm, −46.1032 dB at a frequency of 8.84 GHz when the inductor width was 0.075 mm, and −46.8190 dB at a frequency of 9.2 GHz when the inductor width was 0.1 mm. The dimensions and test results shown in FIG. 16 are provided for purpose of example only as other exemplary embodiments may be configured differently, e.g., larger or smaller in size, have different performance, etc.

Figure 17:
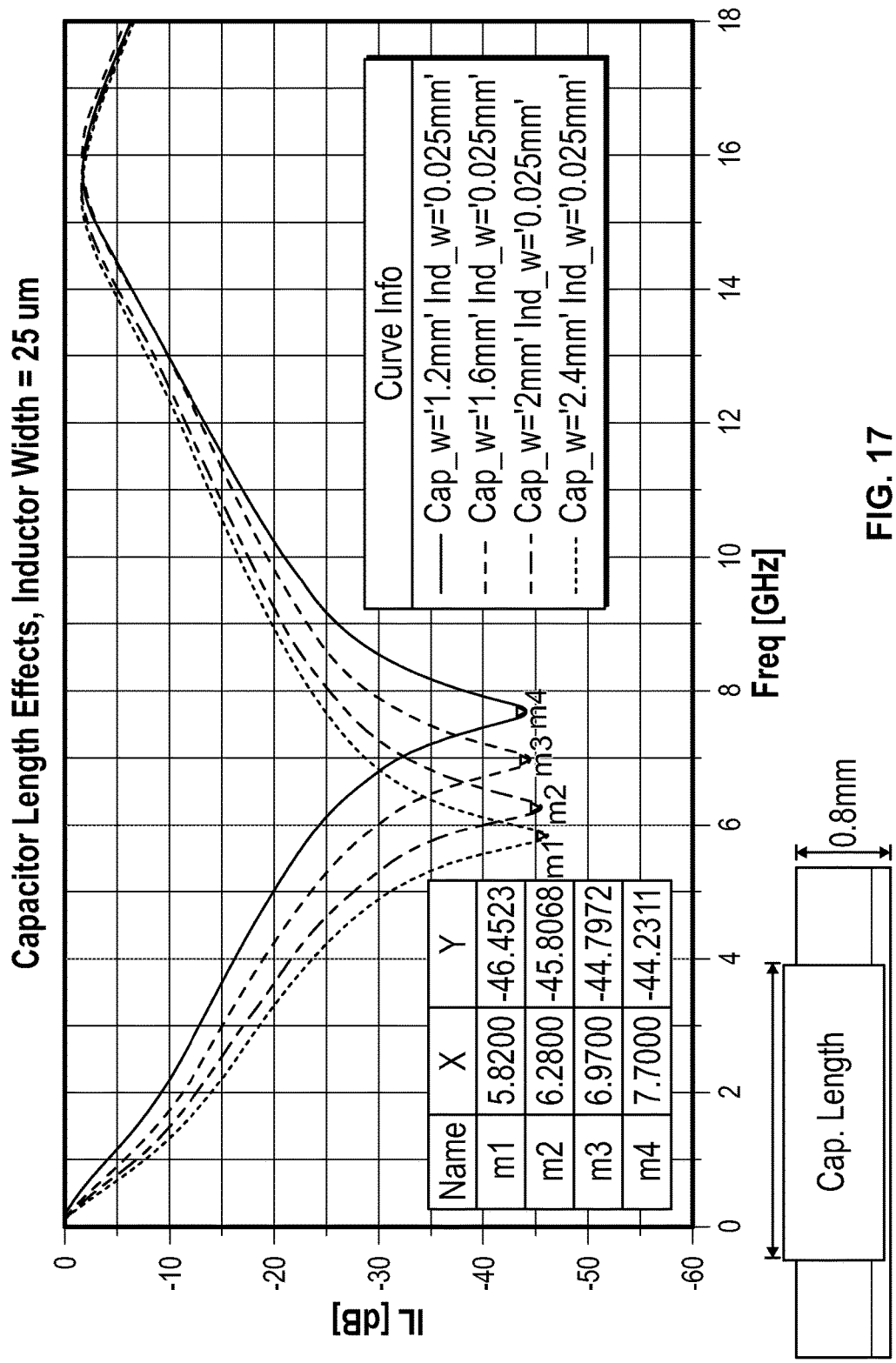
FIG. 17 is a line graph of insertion loss (IL) or shielding effectiveness (dB) versus frequency from 0 to 18 GHz for the exemplary embodiment of the BLS shown in FIGS. 13 through 15 with different capacitor lengths.

FIG. 17 is a line graph of insertion loss (IL) or shielding effectiveness (dB) versus frequency from 0 to 18 GHz for the exemplary embodiment of the BLS 600 shown in FIGS. 13 through 15. FIG. 17 generally shows the effects of different capacitor lengths when the inductor had a square profile with a length and width of 25 micrometers or 0.025 mm and the capacitor width was 0.8 mm. FIG. 17 also generally shows that capacitive element sizes may be used for controlling the resonant frequency. As shown in FIG. 17, the insertion loss or shielding effectiveness was −46.4523 dB at a frequency of 5.82 GHz when the capacitor length was 1.2 mm, −45.8068 dB at a frequency of 6.28 GHz when the capacitor length was 1.6 mm, −44.7972 dB at a frequency of 6.97 GHz when the capacitor length was 2 mm, and −44.2311 dB at a frequency of 7.7 GHz when the capacitor length was 2.4 mm. The dimensions and test results shown in FIG. 17 are provided for purpose of example only as other exemplary embodiments may be configured differently, e.g., larger or smaller in size, have different performance, etc.

FIGS. 18A through 18D illustrate an exemplary process for adding an L-C resonator 716 along an upper surface 710 of a sidewall 708 of a BLS frame 706 (e.g., stainless steel, etc.) according to an exemplary embodiment. FIG. 18A shows an opening 711 (e.g., notch, cutout, etc.) along the upper surface 710 (e.g., upper perimeter lip or rim, etc.) of the BLS frame sidewall 708. FIG. 18B shows an electrical insulator or dielectric 713 disposed along the portions of the BLS frame 706 that define the opening 711 along the upper surface 710 of the BLS frame sidewall 708.

FIG. 18C shows a capacitor 748 (e.g., stainless steel, other electrical conductor, etc.) positioned within the opening 711 against the electrical insulator 713. FIG. 18D shows an inductor 744 (e.g., stainless steel, other electrical conductor, etc.) coupled to the capacitor 748, whereby the inductor 744 extends upwardly above the capacitor 748.

The BLS frame 706 may include a plurality of the L-C resonators 716 spaced apart along the upper surface 710 of the frame's sidewalls 708. The L-C resonators 716 may be configured to be operable for virtually connecting to an upper shielding surface through an overmolded dielectric material without having a physical electrical connection directly between the L-C resonators 716 and the upper shielding surface. The L-C resonators 716 and the upper shielding surface may be operable for providing shielding for one or more components on a substrate within the space or perimeter defined by the BLS sidewall 708.

Figure 19:
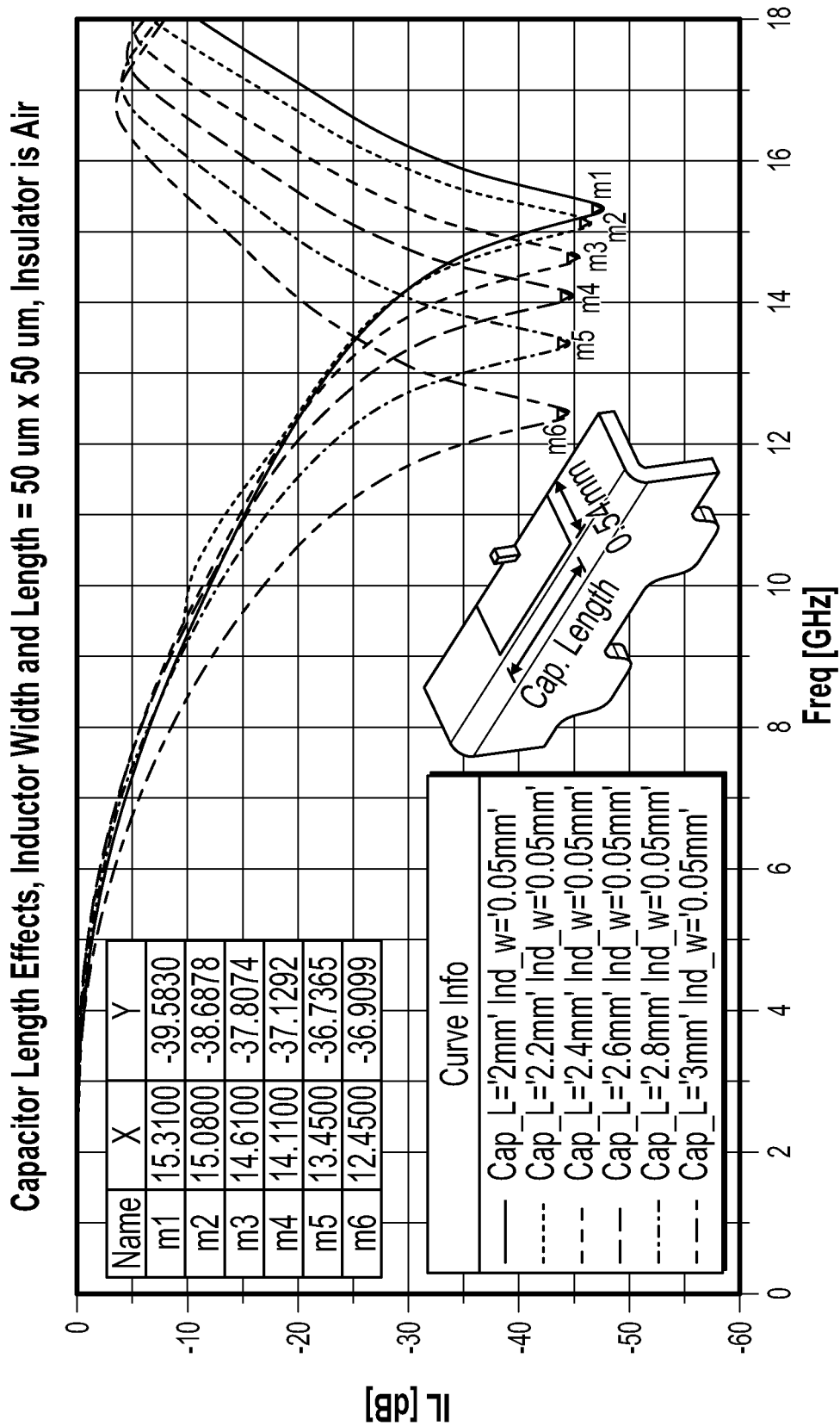
FIG. 19 is a line graph of insertion loss (IL) or shielding effectiveness (dB) versus frequency from 0 to 18 GHz for an exemplary embodiment of a BLS with sidewalls and L-C resonators as shown in FIG. 18D with different capacitor lengths.

FIG. 19 is a line graph of insertion loss (IL) or shielding effectiveness (dB) versus frequency from 0 to 18 GHz for an exemplary embodiment of a BLS with sidewalls 708 and L-C resonators 716 as shown in FIG. 18D. FIG. 19 generally shows the effects of different capacitor lengths when the inductor had a square profile with a length and width of 50 micrometers or 0.05 mm, the insulator was air, and the capacitor width was 0.05 mm. FIG. 19 also generally shows that larger capacitive element sizes reduce the resonant frequency. As shown in FIG. 19, the insertion loss or shielding effectiveness was −39.5830 dB at a frequency of 15.31 GHz when the capacitor length was 2 mm, −38.6878 dB at a frequency of 15.08 GHz when the capacitor length was 2.2 mm, −37.8074 dB at a frequency of 14.61 GHz when the capacitor length was 2.4 mm, −37.1292 dB at a frequency of 14.11 GHz when the capacitor length was 2.6 mm, −36.7365 dB at a frequency of 13.45 GHz when the capacitor length was 2.8 mm, and −36.9099 dB at a frequency of 12.45 GHz when the capacitor length was 3 mm. The dimensions and test results shown in FIG. 19 are provided for purpose of example only as other exemplary embodiments may be configured differently, e.g., larger or smaller in size, have different performance, etc.

Figure 20:
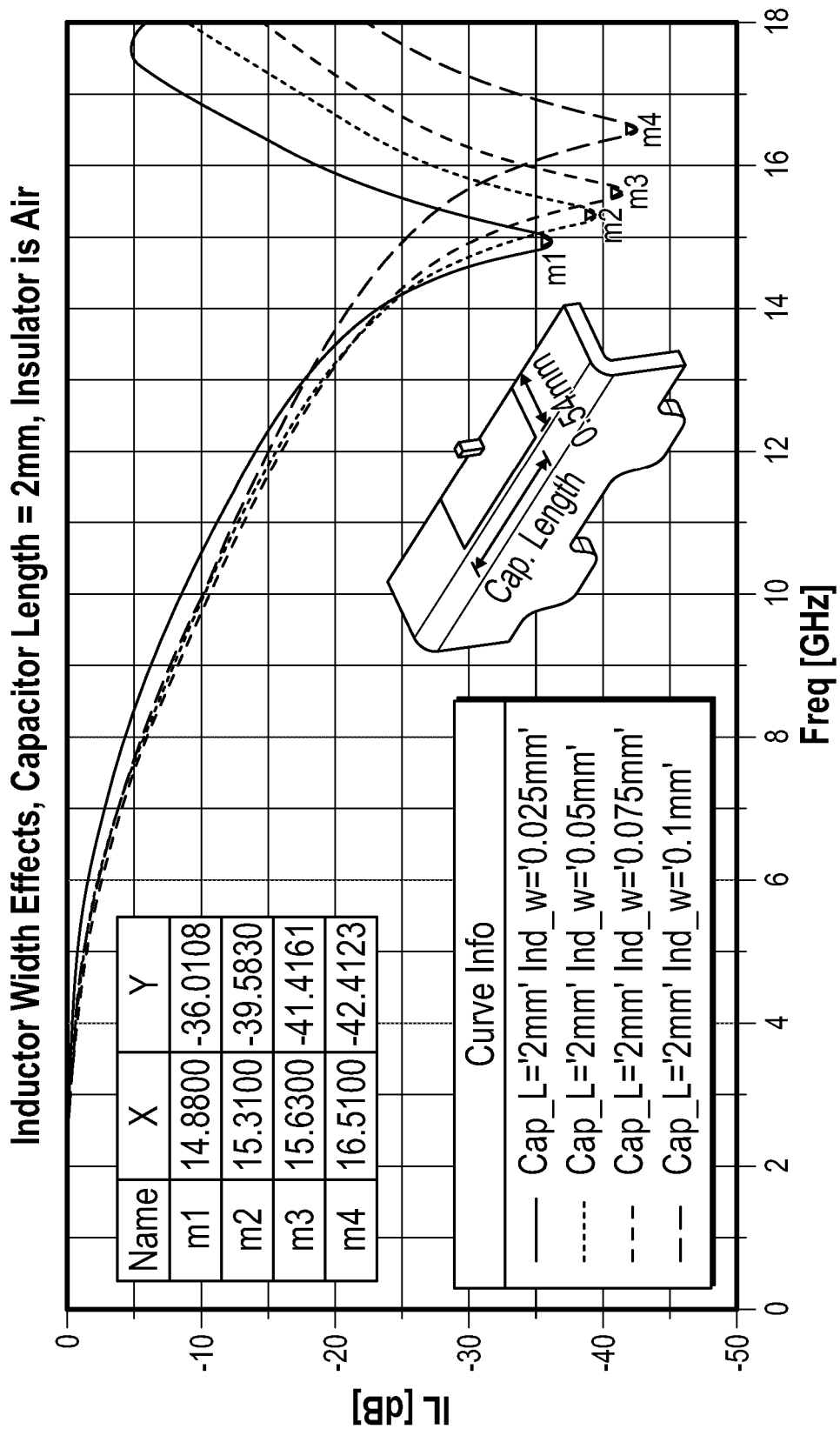
FIG. 20 is a line graph of insertion loss (IL) or shielding effectiveness (dB) versus frequency from 0 to 18 GHz for an exemplary embodiment of a BLS with sidewalls and L-C resonators as shown in FIG. 18D with different inductor sizes.

FIG. 20 is a line graph of insertion loss (IL) or shielding effectiveness (dB) versus frequency from 0 to 18 GHz for an exemplary embodiment of a BLS with sidewalls 708 and L-C resonators 716 as shown in FIG. 18D. FIG. 20 generally shows the effects of different inductor sizes when the capacitor length and width is 2 mm and 0.54 mm, respectively, and the insulator is air. In this example, the inductor had a square profile with side widths and lengths of 0.025 mm, 0.05 mm, 0.075 mm, and 0.1 mm. As shown in FIG. 20, the insertion loss or shielding effectiveness was −36.0108 dB at a frequency of 14.88 GHz when the inductor width was 0.025 mm, −39.5830 dB at a frequency of 15.31 GHz when the inductor width was 0.05 mm, −41.4161 dB at a frequency of 15.63 GHz when the inductor width was 0.075 mm, and −42.4123 dB at a frequency of 16.51 GHz when the inductor width was 0.1 mm. The dimensions and test results shown in FIG. 19 are provided for purpose of example only as other exemplary embodiments may be configured differently, e.g., larger or smaller in size, have different performance, etc.

Figure 21:
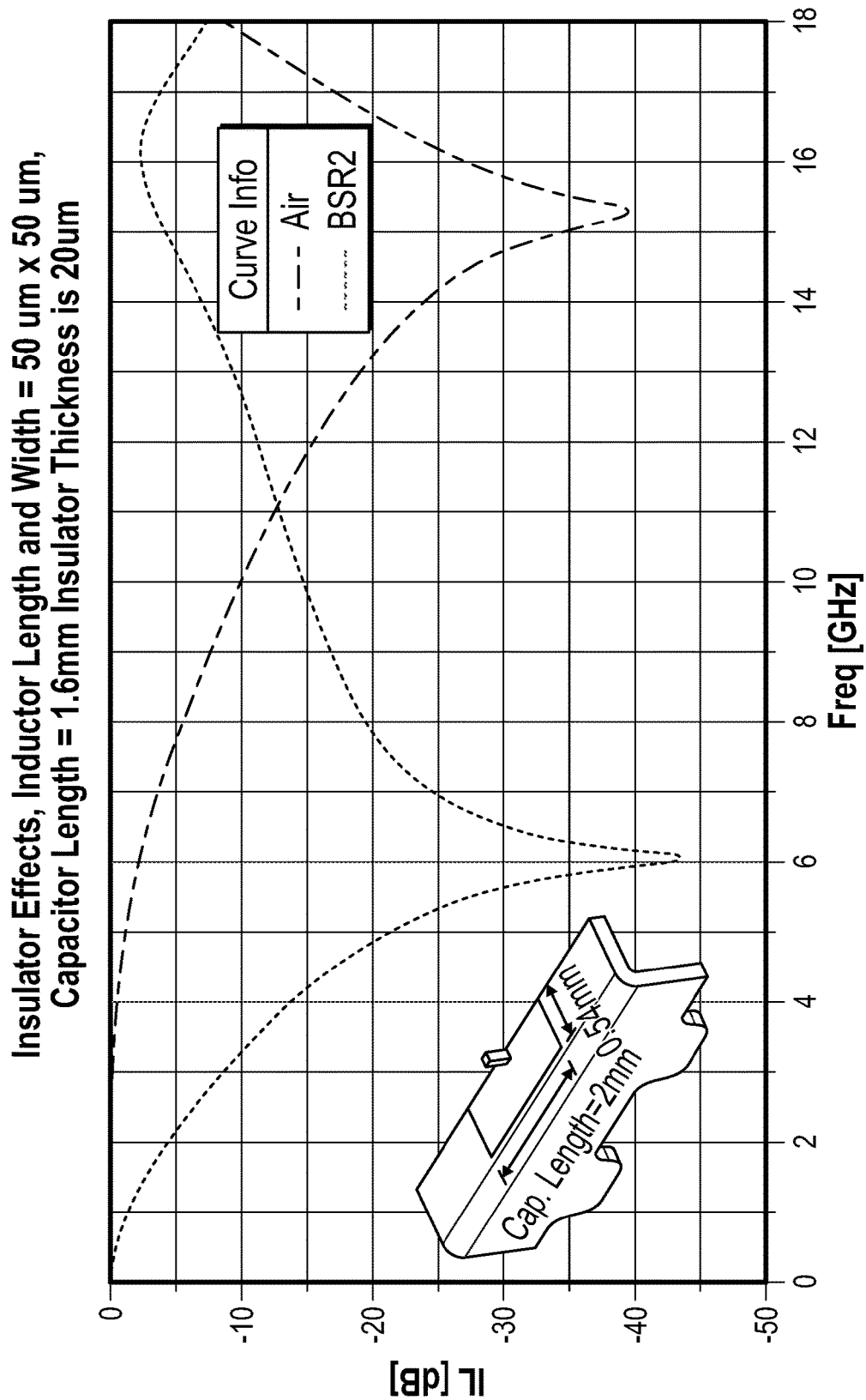
FIG. 21 is a line graph of insertion loss (IL) or shielding effectiveness (dB) versus frequency from 0 to 18 GHz for an exemplary embodiment of a BLS with sidewalls and L-C resonators as shown in FIG. 18D with different insulators (air and BSR2).

FIG. 21 is a line graph of insertion loss (IL) or shielding effectiveness (dB) versus frequency from 0 to 18 GHz for an exemplary embodiment of a BLS with sidewalls 708 and L-C resonators 716 as shown in FIG. 18D. FIG. 21 generally shows the effects of using different insulators (air and BSR2) when the capacitor length and width are 1.6 mm and 0.54 mm, respectively, the inductor had a square profile with a length and width of 50 micrometers or 0.05 mm, and the insulator thickness was 20 micrometers or 0.02 mm. BSR2 refers to an ECCOSORB™ thin, flexible, high-loss, electrically non-conductive silicone rubber sheet from Laird. These specific types of insulators, dimensions, and test results are provided for purpose of example only.

Figure 23:
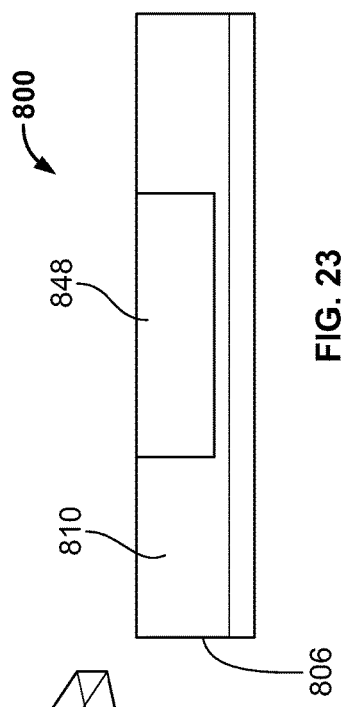
FIG. 23 is a top view of the portion of the BLS and L-C resonator shown in FIG. 22.
Figure 22:
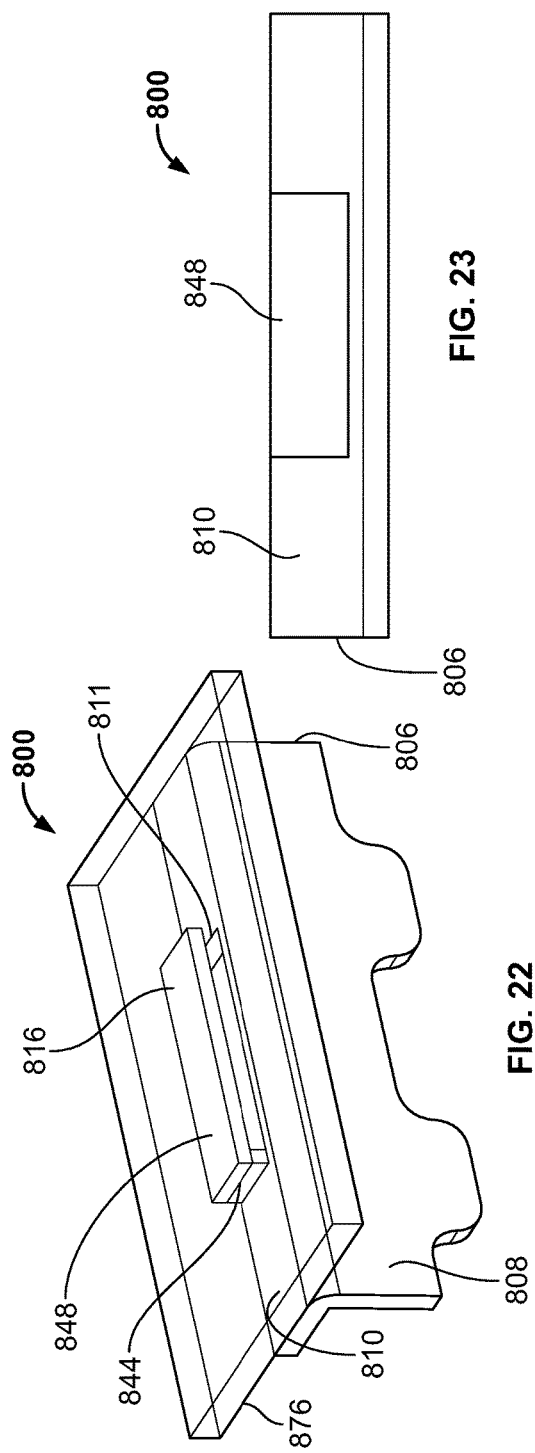
FIG. 22 is a perspective view of a portion of a BLS including an L-C resonator along an upper surface of the BLS overmolded with a dielectric material according to an exemplary embodiment.
Figure 24:
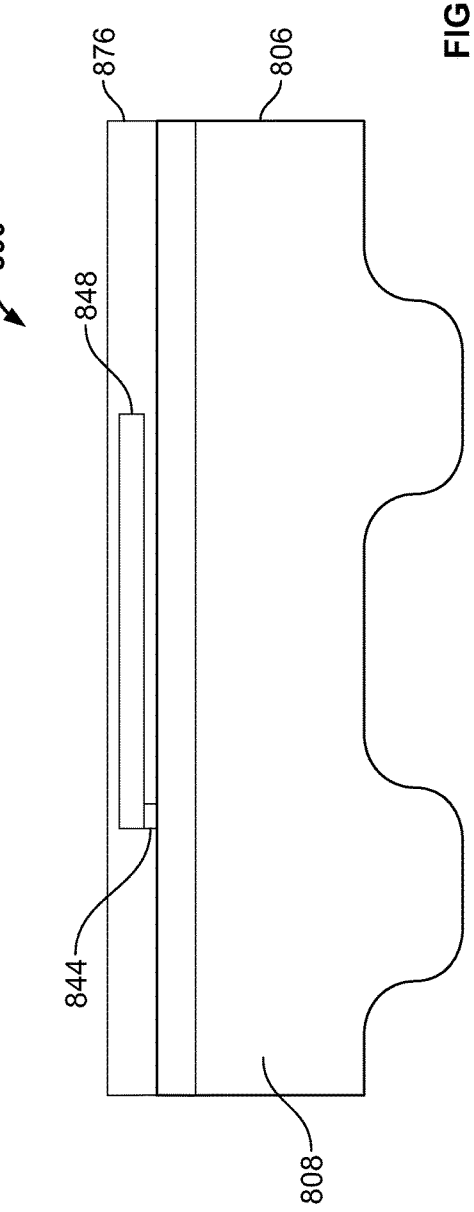
FIG. 24 is a side view of the portion of the BLS and L-C resonator shown in FIG. 22.

FIGS. 22 through 24 illustrate a portion of another exemplary embodiment of a board level shield (BLS) 800 according to aspects of the present disclosure. As shown, an L-C resonator 816 is positioned along an upper surface 810 (e.g., a perimeter flange or rim, etc.) of a sidewall 808 of a BLS frame 806.

A dielectric material 876 is disposed (e.g., overmolded, etc.) over the L-C resonator 816. The dielectric material overmold 876 may have a thickness of 200 micrometers or 0.2 mm. This thickness dimension is provided for purpose of example only as other exemplary embodiments may have a thicker or thinner dielectric overmold.

An upper shielding surface (e.g., 304 in FIG. 7, etc.) may be provided (e.g., coated onto, adhesively attached to, etc.) on top of the overmolded dielectric material 876 (e.g., an overmolded plastic material, etc.), to thereby provide a system in package (SiP) shielded module according to an exemplary embodiment. The upper shielding surface may comprise a metallized film, a planar sheet or layer of electrically-conductive material, a metal plated film, a thin metal layer, an electrically-conductive coating (e.g., metal coating provided by plating, sputtering, evaporation, etc.), a sheet of stainless steel, or other suitable electrically-conductive cover or top layer, etc.

The L-C resonator 816 may be configured to virtually connect to the upper shielding surface through the dielectric material 876 without having a physical electrical connection directly between the L-C resonators 816 and the upper shielding surface. The L-C resonators 816 and the upper shielding surface may be operable for providing shielding for one or more components on a substrate within the space or perimeter defined by the BLS interior and exterior sidewalls 808.

The L-C resonator 816 includes an inductor 844 and a capacitor 848. The inductor 844 and/or capacitor 848 may be made of stainless steel, although other electrically-conductive materials may also be used (e.g., other metals, non-metals, etc.).

As shown in FIGS. 22 and 24, the inductor 844 may be coupled to the upper surface 810 of the BLS sidewalls 808, such as by solder, electrically-conductive adhesives (e.g., a high-temperature adhesive, epoxy, electrically-conductive pressure sensitive adhesive (CPSA), electrically-conductive hot melt adhesive, etc.), etc. The capacitor 848 may be coupled to the inductor 844, such as by solder, electrically-conductive adhesives, etc. The capacitor 848 is spaced apart and/or supported above an opening 811 in the upper surface 810 of the BLS sidewall 808 by the inductor 844. The inductor 844 extends between the upper surface 810 of the BLS sidewall 808 and the capacitor 848. Alternatively, the orientation of the L-C resonator 816 may be reversed or rotated 180 degrees such that the capacitor 848 is coupled to the BLS frame sidewall 808 and the inductor 844 extends upwardly above the capacitor 848.

In other exemplary embodiments, the inductor 844 and capacitors 848 may be integrally formed (e.g., stamped from stainless steel, etc.) as a single piece with a monolithic construction. Other or additional adhesives and/or methods could also be used to attach an L-C resonator to the BLS. In some other exemplary embodiments, an L-C resonator may be bonded to a BLS by fused metal where the metal is fused by thermal energy (e.g., in a reflow process, etc.), by laser energy, etc.

As shown in FIGS. 22 and 24, the inductor 844 is coupled to the capacitor 848 such that the capacitor 848 is generally perpendicular to the inductor 844 and generally parallel with the upper surface 810 of the BLS sidewall 808. Alternatively, the L-C resonator 816 may comprise inductors and/or capacitors that have a different configuration, such as having different shapes (e.g., non-circular cross-section, non-rectangular shape, a non-linear shape as shown in FIG. 6, etc.) and/or being made of different materials, etc.

The BLS frame 806 may include a plurality of the L-C resonators 816 spaced apart along the upper surface 810 of the frame's sidewalls 808. The L-C resonators 816 may be configured to be operable for virtually connecting to an upper shielding surface through the overmolded dielectric material 876 without having a physical electrical connection directly between the L-C resonators 816 and the upper shielding surface. The L-C resonators 816 and the upper shielding surface may be operable for providing shielding for one or more components on a substrate within the space or perimeter defined by the BLS sidewall 808.

Figure 25:
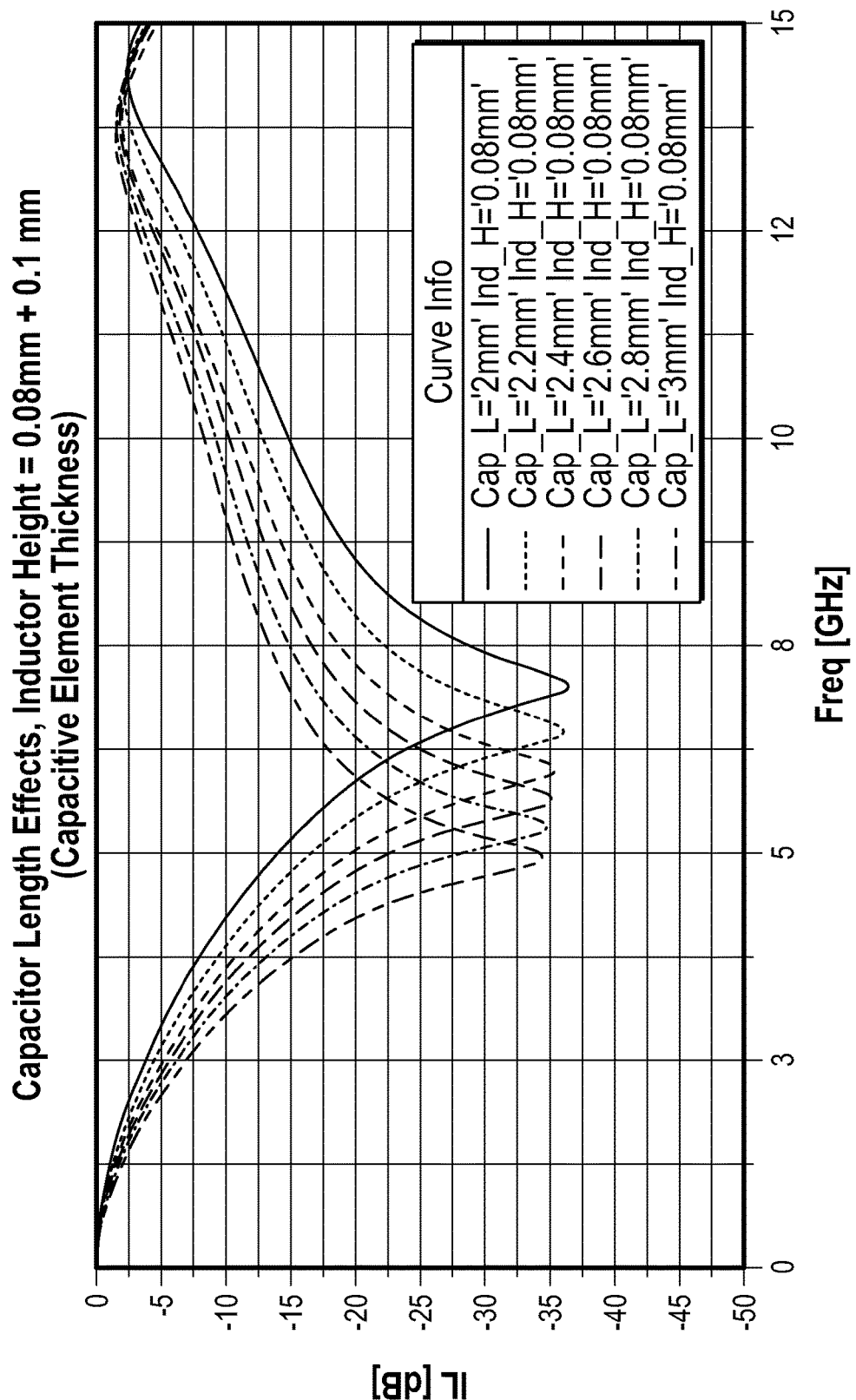
FIG. 25 is a line graph of insertion loss (IL) or shielding effectiveness (dB) versus frequency from 0 to 15 GHz for an exemplary embodiment of a BLS with sidewalls and L-C resonators as shown in FIGS. 22 through 24 with different capacitor lengths.

FIG. 25 is a line graph of insertion loss (IL) or shielding effectiveness (dB) versus frequency from 0 to 15 GHz for an exemplary embodiment of a BLS with sidewalls 808 and L-C resonators 816 as shown in FIGS. 22 through 24 with different capacitor lengths. FIG. 25 generally shows the effects of different capacitor lengths (e.g., 2 mm, 2.2 mm, 2.4 mm, 2.6, mm, 2.8 mm, 3 mm, etc.) when the inductor height was 0.08 mm+0.1 mm capacitive element thickness. The dimensions and test results shown in FIG. 25 are provided for purpose of example only as other exemplary embodiments may be configured differently, e.g., larger or smaller in size, have different performance, etc.

Figure 26:
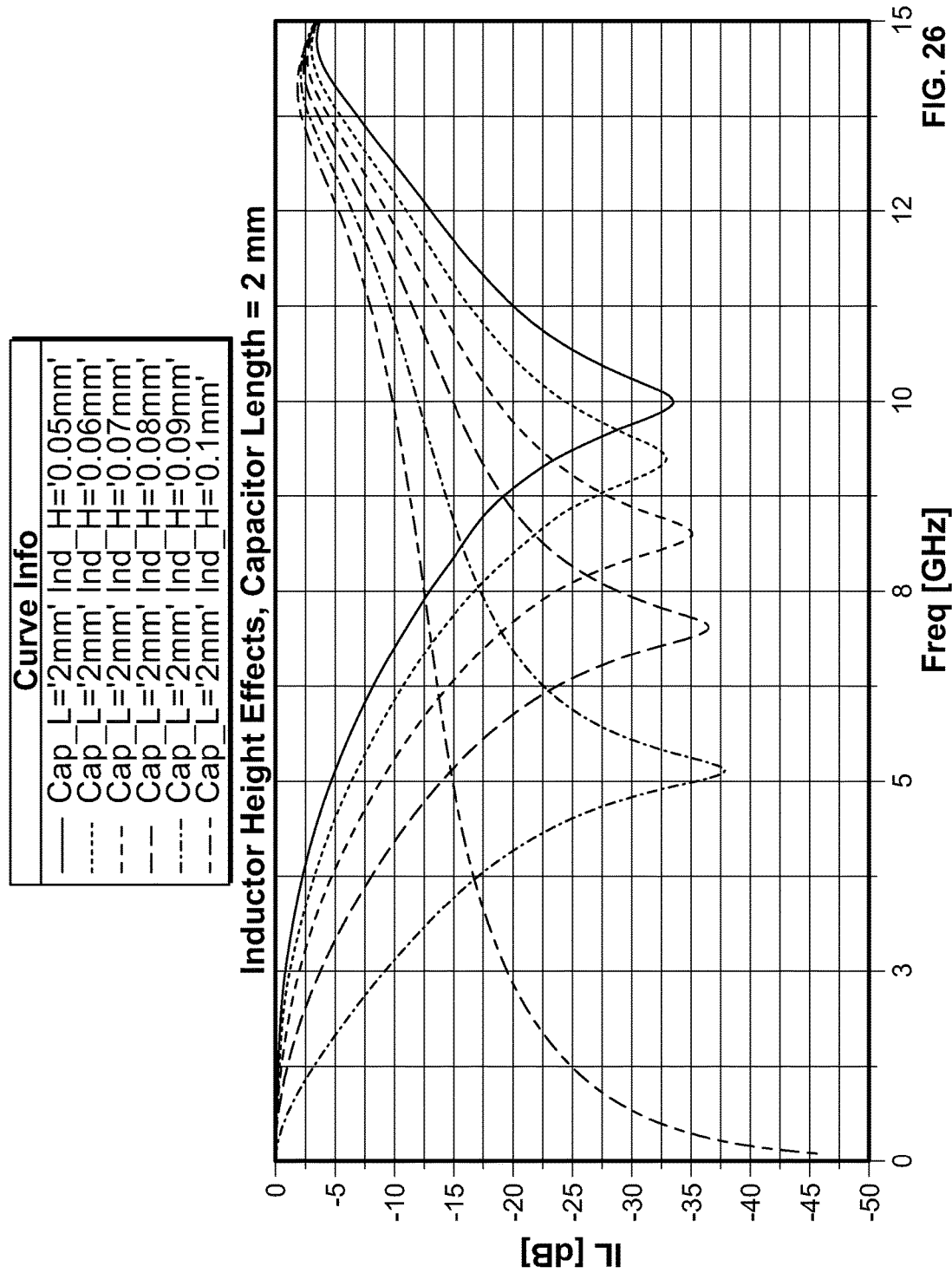
FIG. 26 is a line graph of insertion loss (IL) or shielding effectiveness (dB) versus frequency from 0 to 15 GHz for an exemplary embodiment of a BLS with sidewalls and L-C resonators as shown in FIGS. 22 through 24 with different inductor heights.

FIG. 26 is a line graph of insertion loss (IL) or shielding effectiveness (dB) versus frequency from 0 to 15 GHz for an exemplary embodiment of a BLS with sidewalls 808 and L-C resonators 816 as shown in FIGS. 22 through 24 with different inductor heights. FIG. 26 generally shows the effects of different inductor heights (e.g., 0.05 mm, 0.06 mm, 0.07 mm, 0.08 mm, 0.09 mm, 0.1 mm, etc.) when the capacitor length is 2 mm. FIG. 26 also generally shows that inductor height reduction leads to larger capacitance, which can greatly affect the resonant frequency. The dimensions and test results shown in FIG. 26 are provided for purpose of example only as other exemplary embodiments may be configured differently, e.g., larger or smaller in size, have different performance, etc.

Figure 27:
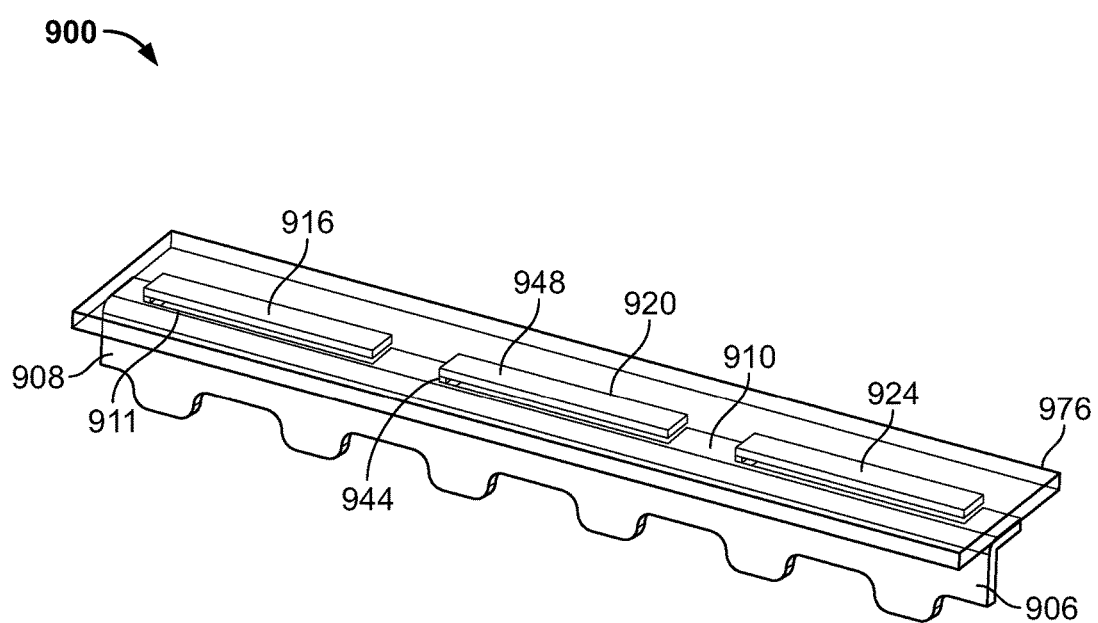
FIG. 27 is a perspective view of a portion of a BLS including three L-C resonators along an upper surface of the BLS overmolded with a dielectric material according to an exemplary embodiment.

FIG. 27 illustrates a portion of another exemplary embodiment of a board level shield (BLS) 900 according to aspects of the present disclosure. As shown, L-C resonators 916, 920, 924 are positioned along an upper surface 910 (e.g., a perimeter flange or rim, etc.) of a sidewall 908 of a BLS frame 906. A dielectric material 976 is disposed (e.g., overmolded, etc.) over the L-C resonators 916, 920, 924.

An upper shielding surface (e.g., 304 in FIG. 7, etc.) may be provided (e.g., coated onto, adhesively attached to, etc.) on top of the overmolded dielectric material 976 (e.g., an overmolded plastic material, etc.), to thereby provide a system in package (SiP) shielded module according to an exemplary embodiment. The upper shielding surface may comprise a metallized film, a planar sheet or layer of electrically-conductive material, a metal plated film, a thin metal layer, an electrically-conductive coating (e.g., metal coating provided by plating, sputtering, evaporation, etc.), a sheet of stainless steel, or other suitable electrically-conductive cover or top layer, etc.

The L-C resonators 916, 920, 924 may be configured to virtually connect to the upper shielding surface through the dielectric material 976 without having a physical electrical connection directly between the L-C resonators 916, 920, 924 and the upper shielding surface. The L-C resonators 916, 920, 924 and the upper shielding surface may be operable for providing shielding for one or more components on a substrate within the space or perimeter defined by the BLS interior and exterior sidewalls 908.

Each L-C resonator 916, 920, 924 includes an inductor 944 and a capacitor 948. The inductor 944 and/or capacitor 948 may be made of stainless steel, although other electrically-conductive materials may also be used (e.g., other metals, non-metals, etc.).

The inductors 944 may be coupled to the upper surface 910 of the BLS sidewalls 908, such as by solder, electrically-conductive adhesives (e.g., a high-temperature adhesive, epoxy, electrically-conductive pressure sensitive adhesive (CPSA), electrically-conductive hot melt adhesive, etc.), etc. The capacitors 948 may be coupled to the inductors 944, such as by solder, electrically-conductive adhesives, etc. The capacitors 948 are spaced apart and/or supported above openings 911 in the upper surface 910 of the BLS sidewalls 908 by the inductors 944. The inductors 944 extend between the upper surface 910 of the BLS sidewall 908 and the capacitor 948. Alternatively, the orientation of the L-C resonators 916 may be reversed or rotated 180 degrees such that the capacitors 948 are coupled to the BLS frame sidewall 908 and the inductor 944 extends upwardly above the capacitor 948.

In other exemplary embodiments, the inductor 944 and capacitors 948 may be integrally formed (e.g., stamped from stainless steel, etc.) as a single piece with a monolithic construction. Other or additional adhesives and/or methods could also be used to attach an L-C resonator to the BLS. In some other exemplary embodiments, an L-C resonator may be bonded to a BLS by fused metal where the metal is fused by thermal energy (e.g., in a reflow process, etc.), by laser energy, etc.

As shown in FIGS. 22 and 24, the inductors 944 are coupled to the capacitors 948 such that the capacitors 948 are generally perpendicular to the inductors 944 and generally parallel with the upper surface 910 of the BLS sidewall 9808. Alternatively, the L-C resonators 916 may comprise inductors and/or capacitors that have a different configuration, such as having different shapes (e.g., non-circular cross-section, non-rectangular shape, a non-linear shape as shown in FIG. 6, etc.) and/or being made of different materials, etc.

The BLS frame 906 may include a plurality of the L-C resonators 916 spaced apart along the upper surface 910 of the frame's sidewalls 908. The L-C resonators 916 may be configured to be operable for virtually connecting to an upper shielding surface through the overmolded dielectric material 976 without having a physical electrical connection directly between the L-C resonators 916 and the upper shielding surface. The L-C resonators 916 and the upper shielding surface may be operable for providing shielding for one or more components on a substrate within the space or perimeter defined by the BLS sidewall 908.

Figure 28:
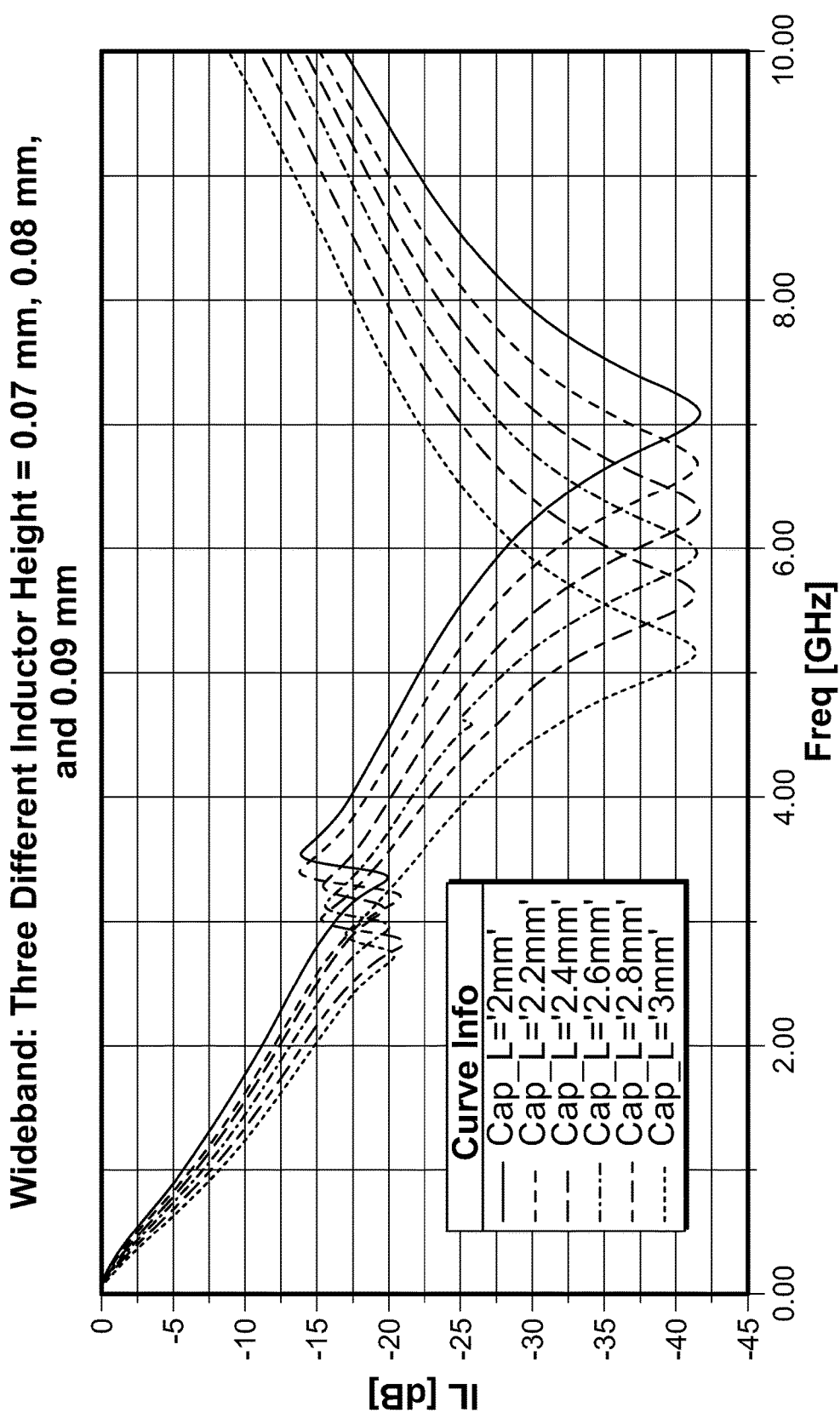
FIG. 28 is a line graph of insertion loss (IL) or shielding effectiveness (dB) versus frequency from 0 to 10 GHz for an exemplary embodiment of a BLS with sidewalls and L-C resonators as shown in FIG. 27.

FIG. 28 is a line graph of insertion loss (IL) or shielding effectiveness (dB) versus frequency from 0 to 10 GHz for an exemplary embodiment of a BLS with sidewalls 908 and L-C resonators 916, 920, 916. FIG. 28 generally shows the effects of different capacitor lengths when the three inductors had different heights of 0.07 mm, 0.08 mm, and 0.09 mm (e.g., for wideband operation, etc.). The dimensions and test results shown in FIG. 26 are provided for purpose of example only as other exemplary embodiments may be configured differently, e.g., larger or smaller in size, have different performance, etc.

Figure 29:
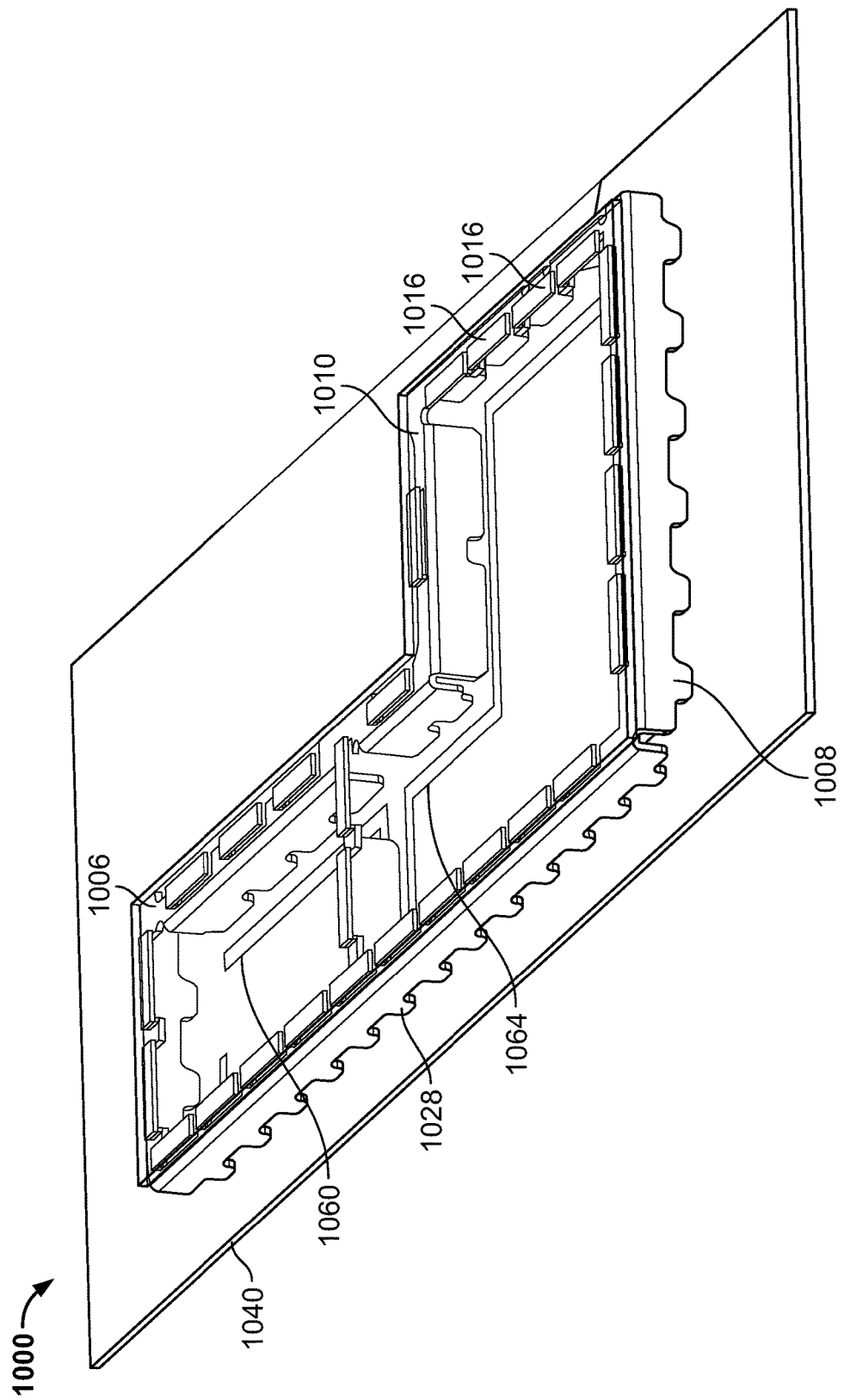
FIG. 29 is a perspective view of a board level shield (BLS) that includes a virtual ground fence or frame (VGF) comprising L-C resonators along an upper surface of the BLS according to an exemplary embodiment.

FIGS. 29 through 32 illustrate another exemplary embodiment of a board level shield (BLS) 1000 according to aspects of the present disclosure. As shown in FIG. 29, L-C resonators 1016 are spaced apart from each other along an upper surface 1010 (e.g., a perimeter flange or rim, etc.) of the outer and inner (or exterior and interior) sidewalls 1008 of the BLS frame 1006.

Figure 30:
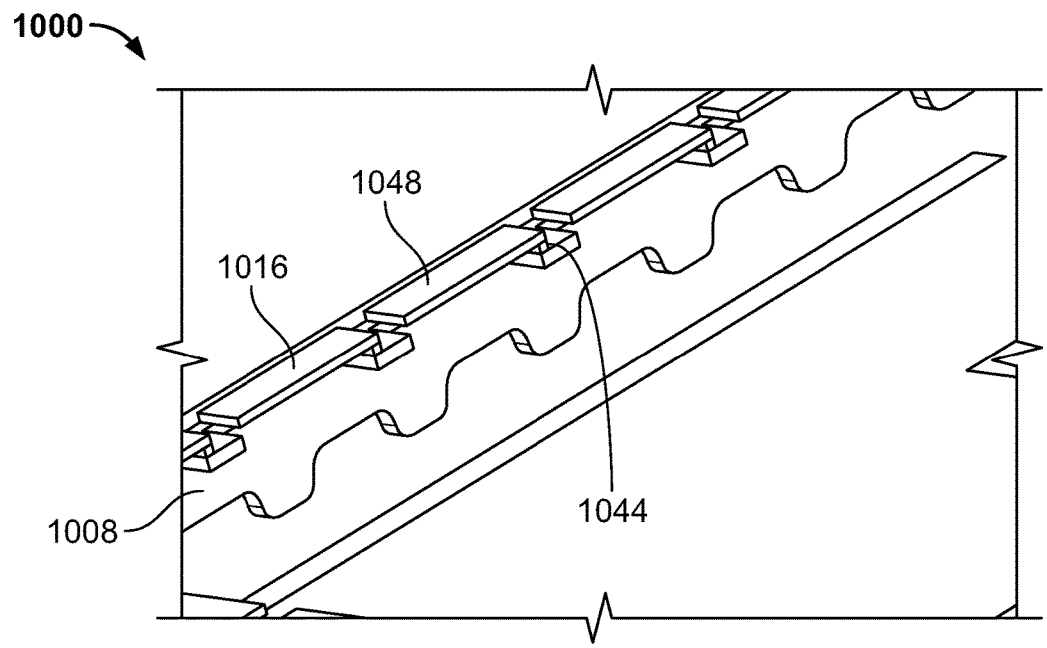
FIG. 30 is a perspective view of a portion of the BLS shown in FIG. 29.
Figure 31:
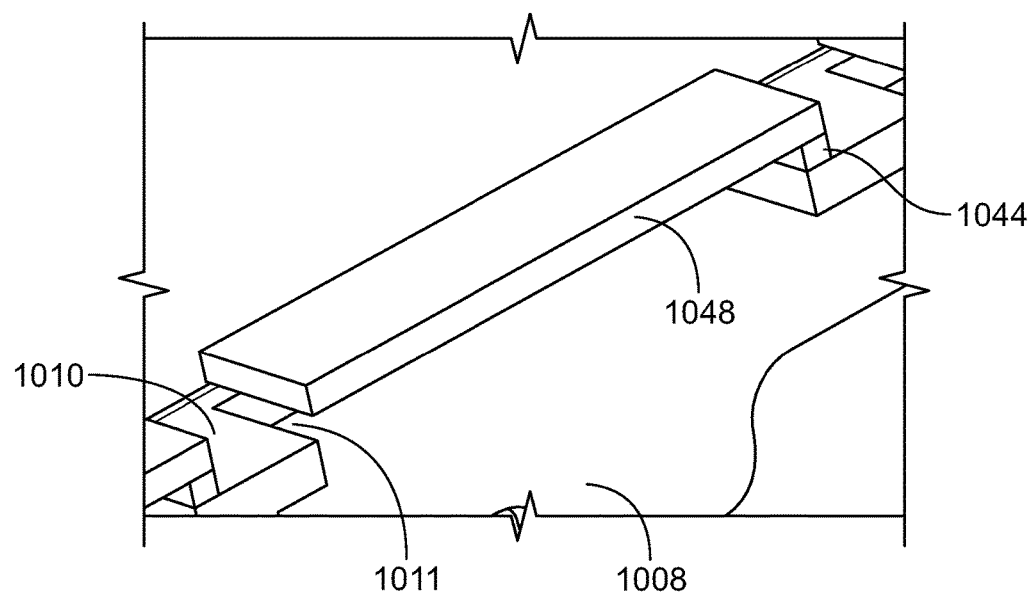
FIG. 31 is a perspective view of a portion of the BLS shown in FIG. 29 with exemplary dimensions provided for purpose of illustration only.

Each L-C resonator 1016 includes an inductor 1044 and a capacitor 1048 as shown in FIGS. 30 and 31. The inductors 1044 are linear in this example, although the inductors 1044 may be non-linear in other embodiments.

A dielectric material may be overmolded over the L-C resonators 1016. An upper shielding surface (e.g., 304 in FIG. 7, etc.) may be provided (e.g., coated onto, adhesively attached to, etc.) on top of the overmolded dielectric material (e.g., an overmolded plastic material, etc.), to thereby provide a system in package (SiP) shielded module according to an exemplary embodiment. The upper shielding surface may comprise a metallized film, a planar sheet or layer of electrically-conductive material, a metal plated film, a thin metal layer, an electrically-conductive coating (e.g., metal coating provided by plating, sputtering, evaporation, etc.), a sheet of stainless steel, or other suitable electrically-conductive cover or top layer, etc.

Figure 32:
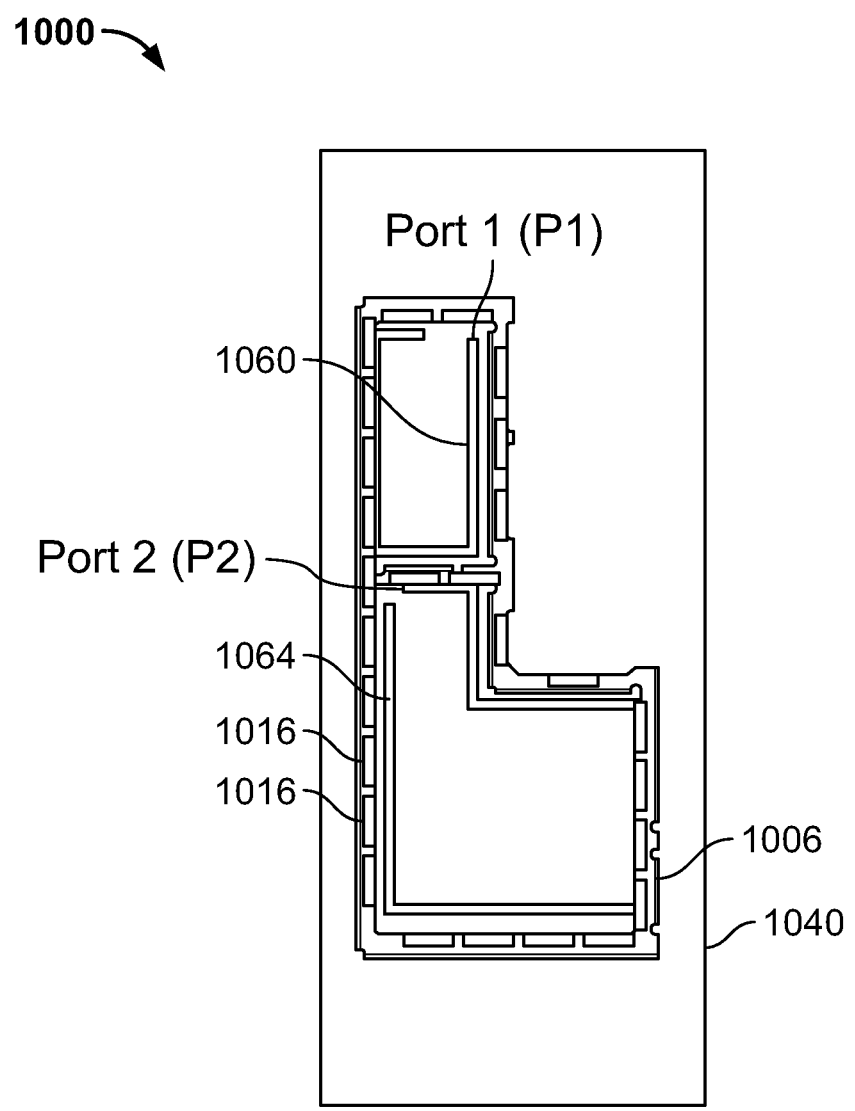
FIG. 32 is a top view of the BLS shown in FIG. 29, and showing microstrip lines along the printed circuit board and ports P1 and P2 at ends of the microstrip lines. The other ends of microstrip lines are terminated with matched load.

The L-C resonators 1016 may be configured to virtually connect to the upper shielding surface through the dielectric material without having a physical electrical connection directly between the L-C resonators 1016 and the upper shielding surface. The L-C resonators 1016 and the upper shielding surface may be operable for providing shielding for one or more components on the substrate 1040 within the space or perimeter defined by the BLS interior and exterior sidewalls 1008. For example, FIGS. 29 and 32 shows first and second microstrip lines 1060, 1064 along the PCB substrate 1040 within the perimeter defined by the BLS sidewalls 1008. As shown in FIG. 32, port 1 (P1) and port 2 (P2) are respectively defined or located at the ends of the first and second microstrip lines 1060, 1064. The other ends of microstrip lines 1060, 1064 may be terminated with matched load.

With continued reference to FIG. 31, the inductors 1044 may comprise linear inductive element having a rectangular cross section, etc. The capacitors 1048 may comprise capacitive patch elements, such as generally rectangular electrically-conductive patch elements, etc. The inductors 1044 and capacitors 1048 may be made of stainless steel, although other electrically-conductive materials may also be used (e.g., other metals, non-metals, etc.).

The inductors 1044 may be coupled to the upper surface 1010 of the BLS sidewalls 1008, such as by solder, electrically-conductive adhesives (e.g., a high-temperature adhesive, epoxy, electrically-conductive pressure sensitive adhesive (CPSA), electrically-conductive hot melt adhesive, etc.), etc. The capacitors 1048 may be coupled to the inductors 1044, such as by solder, electrically-conductive adhesives, etc. The capacitors 1048 are spaced apart and/or supported above openings 1011 in the upper surface 1010 of the BLS sidewalls 1008 by the inductors 1044. Each inductor 1044 extends between the upper surface 1010 of the BLS sidewalls 1008 and a corresponding one of the capacitors 1048. Alternatively, the orientation of the L-C resonators 1016 may be reversed or rotated 180 degrees such that the capacitor 1048 is coupled to the BLS and the inductor 1044 extends upwardly above the capacitor 1048 (e.g., FIG. 18, etc.).

In other exemplary embodiments, the inductors 1044 and capacitors 1048 may be integrally formed (e.g., stamped from stainless steel, etc.) as a single piece with a monolithic construction. Other or additional adhesives and/or methods could also be used to attach an L-C resonator to the BLS. In some other exemplary embodiments, an L-C resonator may be bonded to a BLS by fused metal where the metal is fused by thermal energy (e.g., in a reflow process, etc.), by laser energy, etc.

As shown in FIG. 31, the inductor 1044 is coupled to the capacitor 1048 such that the capacitor 1048 is generally perpendicular to the inductor 1044 and generally parallel with the upper surface 1010 of the BLS sidewall 1008. Alternatively, the L-C resonators 1016 may comprise inductors and/or capacitors that have a different configuration, such as having different shapes (e.g., non-circular cross-section, non-rectangular shape, a non-linear shape as shown in FIG. 10, etc.) and/or being made of different materials, etc.

The BLS frame 1006 includes mounting feet 1028 that may be configured to provide structure for connecting the BLS 1000 to a substrate 1040. For example, the mounting feet 1028 may provide areas for adhesively attaching or soldering the BLS 1000 to the substrate 1040. Alternative means besides solder and adhesive may also be used for attaching the BLS 1000 to a substrate.

In an exemplary embodiment, the mounting feet 1028 may be used for directly connecting the BLS 1000 to a PCB ground. For example, the mounting feet 1028 may be soldered to solder pads and/or vias (broadly, electrically-conductive portions) on the PCB such that the solder provides a direct electrical connection from the mounting 1028 to the solder pads and/or vias, which are directly connected to the PCB ground. In this example, the BLS 1000 would thus have a direct electrical connection to the PCB ground at the mounting feet 1028 and virtual connection to an upper shielding surface through the dielectric material 1076 without having a physical electrical connection directly between the L-C resonators 1016 and the upper shielding surface.

Figure 33:
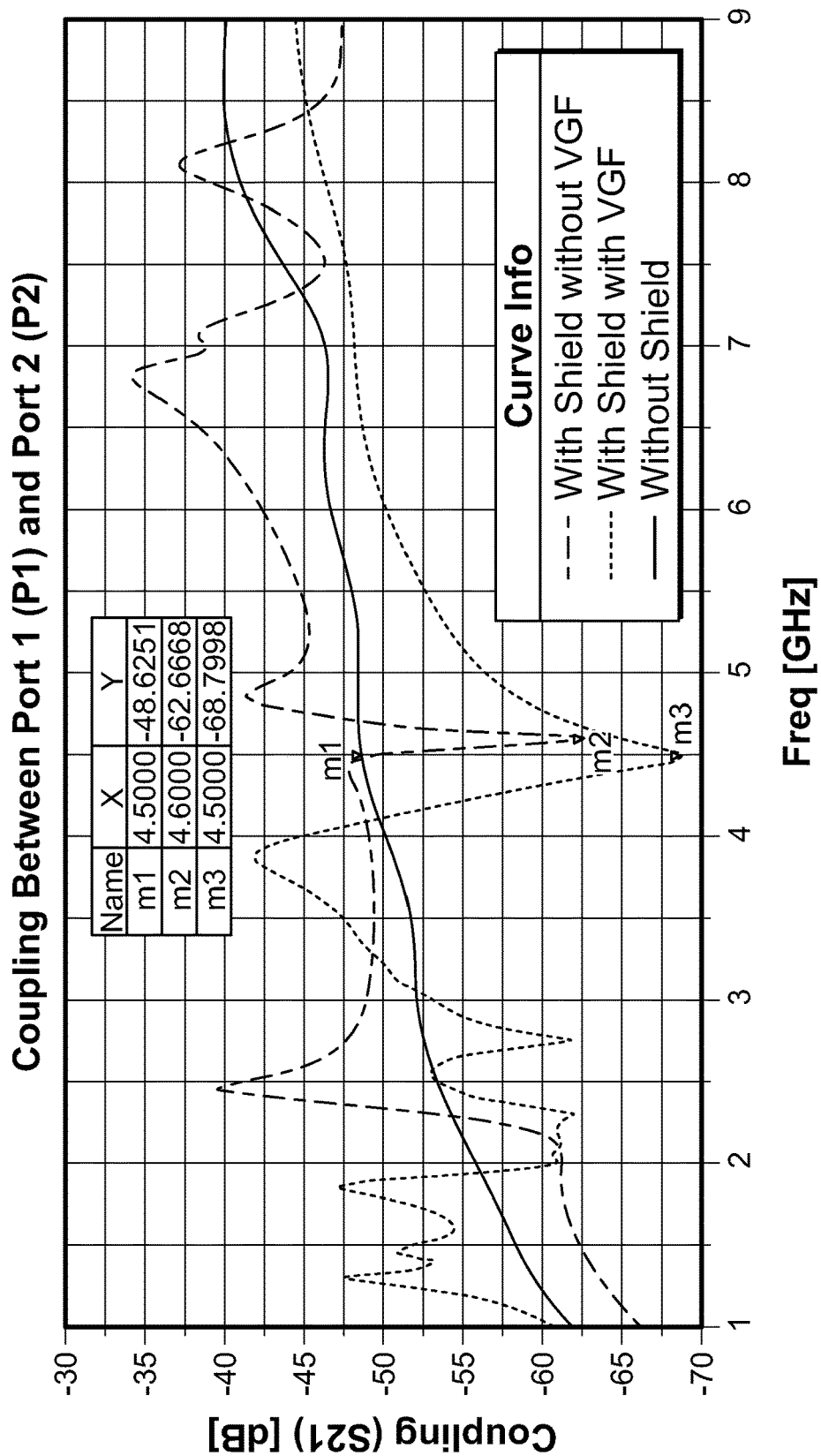
FIG. 33 is a line graph showing the coupling (dB) between ports P1 and P2 as shown in FIG. 32) versus frequency from 0 to 9 GHz.

FIG. 33 is a line graph showing the coupling (dB) between first and second ports P1 and P2 versus frequency from 0 to 9 GHz. The ports P1 and P2 are defined in FIG. 32, and the BLS dimensions are provided in FIG. 31 The resonance was estimated from FIG. 23. For comparison purposes, FIG. 33 also shows the coupling between ports P1 and P2 without a BLS and the coupling between ports P1 and P2 with a BLS that does not have a virtual ground fence (VGF). As shown in FIG. 33, the coupling between the ports P1 and P2 without any BLS present was −48.6251 dB at a frequency of 4.5 GHz. The coupling between the ports P1 and P2 with a BLS present without any virtual ground fence was −62.6668 dB at a frequency of 4.6 GHz. The coupling between the ports P1 and P2 with a BLS present that had a virtual ground fence was −68.7998 at a frequency of 4.5 GHz. Accordingly, FIG. 33 shows the improved isolation between the ports P1 and P2 that can be realized by using a BLS with a virtual ground fence as disclosed herein. The dimensions and test results shown in FIG. 33 are provided for purpose of example only as other exemplary embodiments may be configured differently, e.g., larger or smaller in size, have different performance, etc.

Figure 34:
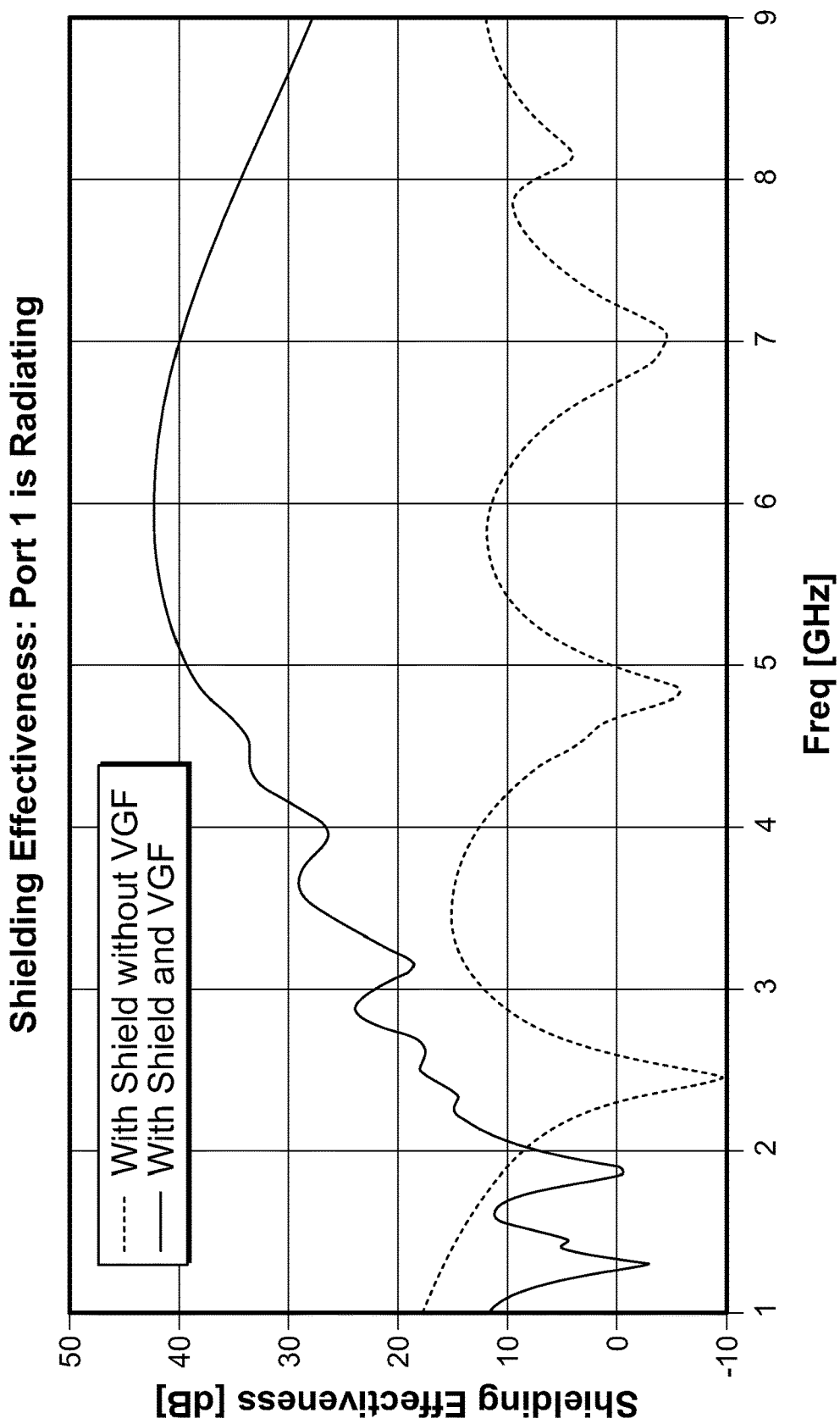
FIG. 34 is a line graph of shielding effectiveness (dB) versus frequency from 0 to 9 GHz for the BLS shown in FIG. 29 with the dimensions in FIG. 31 when port P1 (FIG. 32) is radiating.
Figure 35:
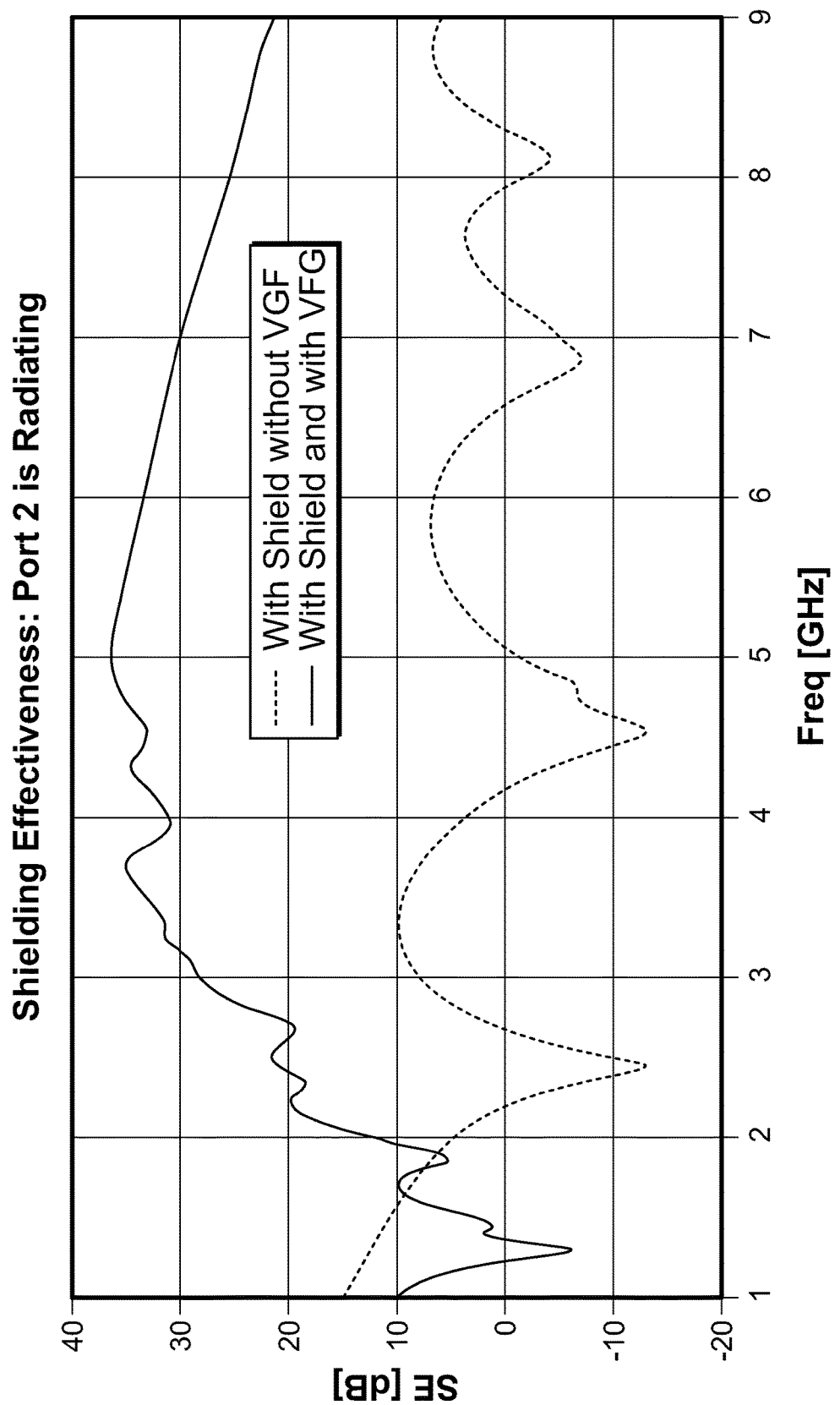
FIG. 35 is a line graph of shielding effectiveness (dB) versus frequency from 0 to 9 GHz for the BLS shown in FIG. 29 with the dimensions in FIG. 31 when port P2 (FIG. 32) is radiating.

FIGS. 34 and 35 are line graphs of shielding effectiveness (dB) versus frequency from 0 to 9 GHz for the BLS 1000 shown in FIG. 29 with the dimensions in FIG. 31 when port P1 (FIG. 32) is radiating and when port P2 (FIG. 32) is radiating, respectively. For comparison purposes, FIGS. 34 and 35 also shows shielding effectiveness versus frequency of a BLS without a virtual ground fence (VGF). FIGS. 34 and 35 show the considerable improvement in shielding effectiveness when the BLS included a virtual ground fence. The testing included a 0.2 mm thick BLS, an inductor height 0.09 mm, a lip thickness 0.1 mm, and an overmold thickness 0.2 mm, and an overmold dielectric constant of 4. These dimensions, dielectric constant, and test results shown in FIGS. 34 and 35 are provided for purpose of example only as other exemplary embodiments may be configured differently, e.g., sized larger or smaller, have different shielding effectiveness, etc.

FIGS. 36 and 37 illustrate another exemplary embodiment of a board level shield (BLS) 1100 according to aspects of the present disclosure. As shown in FIG. 36, four L-C resonators 1116 are spaced apart from each other along one of the four sides of the BLS 1100. Accordingly, the BLS 1100 includes a virtual ground fence or frame (VGF) defined by or including four L-C resonators 1116 along only one side of the BLS 1100. The BLS 1100 is grounded along the other three sides. Although FIG. 36 shows four L-C resonators 1116 along only a single side of the BLS 1100, other exemplary embodiments may include more or less than four L-C resonators 1116 along a side of the BLS 1100 and/or may include L-C resonators 1116 along more than one side of the BLS 1100. For example, another exemplary embodiment may include more or less than four L-C resonators 1116 along each side of the BLS 1100.

As shown in FIG. 37, each L-C resonator 1116 includes an inductor 1148 that is implemented by using wire bonding. In this exemplary embodiment, the inductor 1148 comprises electrically-conductive wire (e.g., aluminum bondwire, copper bondwire, silver bondwire, gold bondwire, etc.) having first and second opposite ends 1150, 1154. The first end 1150 of the wire inductor 1148 is attached or coupled to the capacitor 1144. The second end 1154 of the wire inductor 1148 is coupled to the top or cover 1104 of the BLS 1100. The first and second ends 1150 and 1154 may be respectively attached to the capacitor 1144 and BLS cover 1104 by using wire bonding, which may include a combination of downward pressure, ultrasonic energy, and/or heat to make a weld, etc.

Using the wire bonding to implement the inductors 1148 of the L-C resonators 1116 helps to achieve higher inductance and therefore shift the resonant frequency to lower ranges. For example, the wire inductors 1148 may be configured so as to extend non-linearly from the capacitors 1144 to the BLS cover 1104, such that the wire inductors 1148 are longer and have a higher inductance than a shorter linear inductor. In this example, the wire inductors 1148 includes a middle linear wire section 1166 extending between first and second linear wire sections 1162 and 1170, which respectively include the first and second ends 1150 and 1154. The middle linear wire section 1166 may be generally parallel to the BLS cover 1104. The first and second linear wire sections 1162, 1170 are connected to and extend (e.g., at an obtuse angle, etc.) from the middle linear wire section 1166. Alternatively, the L-C resonators 1116 may comprise inductors and/or capacitors that have a different configuration, such as having different shapes and/or being made of different materials, etc.

Also, the capacitors 1148 may be disposed along the substrate 1140 at locations outside the BLS perimeter or footprint defined by the BLS sidewalls 1108 such that the capacitors 1148 are not disposed directly under the sidewall portion 1112 of the BLS 1100. This allows the inductors 1148 to have an increased length and higher inductance. And, the second ends 1154 of the inductors 1148 may be attached to the BLS cover 1104 at a location inward from the BLS perimeter. This also allows the inductors 1148 to have an increased length and higher inductance.

The L-C resonators 1116 may be configured to virtually connect to a ground plane along an opposite side of the substrate 1140 without having a physical electrical connection directly between the L-C resonators 1116 and the ground plane. The BLS 1100 may be operable for providing shielding for one or more components on the substrate 1140 within the space or perimeter defined by the BLS 1100.

The BLS frame 1106 includes mounting feet 1128 that may be configured to provide structure for connecting the BLS 1100 to the substrate 1140. For example, the mounting feet 1128 may provide areas for adhesively attaching or soldering the BLS 1100 to the substrate 1140. Alternative means besides solder and adhesive may also be used for attaching the BLS 1100 to a substrate.

As shown in FIG. 37, the mounting feet 1128 may be used for directly connecting the BLS 1100 to a PCB ground. For example, the mounting feet 1128 may be soldered to solder pads 1158 and/or vias (broadly, electrically-conductive portions) on the PCB such that the solder provides a direct electrical connection from the mounting 1128 to the solder pads 1158 and/or vias, which are directly connected to the PCB ground. In this example, the BLS 1100 would thus have a direct electrical connection to the PCB ground at the mounting feet 1128 and virtual connection to the ground plane or a shielding surface without having a physical electrical connection directly between the L-C resonators 1116 and the ground plane or the shielding surface.

FIG. 38 is a line graph of shielding effectiveness (dB) versus frequency from 0 to 10 GHz for the BLS 1100 including the VGF implemented with wire bonds as shown in FIGS. 36 and 37 and for a BLS including a VGF implemented with stamping. Generally, FIG. 38 shows that using the wire bonding to implement the inductors 1148 of the L-C resonators 1116 helps to achieve higher inductance and therefore shift the resonant frequency to lower ranges (e.g., from 6.2 GHz to 3 GHz, etc.).

By way of background, a conventional SiP module may be made by first picking and placing components on a substrate (e.g., PCB, etc.). A metal frame wall is picked up and placed on the substrate between the components. The metal frame wall undergoes solder reflow to attach the metal frame wall to the substrate. The solder also electrically connects the metal frame wall to electrically-conductive portion(s) of the substrate. The components and metal frame wall are encapsulated within and/or overmolded with plastic. A portion of the plastic is removed via laser ablation in order to expose an upper edge of the metal frame wall. Metal is applied on top of the plastic via sputter coating to thereby provide an upper shielding surface or shield top that directly contacts the exposed upper edge of the metal frame.

In an exemplary embodiment (e.g., FIGS. 7, 13, 15, 18D, 22, 27, and 29, etc.), one or more resonators are used instead or in addition to the metal frame wall in a SiP module or package. The one or more resonators may be coupled (e.g., soldered, etc.) to a substrate generally between two or more components on a first side of the substrate. The one or more resonators may comprise a plurality of resonators that are spaced apart from each other and that are disposed generally around the components. Dielectric material (e.g., plastic, etc.) may encapsulate and/or be overmolded onto the components on the substrate and the one or more resonators. An upper shielding surface or shield top may be provided (e.g., coated onto, adhesively attached to, etc.) on top of the overmolded dielectric material. For example, the upper shielding surface may comprise a metallized film, a planar sheet or layer of electrically-conductive material, a metal plated film, a thin metal layer, an electrically-conductive coating (e.g., metal coating provided by plating, sputtering, evaporation, etc.), a sheet of stainless steel, etc.

The one or more resonators are virtually connected to the upper shielding surface through the dielectric material without having a physical electrical connection directly between the resonators and the upper shielding surface. The one or more resonators may also virtually connect to a ground plane along a second side of the substrate opposite the first side. This virtual connection to the ground plane may be made without having a physical electrical connection directly between the one or more resonators and the ground plane. The resonators and the upper shielding surface are operable for providing shielding for the one or more components.

In exemplary embodiments, the use of virtual ground fences in system in package (SiP) modules may provide one or more (but not necessarily any or all) of the following features or advantages over the shielding currently used in SIP modules. For example, the use of a virtual ground fence allows for a relatively simpler process for providing shielding inside a system in package (SiP) module and/or at a reduced cost. By using the VGF concept to make a virtual connection with the shield top, the step of laser ablation for removing the overmolded dielectric material to expose the metal shielding would not be necessary, thereby providing a simpler process. A PVD (physical vapor deposition) or other coating process may be eliminated for example, when a metallized film, metal plated film, or other electrically-conductive layer is used as the upper shielding surface or shield top instead of a metal coating.

In an exemplary embodiment, a board level shield includes one or more L-C resonators configured to be operable for virtually connecting the board level shield to a ground plane or a shielding surface. The one or more L-C resonators may comprise at least one L-C resonator along each side of the board level shield. For example, the one or more L-C resonators may comprise a plurality of L-C resonators (e.g., three or four L-C resonators equally spaced apart from each other, etc.) along each side or along less than all sides (e.g., a single side, etc.) of the board level shield. The one or more L-C resonators may comprise a plurality of L-C resonators disposed generally around an outer perimeter of the BLS. The one or more L-C resonators may be configured to resonate at a predetermined resonant frequency. Each L-C resonator may include an inductor and a capacitor. The inductor or capacitor may be coupled to the board level shield. The capacitor may be coupled to the inductor. The inductor may be an inductive pin or other inductive linear or non-linear element. The capacitor may be a capacitive patch or pad.

The board level shield may include an upper surface and one or more sidewalls depending from the upper surface. Each of the one or more L-C resonators may be coupled to or define at least a portion of a corresponding one of the one or more sidewalls. Or, for example, each of the one or more L-C resonators may be coupled to or define at least a portion of a top surface (e.g., upper perimeter rim or flange, etc.) of a BLS fence or frame.

The board level shield may include an upper surface and one or more upper sidewall portions depending from the upper surface. Each of the one or more L-C resonators may be coupled to a corresponding one of the one or more upper sidewall portions. The one or more L-C resonators may include a plurality of L-C resonators each including an inductive pin and a capacitive patch. The inductive pin may be coupled to the corresponding one of the one or more upper sidewall portions. The capacitive patch may be coupled to the inductive pin such that the capacitive patch is generally perpendicular to the inductive pin and the corresponding one of the one or more upper sidewall portions. The upper surface of the board level shield may be integral with or removably attachable to the upper sidewall portions.

An electronic device may include a ground plane and the board level shield. The one or more L-C resonators may virtually connect the board level shield to the ground plane without a physical electrical connection directly between the board level shield and the ground plane.

An electronic device may include a printed circuit board including a first side having one or more components and a second side having a ground plane. The board level shield may be positioned relative to the printed circuit board such that the one or more components along the first side of the printed circuit board are within an interior defined by the board level shield and such that the one or more L-C resonators virtually connect the board level shield to the ground plane along the second side of the printed circuit board.

In an exemplary embodiment, a board level shield comprises one or more resonators along each side or less than all sides (e.g., a single side, etc.) of the board level shield. The one or more resonators are configured such that the board level shield is virtually connectible to a ground plane or a shielding surface without a physical electrical connection directly between the board level shield and the ground plane or the shielding surface. The one or more resonators may include a plurality of L-C resonators (e.g., three, four, five, etc.) equally spaced apart along one or more sides of the board level shield. The one or more resonators may be configured to resonate at a predetermined resonant frequency. Each resonator may include an inductor and a capacitor. The inductor may be coupled to the board level shield. The capacitor may be coupled to the inductor. The inductor may be an inductive pin. The capacitor may be a capacitive patch.

The board level shield may include an upper surface and one or more sidewalls depending from the upper surface. Each of the one or more resonators may be coupled to or define at least a portion of a corresponding one of the one or more sidewalls.

The board level shield may include an upper surface and one or more upper sidewall portions depending from the upper surface. Each of the one or more resonators is coupled to a corresponding one of the one or more upper sidewall portions.

The one or more resonators may include a plurality of L-C resonators each including an inductive pin and a capacitive patch. The inductive pin may be coupled to a corresponding one of the one or more upper sidewall portions. The capacitive patch may be coupled to the inductive pin such that the capacitive patch is generally perpendicular to the inductive pin and the corresponding one of the one or more upper sidewall portions. The upper surface may be integral with or removably attachable to the upper sidewall portions.

An electronic device may include a ground plane and the board level shield. The one or more resonators may virtually connect the board level shield to the ground plane without a physical electrical connection directly between the board level shield and the ground plane.

An electronic device may include a printed circuit board including a first side having one or more components and a second side having a ground plane. The board level shield may be positioned relative to the printed circuit board such that the one or more components along the first side of the printed circuit board are within an interior defined by the board level shield and such that the one or more resonators virtually connect the board level shield to the ground plane along the second side of the printed circuit board.

The board level shield with virtual grounding may be used in a system in package (SiP) module. The board level shield may include an upper shielding surface. The one or more resonators may be configured to be operable for virtually connecting to the upper shielding surface. Dielectric material (e.g., plastic, etc.) may encapsulate and/or be overmolded onto the one or more resonators.

The one or more resonators may be virtually connected to the upper shielding surface through the dielectric material without having a physical electrical connection directly between the one or more resonators and the upper shielding surface. Accordingly, the one or more resonators may be virtually connected with the upper shielding surface through the overmolded dielectric material without having to remove (e.g., via laser ablation, etc.) any portion of the overmolded dielectric material to expose electrically-conductive portion(s) of the one or more resonators.

The system in package (SiP) module may include a printed circuit board including a first side having one or more components and a second side having a ground plane. The dielectric material may also encapsulate and/or be overmolded onto the one or more components along the first side of the printed circuit board. The one or more resonators may include a plurality of L-C resonators each including a capacitor coupled to or along the first side of the printed circuit board and an inductor coupled to the capacitor. The upper shielding surface may be disposed above the one or more components. The L-C resonators may be virtually connected to the ground plane along the second side of the printed circuit board without having a physical electrical connection directly between the L-C resonators and the ground plane. The L-C resonators may also be virtually connected to the upper shielding surface through the dielectric material without having a physical electrical connection directly between the L-C resonators and the upper shielding surface. The L-C resonators and the upper shielding surface may be operable for providing shielding for the one or more components.

In an exemplary embodiment, a system in package (SiP) shielded module generally includes a printed circuit board including a first side having one or more components. An upper shielding surface is above the one or more components. A plurality of resonators are spaced apart from each other. Dielectric material may encapsulate and/or be overmolded onto the one or more components along the first side of the printed circuit board and the plurality of resonators. The resonators are virtually connected to the upper shielding surface through the dielectric material without having a physical electrical connection directly between the resonators and the upper shielding surface.

The printed circuit board may include a second side having a ground plane and that is opposite the first side having the one or more components. The resonators may be virtually connected to the ground plane along the second side of the printed circuit board without having a physical electrical connection directly between the resonators and the ground plane. The resonators and the upper shielding surface may be operable for providing shielding for the one or more components.

Other exemplary embodiments include methods of making board level EMI shielding apparatus or assemblies and methods relating to providing shielding for one or more components on a substrate. Further exemplary embodiments include methods relating to making system in package (SiP) shielded modules and methods relating to providing shielding for one or more components of a system in package (SiP) module.

In an exemplary embodiment, a method generally includes providing a board level shield with one or more resonators that are configured to be operable for virtually connecting the board level shield to a ground plane without a physical electrical connection directly between the board level shield and the ground plane. In another exemplary embodiment, a method generally includes virtually connecting a board level shield to a ground plane by using one or more resonators and without using a physical electrical connection directly between the board level shield and the ground plane.

The one or more resonators may include a plurality of resonators spaced apart along each side or along less than all sides (e.g., along a single side, etc.) of the board level shield. Each resonator may include an inductor and a capacitor. The inductor may be coupled to the board level shield. The capacitor may be coupled to the inductor. The inductor may be an inductive pin. The capacitor may be a capacitive patch. The one or more resonators may include a plurality (e.g., three, four, etc.) of L-C resonators equally spaced apart along each side of the board level shield.

The method may include coupling each of the one or more resonators to a corresponding upper sidewall portion of the board level shield. The one or more resonators may include a plurality of L-C resonators each including an inductive pin and a capacitive patch. The inductive pin may be coupled to a corresponding upper sidewall portion of the board level shield. The capacitive patch may be coupled to the inductive pin such that the capacitive patch is generally perpendicular to the inductive pin and the corresponding upper sidewall portion.

The method may include positioning the board level shield relative to a printed circuit board such that the one or more resonators virtually connect the board level shield to a ground plane along a second side of the printed circuit board, whereby the board level shield is operable for providing shielding for the one or more components within the interior defined by the board level shield.

Another exemplary embodiment includes a method relating to providing shielding for one or more components on a first side of a substrate. In this exemplary embodiment, the method generally includes positioning a board level shield relative to the first side of the substrate such that the board level shield is virtually connected to a ground plane on and/or along a second side of the substrate opposite the first side without a physical electrical connection directly between the board level shield and the ground plane, whereby the board level shield is operable for providing shielding the one or more components.

A further exemplary embodiment includes a method that generally includes virtually connecting a upper shielding surface with one or more resonators. The upper shielding surface is disposed above one or more components along a first side of a printed circuit board of a system in package (SiP) shielded module. Dielectric material encapsulates and/or is overmolded onto the one or more components along the first side of the printed circuit board and the one or more resonators. The one or more resonators are virtually connected to the upper shielding surface through the dielectric material without a physical electrical connection directly between the one or more resonators and the upper shielding surface.

The one or more resonators may comprise at least one L-C resonator including a capacitor and an inductor coupled to the capacitor The method may include overmolding dielectric material onto the one or more components along the first side of the printed circuit board of the system in package (SiP) shielded module and the one or more resonators. The method may further include virtually connecting the upper shielding surface with the one or more resonators through the dielectric material without removing (e.g., via laser ablation, etc.) any portion of the overmolded dielectric material to expose electrically-conductive portion(s) of the one or more resonators.

In exemplary embodiments, the BLS may include upper sidewall portions that are integrally formed with the upper surface, cover, lid, or top of the BLS. For example, the upper sidewall portions and upper surface may be formed by stamping the same electrically-conductive piece of material and then folding the stamped material such that the upper sidewall portions are generally perpendicular to the upper surface. Alternatively, the upper sidewall portions may be made separately and not integrally with the upper surface of the BLS. In some exemplary embodiments, the BLS may comprise a two-piece shield in which the upper surface, cover, lid, or top is removable from and reattachable to the sidewalls. In some exemplary embodiments, the BLS may include one or more interior walls, dividers, or partitions that are attached to and/or integrally formed with the BLS. In such exemplary embodiments, the BLS cover, sidewalls, and interior walls may cooperatively define a plurality of individual EMI shielding compartments (e.g., BLS 600 shown in FIGS. 13-15, etc.).

The board level shielding components (e.g., 100, 200, 304, 316, 400, 500, 600, 706, 800, 900, 1000, 1100, etc.) disclosed herein may be formed from a wide range of materials. For example, the BLS and/or the L-C resonators may be formed from metals or metal alloys, such as cold rolled steel (e.g., tin-plated cold rolled steel, etc.), sheet metal, stainless steel, copper alloys (e.g., tin-plated copper alloys, etc.), nickel-silver alloys (e.g., nickel-silver alloy 770, etc.), copper-nickel alloys, carbon steel, brass, copper, aluminum, copper-beryllium alloys, phosphor bronze, steel, alloys thereof, among other suitable electrically-conductive materials. Or, the BLS and/or the L-C resonators may also be formed from a plastic material coated with electrically-conductive material. The materials provided herein are for purposes of illustration only, as the BLS and L-C resonators may be made from different materials depending, for example, on the particular application, such as the electrical components to be shielded, space considerations within the overall electronic device, EMI shielding and heat dissipation needs, and other factors.

In some exemplary embodiments, at least a portion of the BLS may be thermally conductive to help establish or define at least a portion of a thermally-conductive heat path from a heat source (e.g., board-mounted heat generating electronic component of an electronic device, etc.) to a heat dissipating and/or heat removal structure, such as a heat sink, an exterior case or housing of an electronic device (e.g., cellular phone, smart phone, tablet, laptop, personal computer, etc.), heat spreader, heat pipe, etc. For example, the sidewalls and cover of the BLS may be electrically conductive and thermally conductive. In this example, one or more thermal interface materials (TIM) (e.g., compliant or conformable thermal interface pad, putty, or gap filler, etc.) may be disposed along (e.g., adhesively attached via a PSA tape, etc.) an outer surface and/or inner surface of the BLS cover or lid. A thermal interface material along an outer surface of the cover may be configured to make contact (e.g., direct physical contact, etc.) with a heat dissipating device or heat removal structure. By way of further example, the thermal interface material may comprise a conformable and/or flowable thermal interface material having sufficient compressibility, flexibility, deformability, and/or flowability to allow the thermal interface material to relatively closely conform to the size and outer shape of the heat dissipating device or heat removal structure, thereby removing air gaps therebetween. The thermal interface may also be a form-in-place material that may be dispensed in place onto the shielding apparatus. By way of further example, a TIM may be molded from thermally and electrically conductive elastomer. The TIM may comprise thermally conductive compliant materials or thermally conductive interface materials formed from ceramic particles, metal particles, ferrite EMI/RFI absorbing particles, metal or fiberglass meshes in a base of rubber, gel, grease or wax, etc.

In some exemplary embodiments, one or more EMI or microwave absorbers may be disposed along an outer surface and/or inner surface of the BLS. In embodiments that include one or more EMI or microwave absorbers, a wide range of materials may be used, such as carbonyl iron, iron silicide, iron particles, iron-chrome compounds, metallic silver, carbonyl iron powder, SENDUST (an alloy containing 85% iron, 9.5% silicon and 5.5% aluminum), permalloy (an alloy containing about 20% iron and 80% nickel), ferrites, magnetic alloys, magnetic powders, magnetic flakes, magnetic particles, nickel-based alloys and powders, chrome alloys, and any combinations thereof. The EMI absorbers may comprise one or more of granules, spheroids, microspheres, ellipsoids, irregular spheroids, strands, flakes, powder, and/or a combination of any or all of these shapes.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. In addition, advantages and improvements that may be achieved with one or more exemplary embodiments of the present disclosure are provided for purpose of illustration only and do not limit the scope of the present disclosure, as exemplary embodiments disclosed herein may provide all or none of the above mentioned advantages and improvements and still fall within the scope of the present disclosure.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

The term "about" when applied to values indicates that the calculation or the measurement allows some slight imprecision in the value (with some approach to exactness in the value; approximately or reasonably close to the value; nearly). If, for some reason, the imprecision provided by "about" is not otherwise understood in the art with this ordinary meaning, then "about" as used herein indicates at least variations that may arise from ordinary methods of measuring or using such parameters. For example, the terms "generally", "about", and "substantially" may be used herein to mean within manufacturing tolerances.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section could be termed a second element, component, region, layer or section without departing from the teachings of the example embodiments.

Spatially relative terms, such as "inner," "outer," "beneath", "below", "lower", "above", "upper" and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements, intended or stated uses, or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. A board level shield (BLS) comprising a plurality of resonators spaced apart from each other and disposed generally around an outer perimeter of the BLS and configured to be operable for virtually connecting the board level shield to a ground plane or a shielding surface.

2. The board level shield of claim 1, wherein the resonators comprise at least one inductor-capacitor (L-C) resonator including an inductor and a capacitor, and wherein:
   the inductor is coupled to a portion of the board level shield, and the capacitor is coupled to the inductor; or
   the capacitor is coupled to a portion of the board level shield, and the inductor is coupled to the capacitor.

3. The board level shield of claim 2, wherein:
   the capacitor is a capacitive patch; and
   the inductor is an inductive pin.

4. The board level shield of claim 2, wherein the inductor has a non-linear shape to thereby increase a length and an inductance of the inductor without having to increase an overall height of the board level shield.

5. The board level shield of claim 1, wherein the resonators are along sides of the board level shield such that the board level shield is virtually connectible to the ground plane without a physical electrical connection directly between the board level shield and the ground plane.

6. The board level shield of claim 1, wherein the resonators comprise a plurality of inductor-capacitor (L-C) resonators along one or more sides of the board level shield, and the plurality of L-C resonators along a corresponding side of the board level shield are equally spaced apart from each other along the corresponding side of the board level shield.

7. The board level shield of claim 1, wherein the resonators comprise a plurality of L-C resonators spaced apart from each other and disposed generally around the outer perimeter of the BLS.

8. The board level shield of claim 1, wherein the resonators are configured to resonate at a predetermined resonant frequency.

9. The board level shield of claim 1, wherein:
   the board level shield includes an upper shielding surface; and
   the resonators are coupled to the upper shielding surface.

10. The board level shield of claim 1, wherein:
    the board level shield includes an upper shielding surface and one or more upper sidewall portions depending from the upper surface;
    the resonators are coupled to the upper sidewall portions; and
    the upper shielding surface is integral with or removably attachable to the upper sidewall portions.

11. The board level shield of claim 1, wherein:
    the resonators comprise at least one L-C resonator including an inductor and a capacitor; and
    the inductor comprises an electrically-conductive wire having a first end coupled to the capacitor and a second end coupled to a portion of the board level shield.

12. The board level shield of claim 1, wherein:
    the resonators comprise at least one L-C resonator including an inductor and a capacitor; and
    the inductor comprises a bondwire having a first end wire bonded to the capacitor and a second end wire bonded to a portion of the board level shield.

13. The board level shield of claim 12, wherein:
    the bondwire has a non-linear shape and is configured to extend non-linearly from the capacitor to the portion of the board level shield; and/or
    the capacitor is disposed outside a perimeter of the board level shield; and/or
    the second end of the bondwire is wire bonded to the portion of the board level shield at a location inward from the perimeter of the board level shield;

whereby a length and an inductance of the inductor is increased.

14. An electronic device including the ground plane and the board level shield of claim 1, wherein the resonators virtually connect the board level shield to the ground plane without a physical electrical connection directly between the board level shield and the ground plane.

15. An electronic device comprising:
a printed circuit board including a first side having one or more components and a second side having the ground plane; and
the board level shield of claim 1 positioned relative to the printed circuit board such that the one or more components along the first side of the printed circuit board are within an interior defined by the board level shield and such that the resonators virtually connect the board level shield to the ground plane along the second side of the printed circuit board.

16. The electronic device of claim 15, wherein:
the printed circuit board includes electrically-conductive portions along the first side that are electrically connected to the ground plane; and
the board level shield further comprises corner sections including a mounting feet soldered to the electrically-conductive portions of the printed circuit board such that solder provides a direct electrical connection from the mounting feet to the electrically-conductive portions of the printed circuit board;
whereby the board level shield has a direct electrical connection to the ground plane at the corner sections and a virtual grounding via the resonators.

17. A system in package (SiP) module comprising the board level shield of claim 1, wherein:
the board level shield comprises an upper shielding surface; and
the resonators are configured to be operable for virtually connecting to the upper shielding surface.

18. The system in package (SiP) module of claim 17, further comprising:
a dielectric material encapsulating and/or overmolded onto the resonators; and
the resonators are virtually connected to the upper shielding surface through the dielectric material without having a physical electrical connection directly between the resonators and the upper shielding surface.

19. The system in package (SiP) module of claim 17, further comprising:
a printed circuit board including a first side having one or more components and a second side having a ground plane; and
a dielectric material encapsulating and/or overmolded onto the one or more components along the first side of the printed circuit board and the resonators; wherein:
the resonators comprise a plurality of L-C resonators each including a capacitor and an inductor coupled to the capacitor;
the upper shielding surface comprises an electrically-conductive layer or coating on the dielectric material above the one or more components;
the L-C resonators are virtually connected to the ground plane along the second side of the printed circuit board without having a physical electrical connection directly between the L-C resonators and the ground plane;
the L-C resonators are virtually connected to the upper shielding surface through the dielectric material without having a physical electrical connection directly between the L-C resonators and the upper shielding surface; and
the L-C resonators and the upper shielding surface are operable for providing shielding for the one or more components.

20. The system in package (SiP) module of claim 18, further comprising:
a printed circuit board including a first side having one or more components; and
an upper shielding surface above the one or more components.

21. The system in package (SiP) shielded module of claim 20, wherein:
the printed circuit board includes a second side having a ground plane and that is opposite the first side having the one or more components;
the resonators are virtually connected to the ground plane along the second side of the printed circuit board without having a physical electrical connection directly between the resonators and the ground plane;
the upper shielding surface comprises an electrically-conductive layer or coating on the dielectric material above the one or more components; and
the resonators and the upper shielding surface are operable for providing shielding for the one or more components.

22. A method comprising:
virtually connecting the board level shield of claim 1 to a ground plane by using the resonators and without using a physical electrical connection directly between the board level shield and the ground plane.

23. The method of claim 22, wherein:
the resonators comprises at least one L-C resonator including a capacitor and an inductor coupled to the capacitor; and/or the method comprises:
overmolding dielectric material onto the one or more components along the first side of the printed circuit board of the system in package (SiP) shielded module and the resonators; and
virtually connecting the shielding surface with the resonators through the overmolded dielectric material without removing the overmolded dielectric material to expose an electrically-conductive portion of the resonators.

24. The method of claim 22, wherein:
the resonators comprises at least one L-C resonator including a capacitor and an inductor;
the inductor comprises a bondwire having a first end and a second end; and the method comprises:
wire bonding the first end of the bondwire to the capacitor; and
wire bonding the second end of the bondwire to a portion of the board level shield.

* * * * *